(12) United States Patent
Sasaki et al.

(10) Patent No.: US 7,119,987 B2
(45) Date of Patent: Oct. 10, 2006

(54) THIN-FILM MAGNETIC HEAD, A HEAD GIMBAL ASSEMBLY, AND A HARD DISK DRIVE

(75) Inventors: Yoshitaka Sasaki, Milpitas, CA (US); Takehiro Kamigama, Kwai Chung (HK)

(73) Assignees: Headway Technologies Inc., Milpitas, CA (US); SAE Magnetics (H.K.) Ltd., Kwai Chung (HK)

( * ) Notice: Subject to any disclaimer, the term of this patent is extended or adjusted under 35 U.S.C. 154(b) by 70 days.

(21) Appl. No.: 10/671,440

(22) Filed: Sep. 29, 2003

(65) Prior Publication Data

US 2004/0212922 A1    Oct. 28, 2004

(51) Int. Cl.
*G11B 5/17* (2006.01)
(52) U.S. Cl. .................................... 360/123
(58) Field of Classification Search .............. 360/123, 360/125, 126, 119, 110, 244, 245.3, 240
See application file for complete search history.

(56) References Cited

U.S. PATENT DOCUMENTS

| | | | | |
|---|---|---|---|---|
| 5,173,826 | A | * 12/1992 | Bischoff | 360/126 |
| 5,995,342 | A | 11/1999 | Cohen et al. | 360/126 |
| 6,043,959 | A | 3/2000 | Crue et al. | 360/317 |
| 6,191,916 | B1 | 2/2001 | Sasaki | 360/126 |
| 6,459,543 | B1 | 10/2002 | Sasaki | 360/126 |
| 6,861,937 | B1 * | 3/2005 | Feng et al. | 336/200 |
| 6,980,396 | B1 * | 12/2005 | Kasajima et al. | 360/123 |
| 2003/0189788 | A1 | 10/2003 | Kamijima | 360/126 |
| 2004/0075943 | A1 * | 4/2004 | Jiang et al. | 360/123 |

FOREIGN PATENT DOCUMENTS

| | | | |
|---|---|---|---|
| JP | 55-4734 A | * | 1/1980 |
| JP | 55-12523 A | * | 1/1980 |
| JP | 1-282715 A | * | 11/1989 |
| JP | 5-250636 A | * | 9/1993 |
| JP | A 2000-311311 | | 11/2000 |
| JP | A 2003-282324 | | 10/2003 |
| JP | A-2003-297632 | | 10/2003 |

* cited by examiner

*Primary Examiner*—Julie Anne Watko
(74) *Attorney, Agent, or Firm*—Oliff & Berridge, PLC.

(57) ABSTRACT

A thin-film magnetic head comprises first and second magnetic pole groups, magnetically connected to each other, having respective magnetic pole parts opposing each other on a side of a medium-opposing surface; a recording gap layer formed between the magnetic pole parts; and a thin-film coil insulated from the first and second magnetic pole groups and helically wound about at least one of them; which are laminated on a substrate. The thin-film coil comprises a first conductor group having a plurality of inner conductor parts disposed between the first and second magnetic pole groups, a second conductor group having a plurality of outer conductor parts disposed outside the second magnetic pole group, and a connecting part group having a plurality of connecting parts for connecting the inner conductor parts to the outer conductor parts. Each of the first and second conductor groups includes an insulating contact structure for making the inner or outer conductor parts in contact with each other by way of an insulating film.

6 Claims, 38 Drawing Sheets

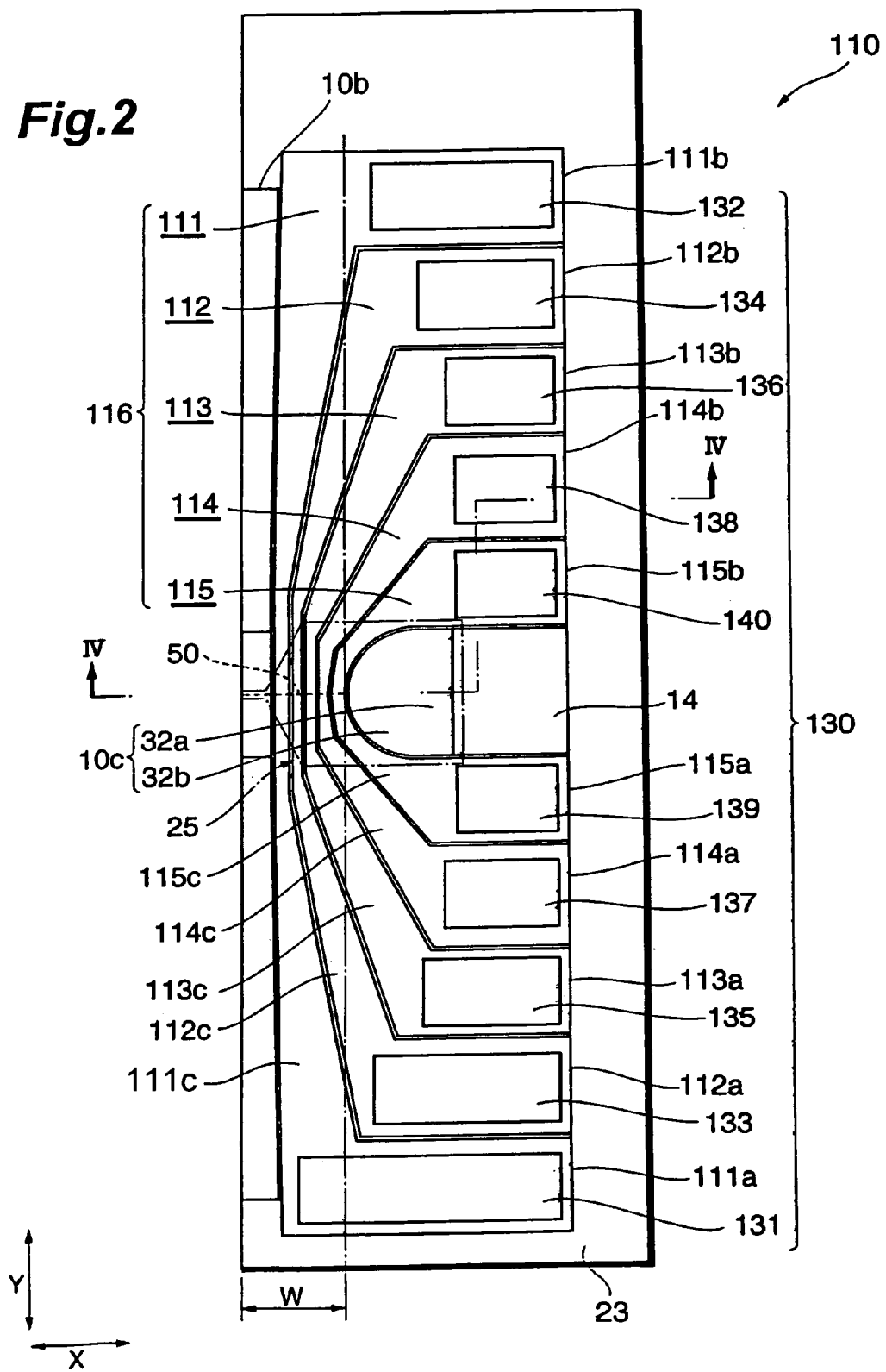

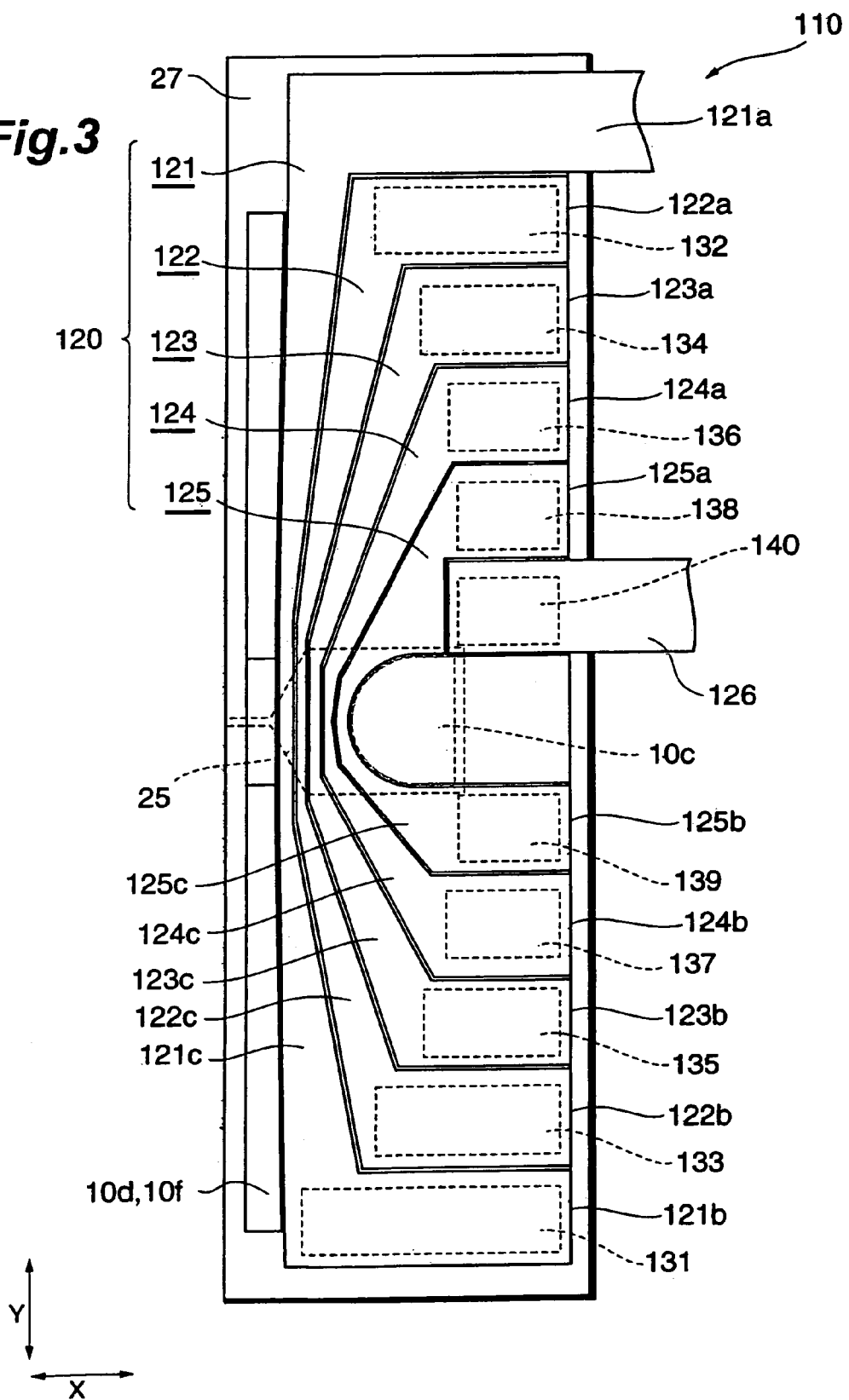

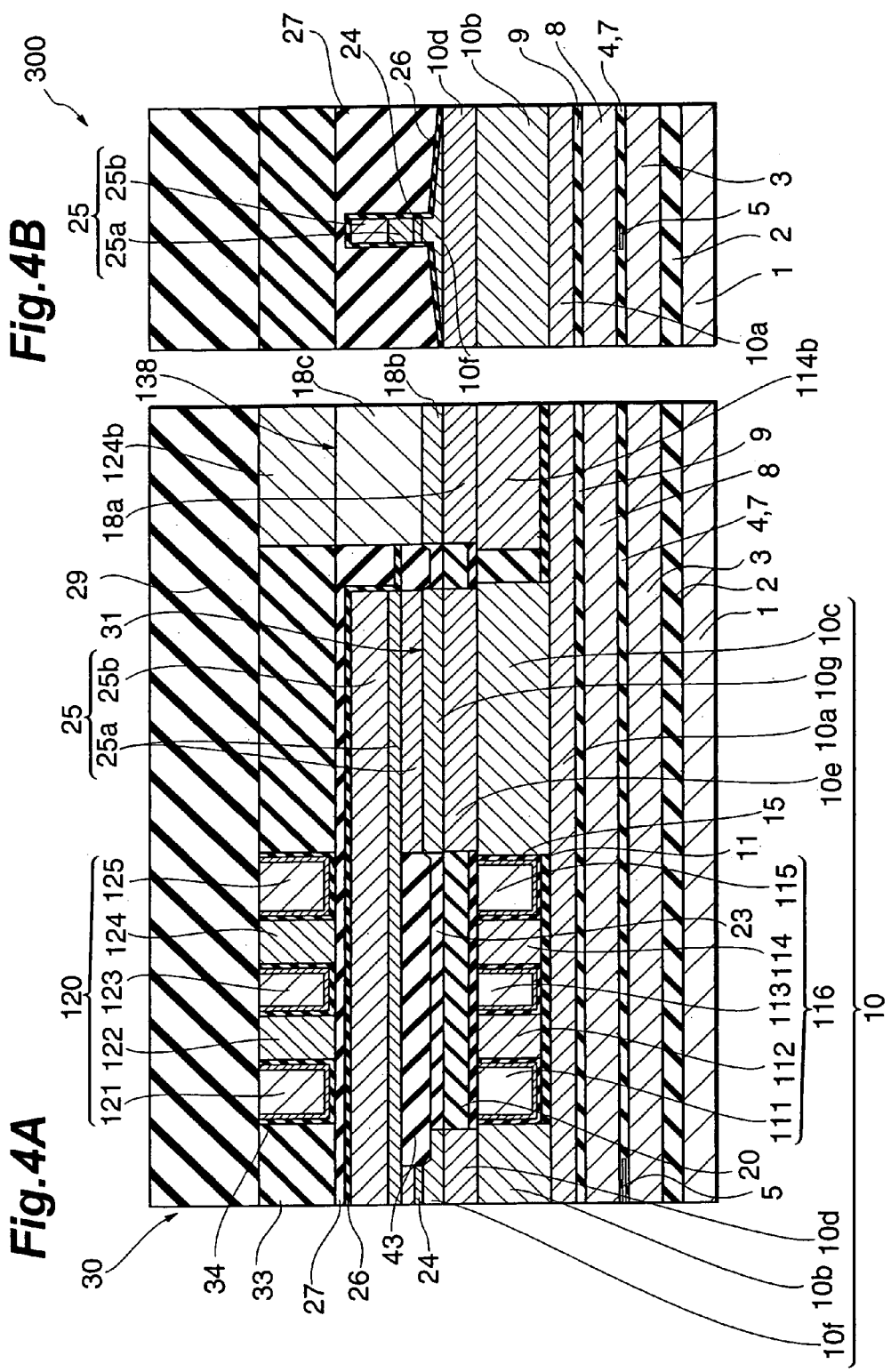

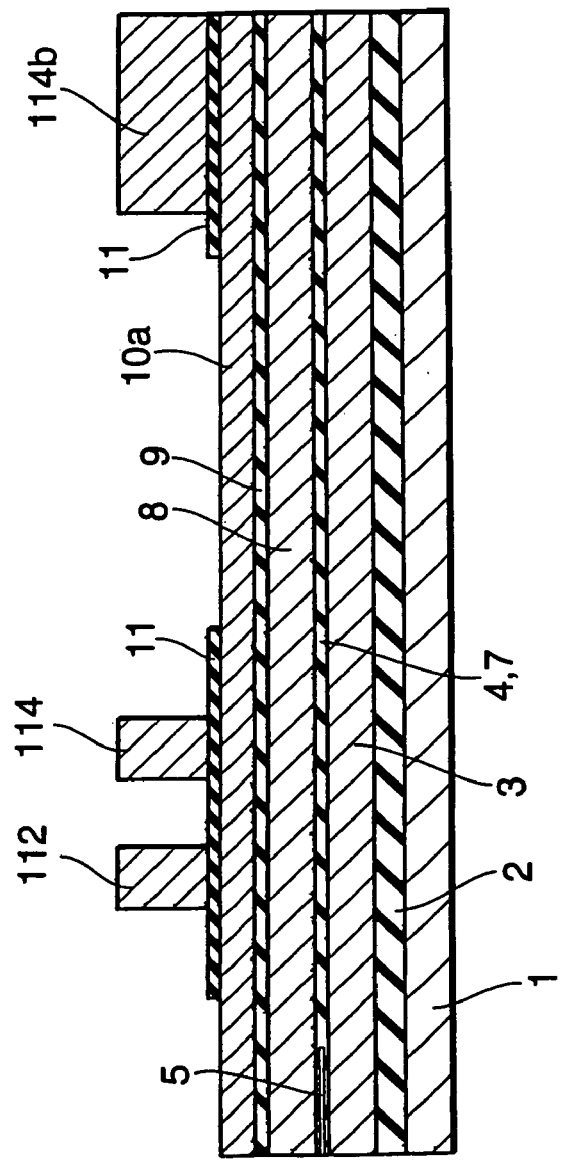

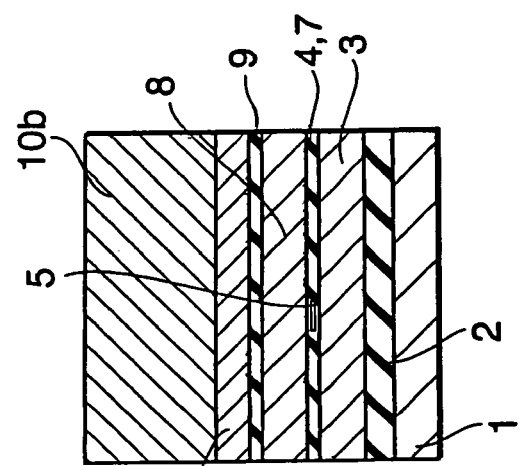
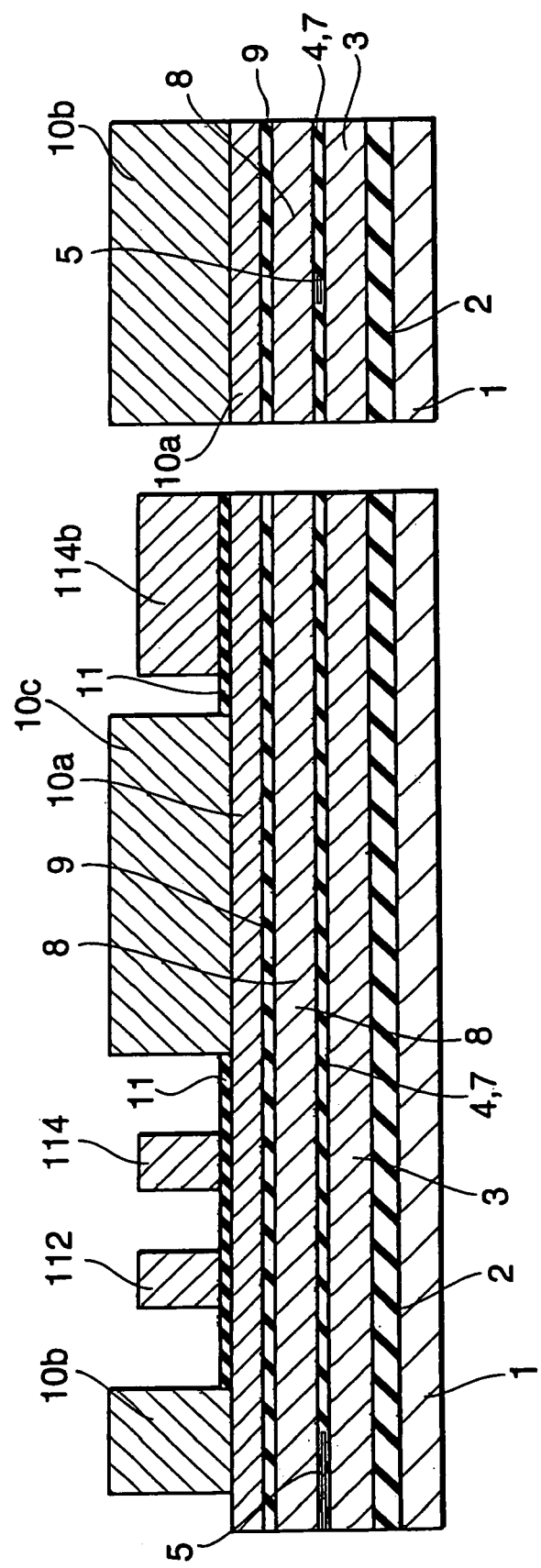

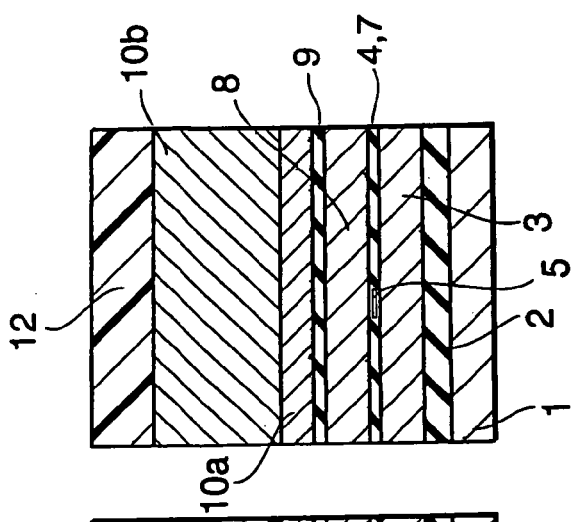
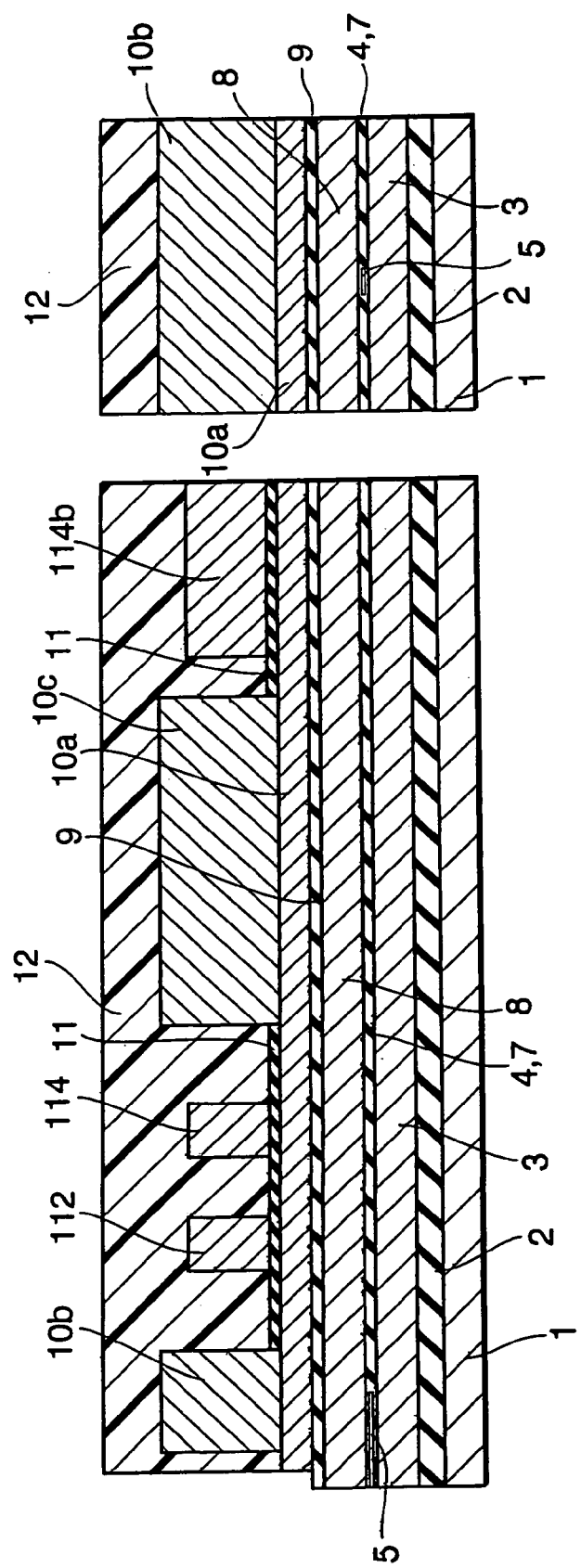

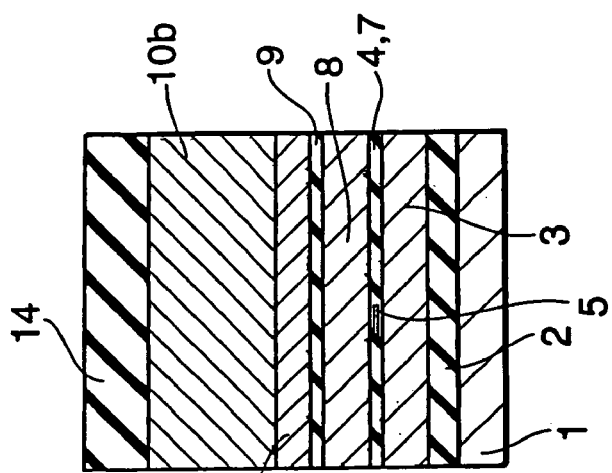
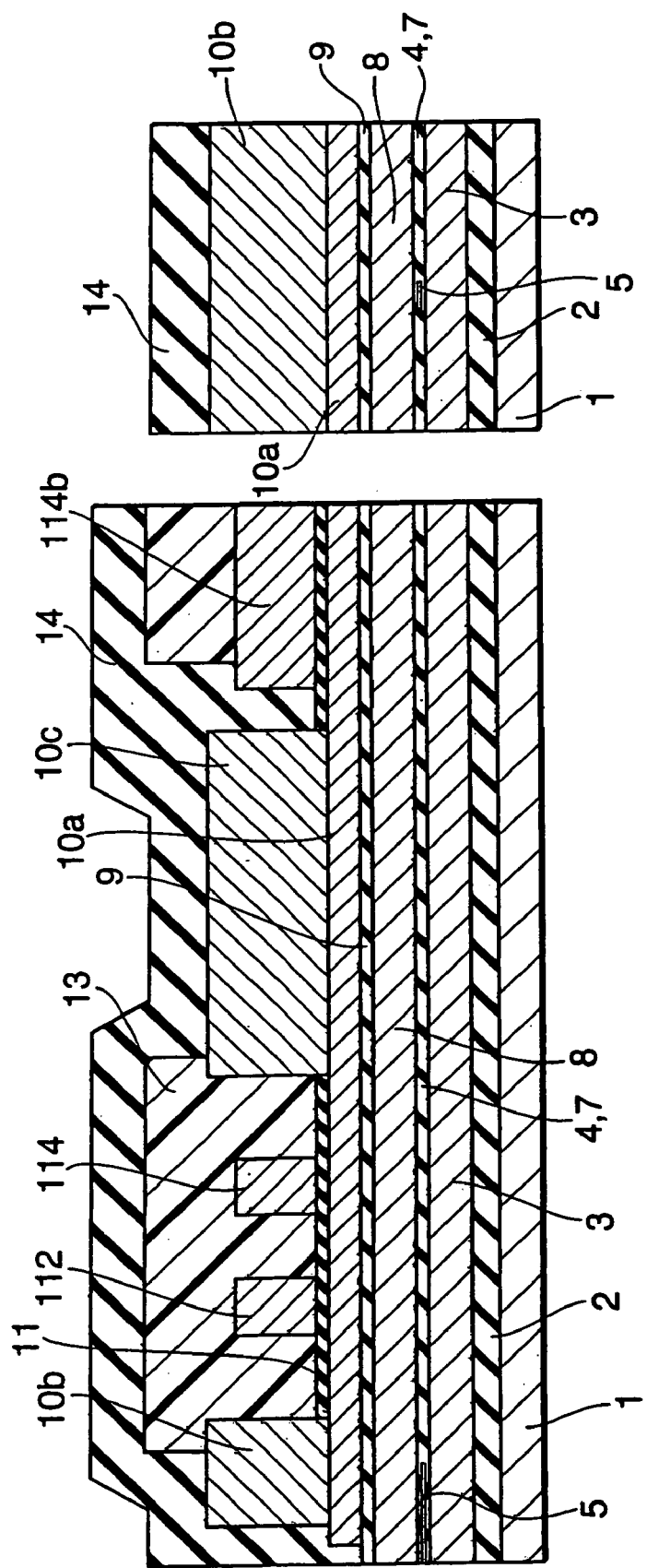

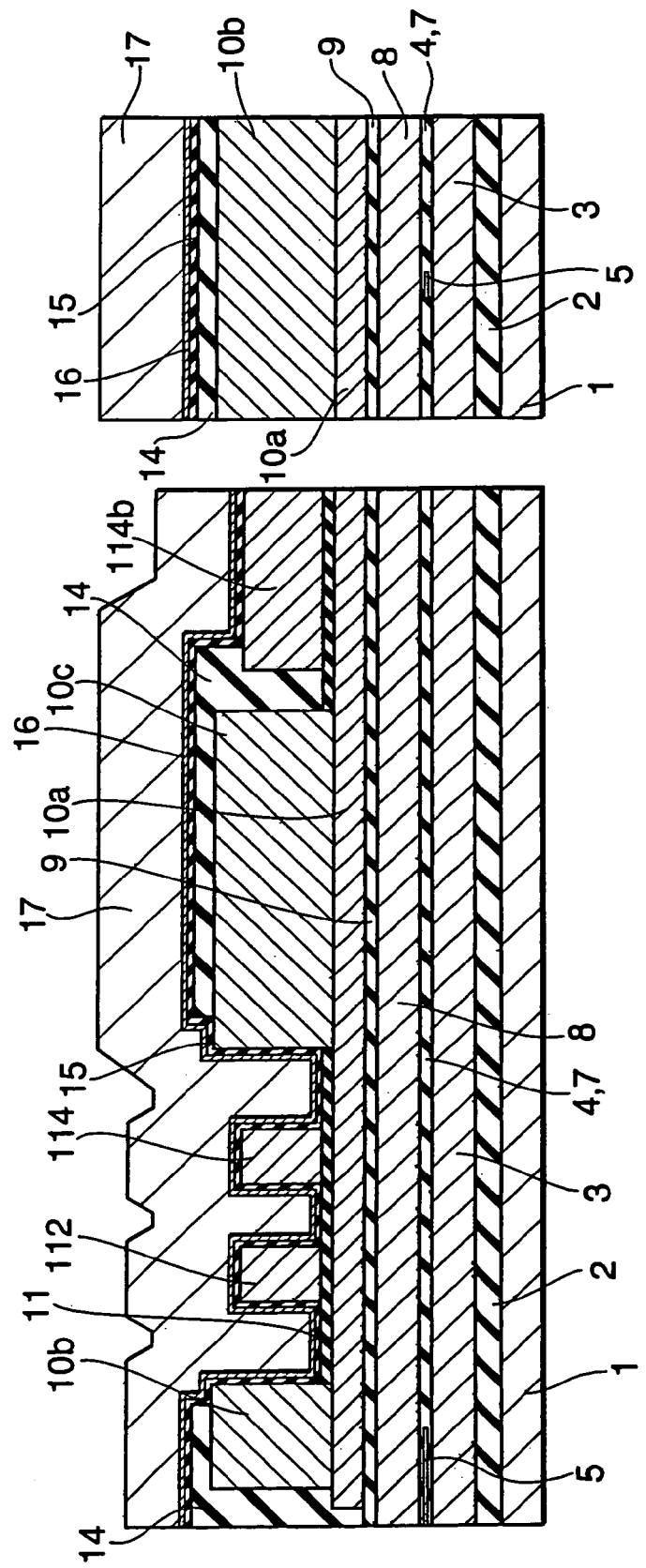

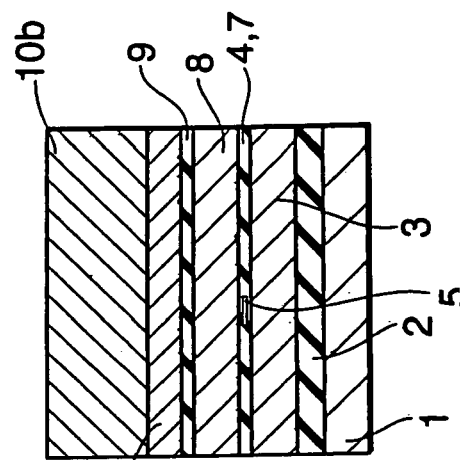
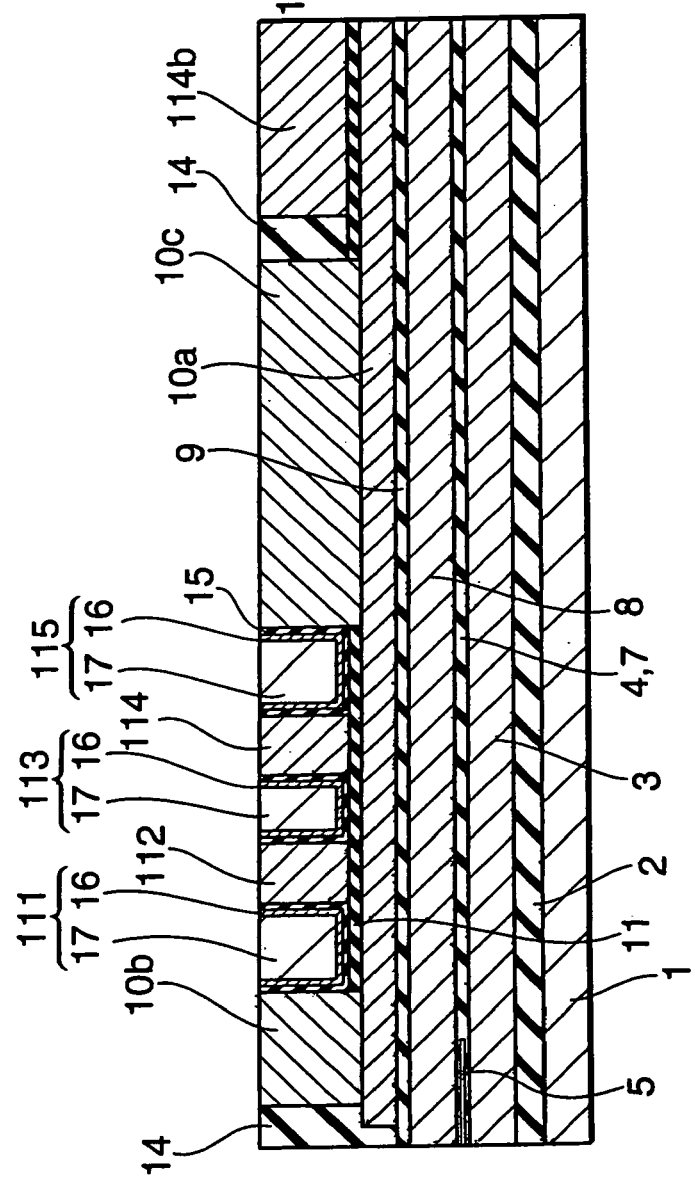

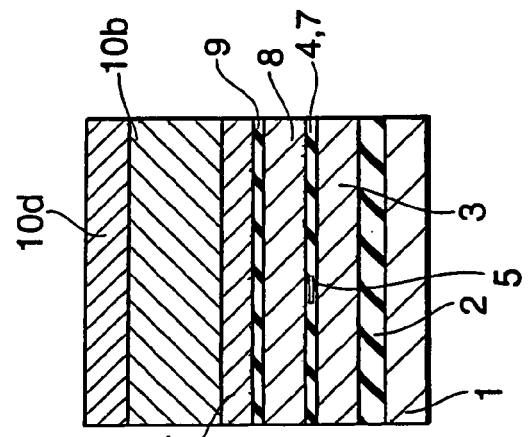
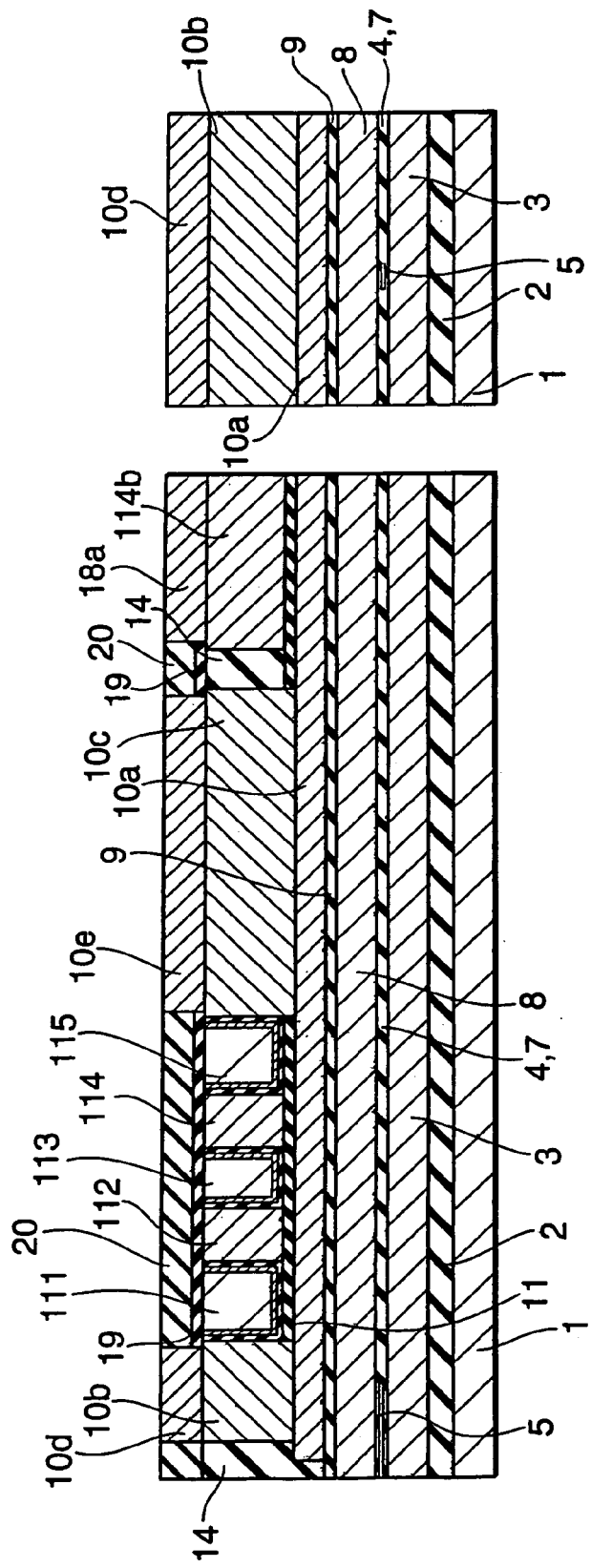

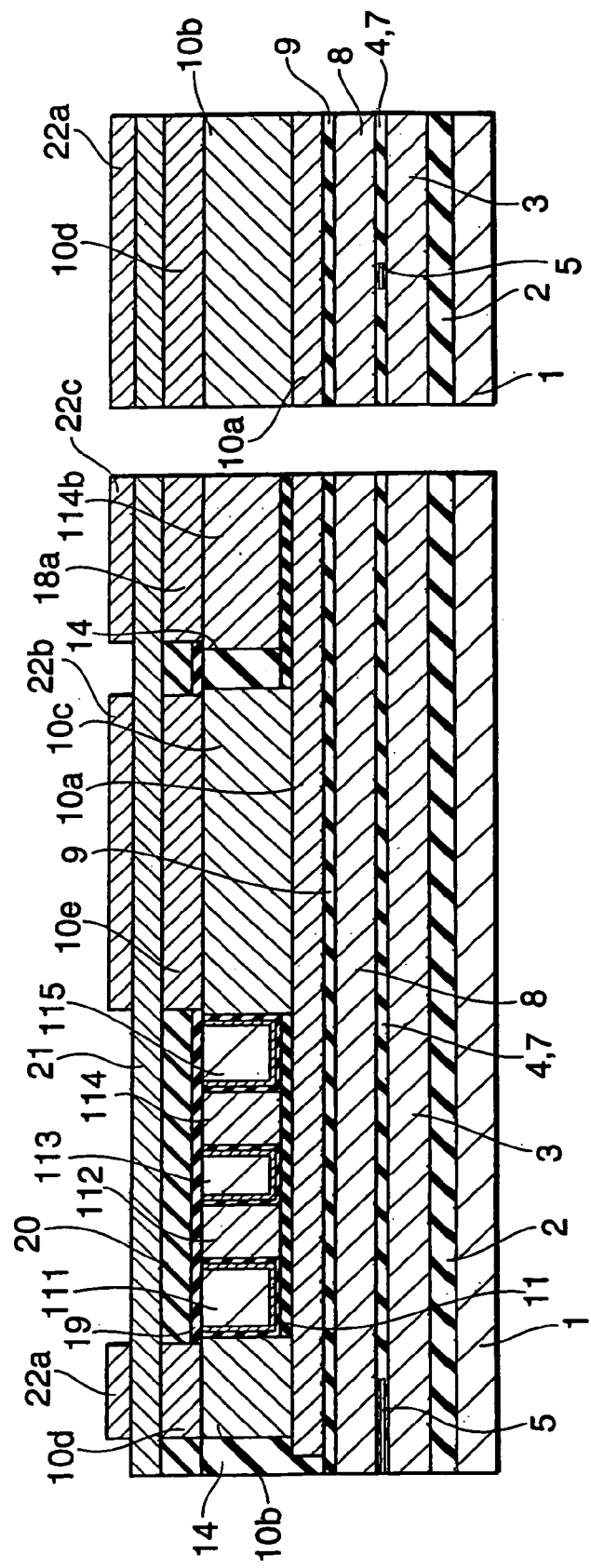

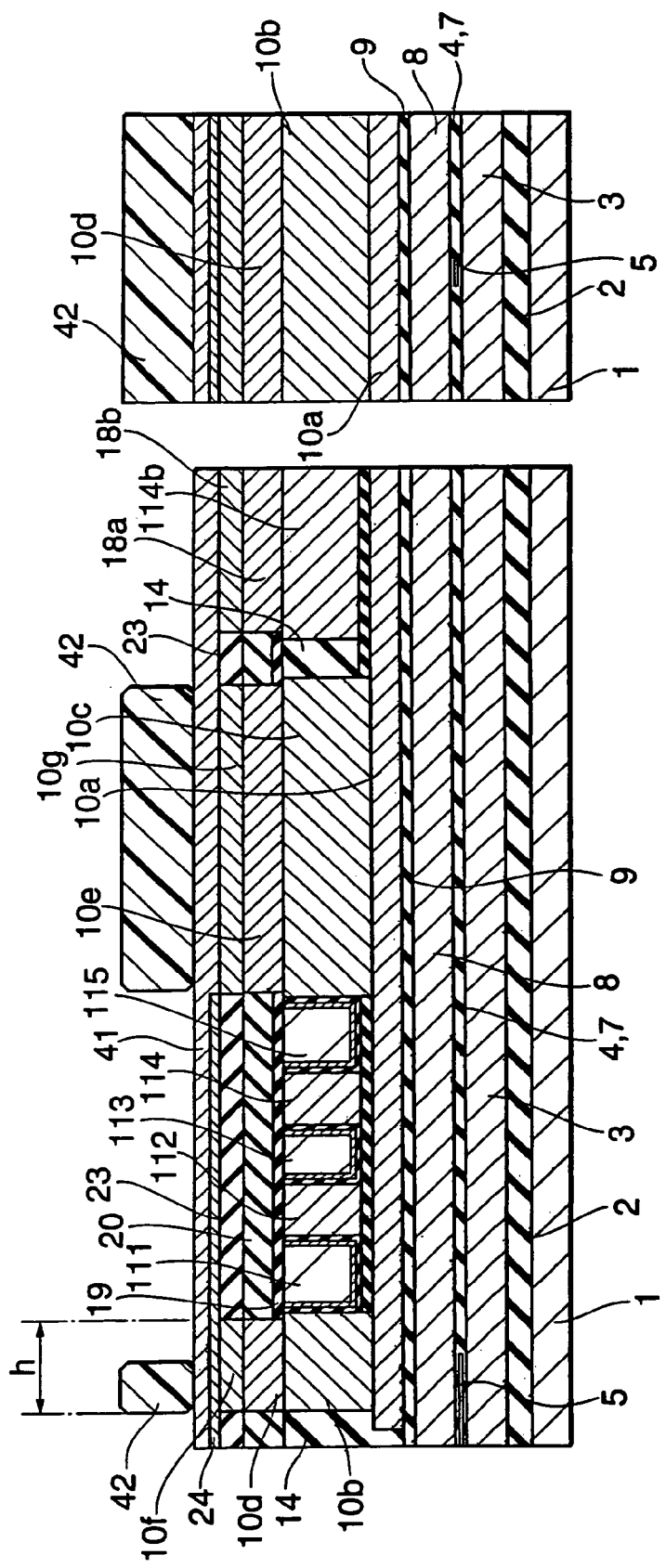

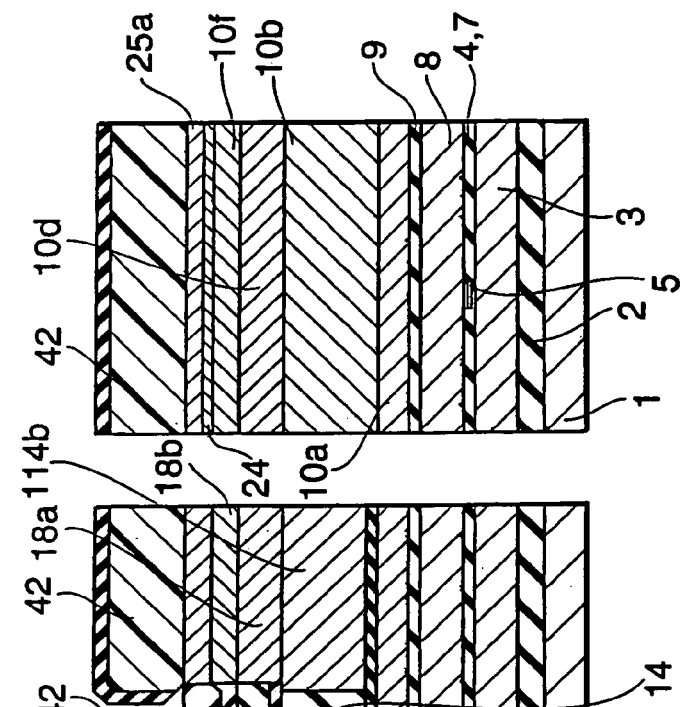
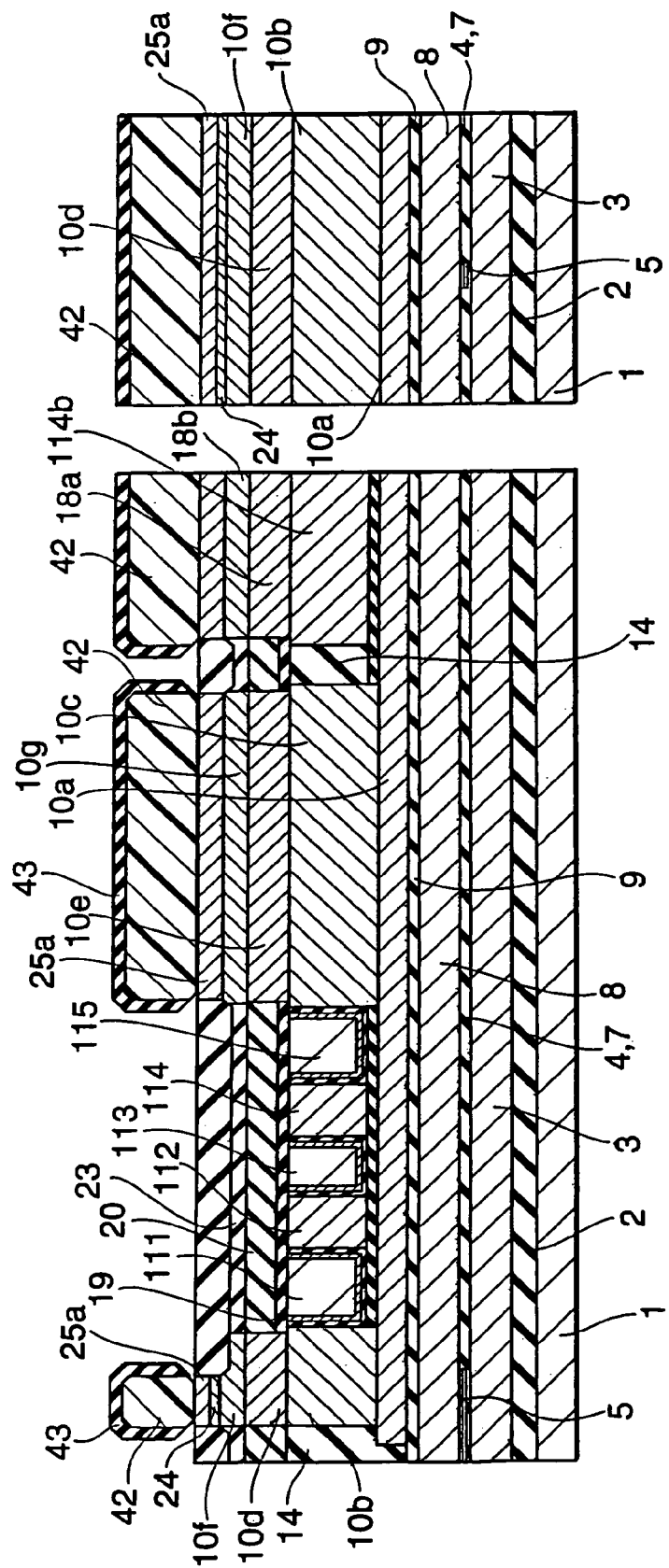

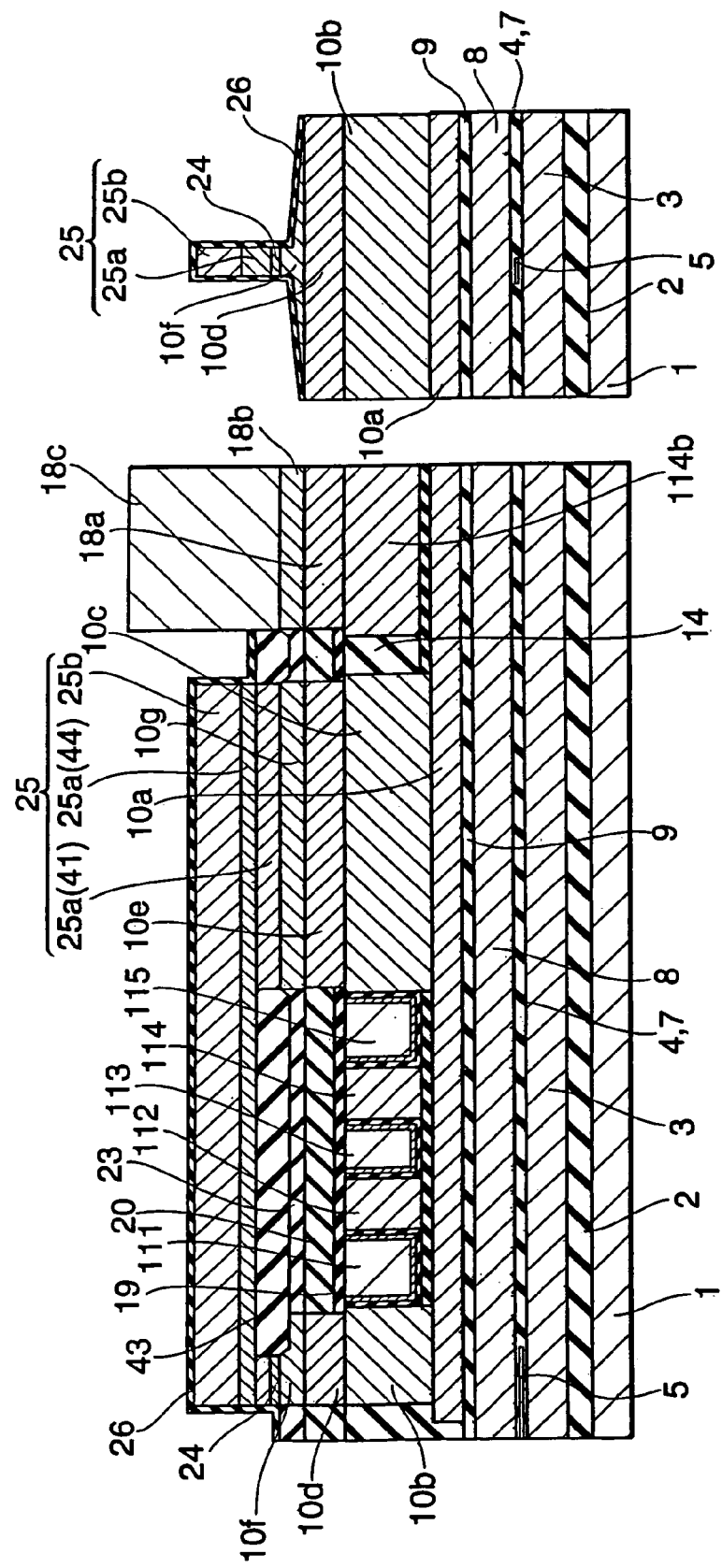

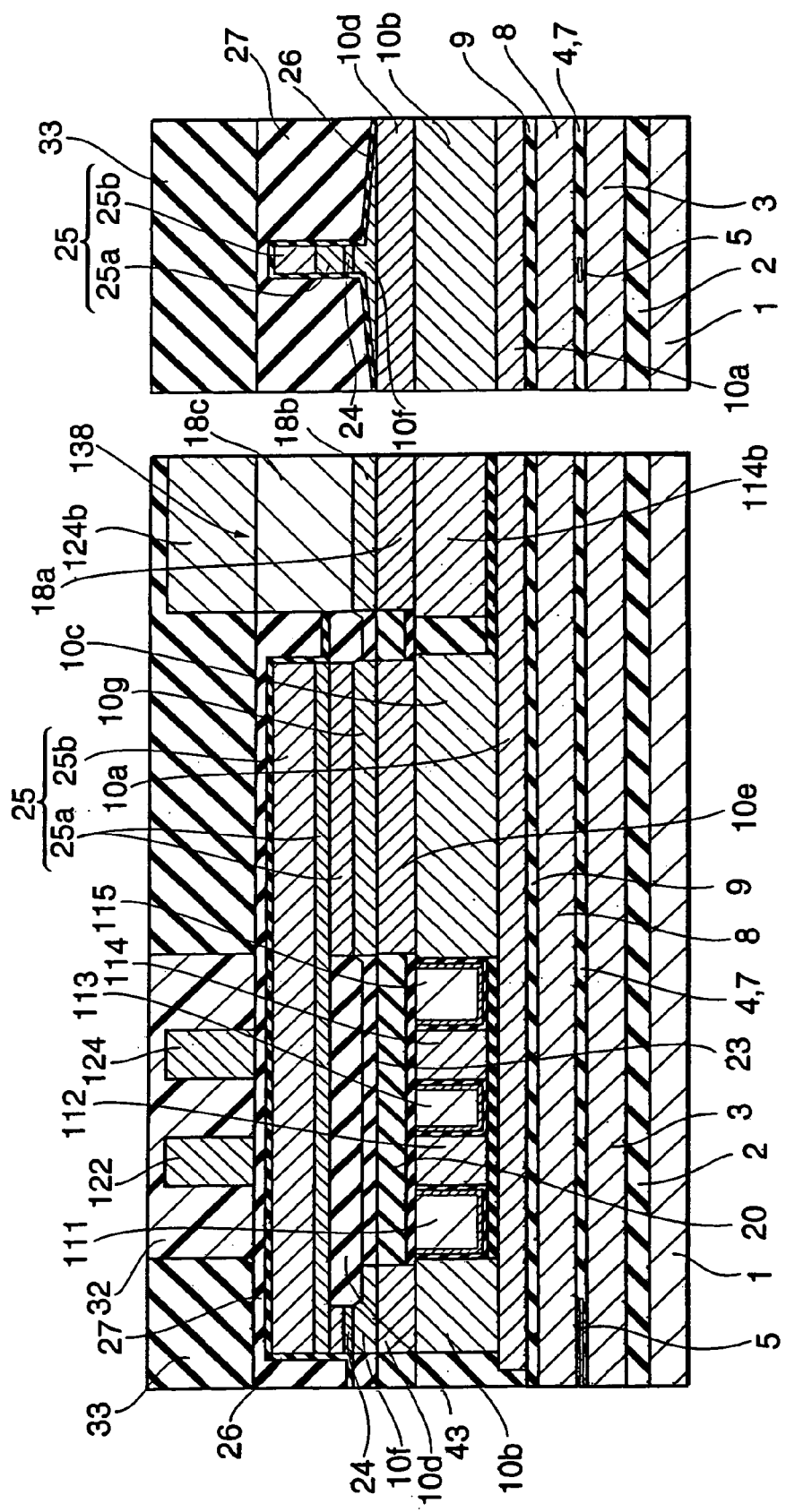

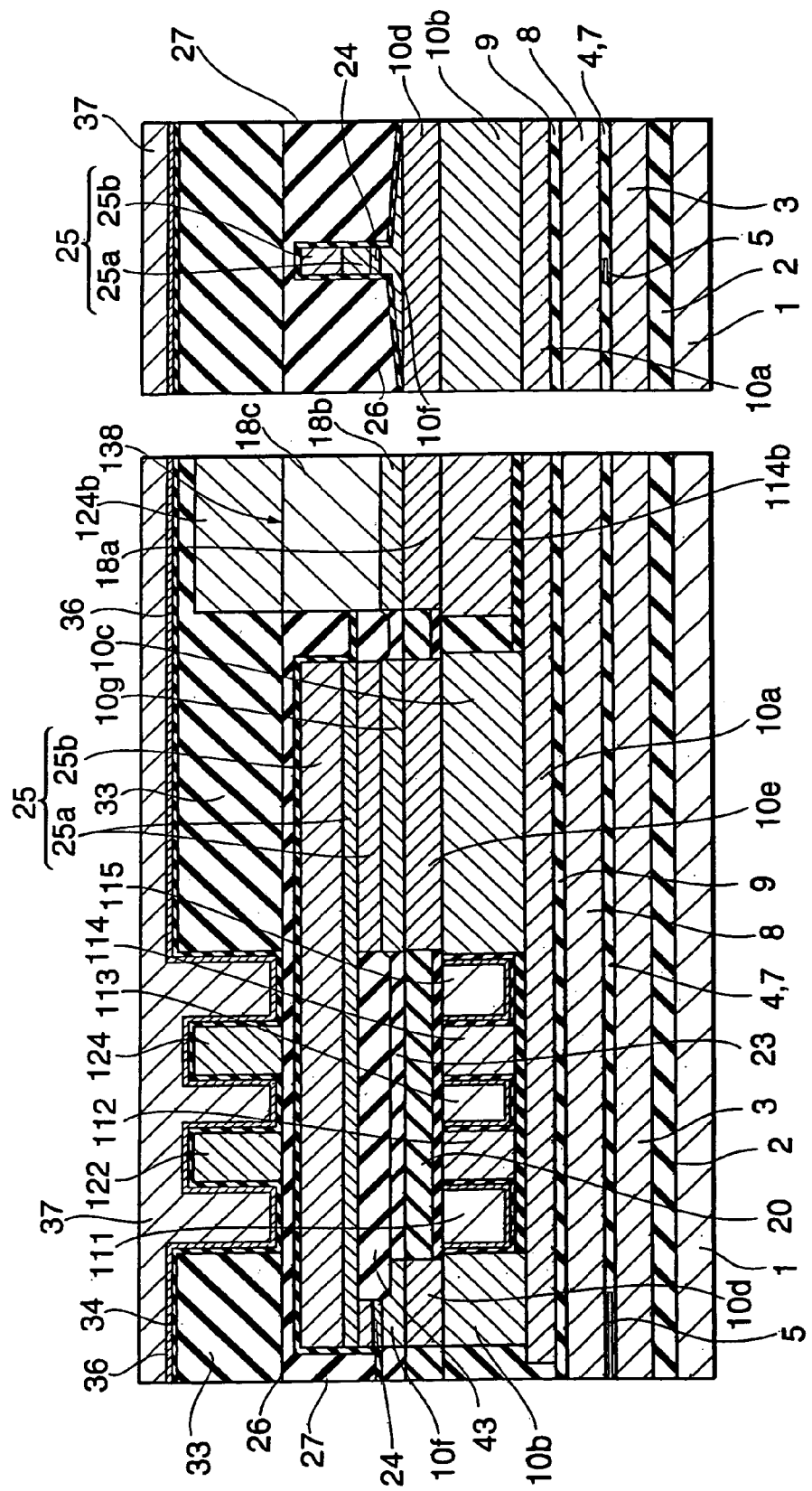

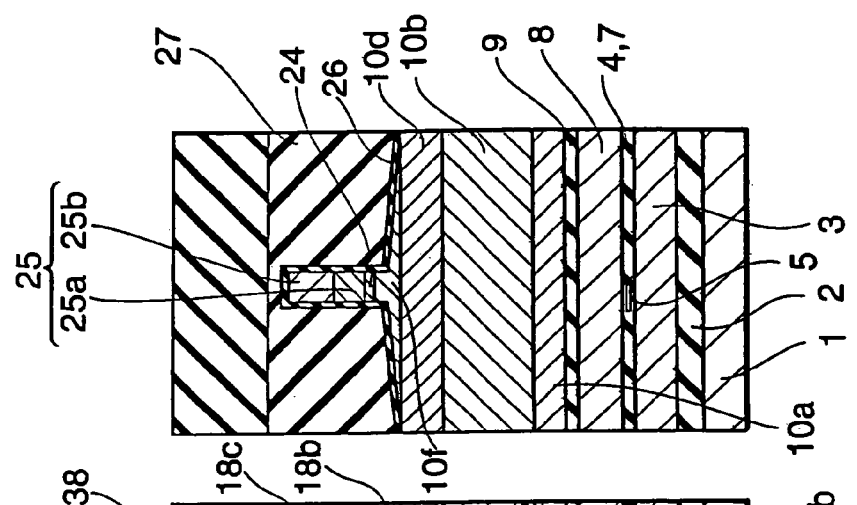
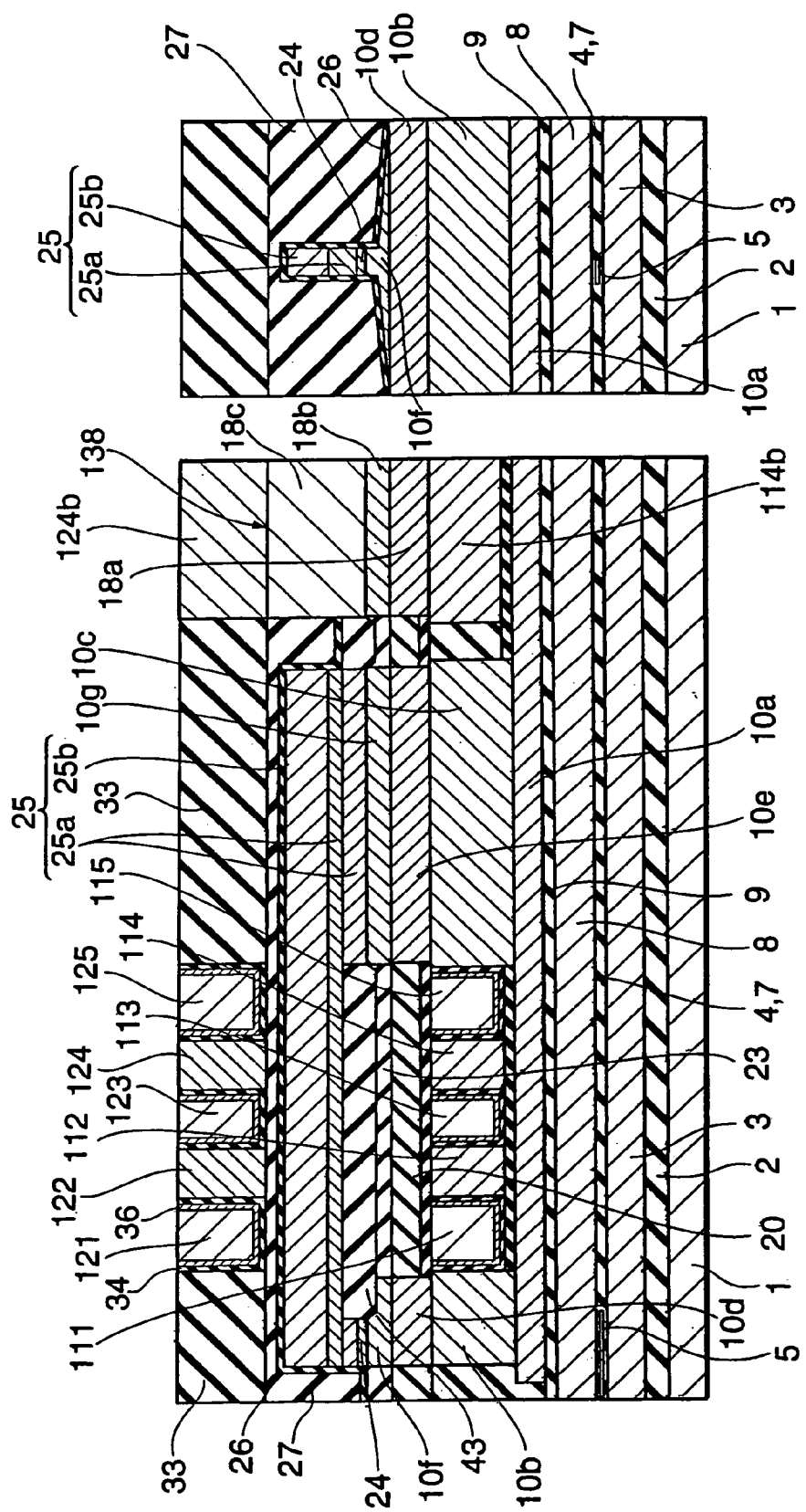

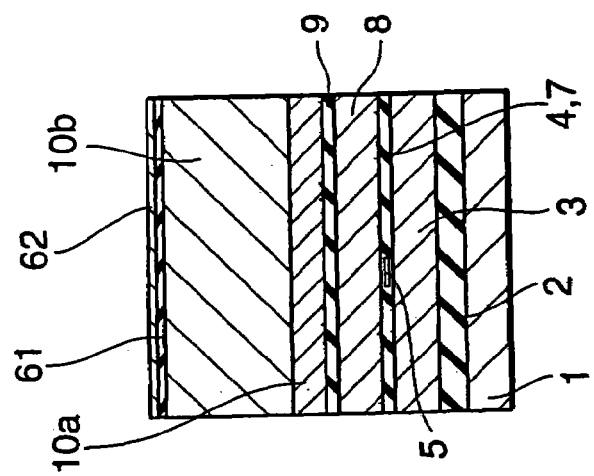
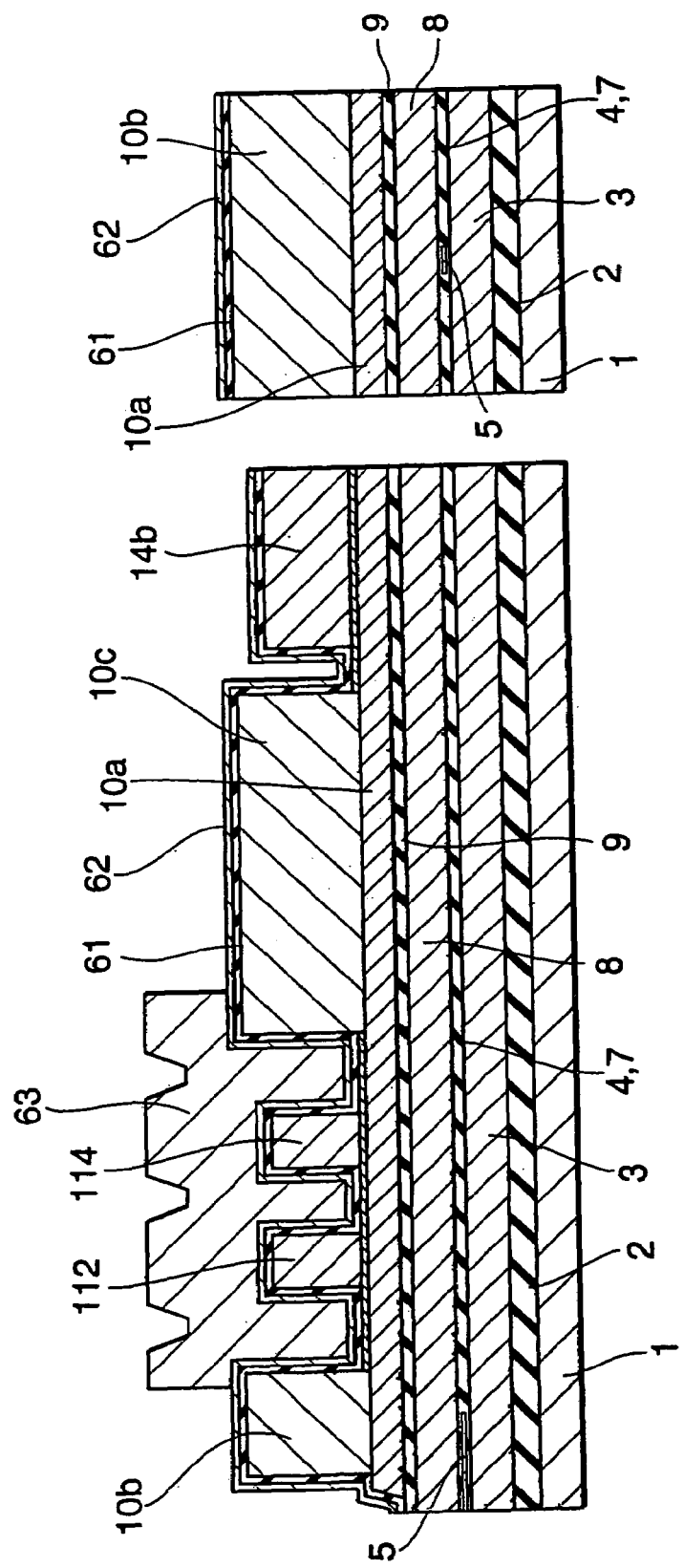

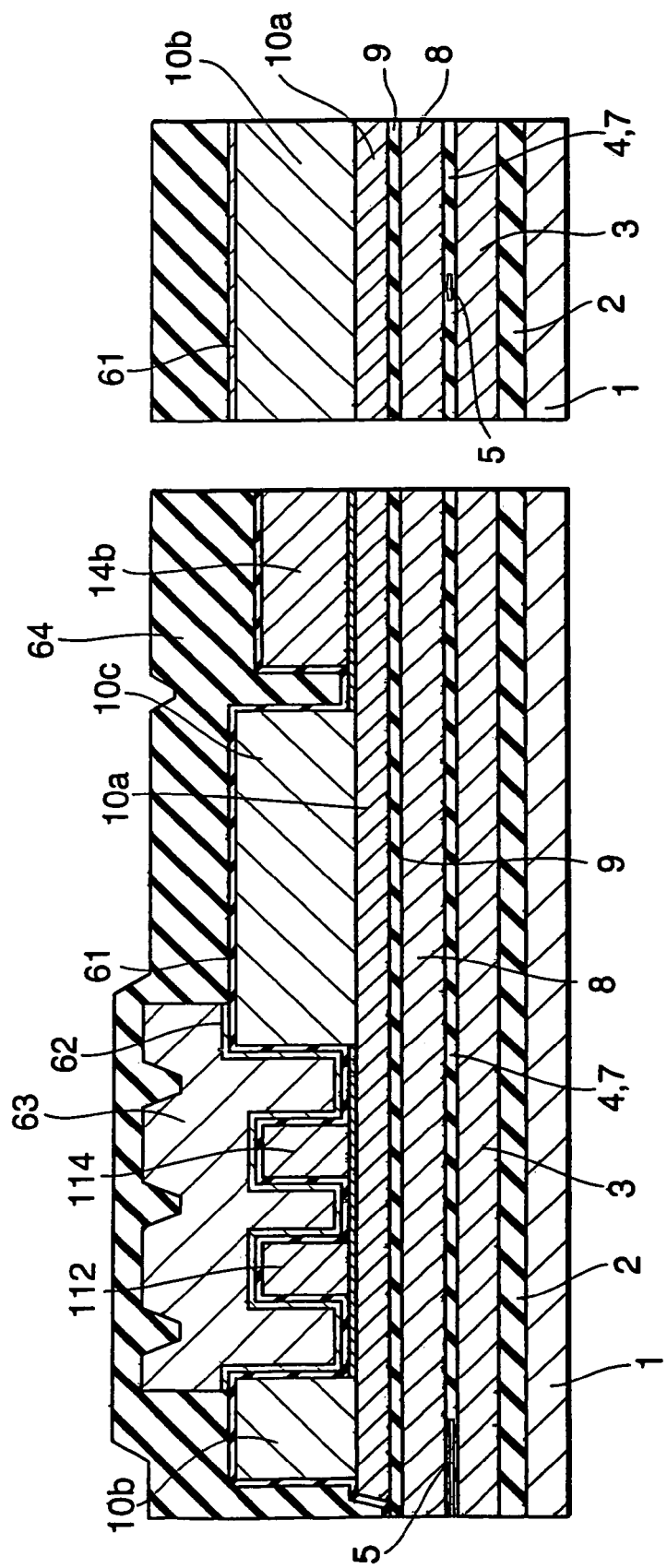

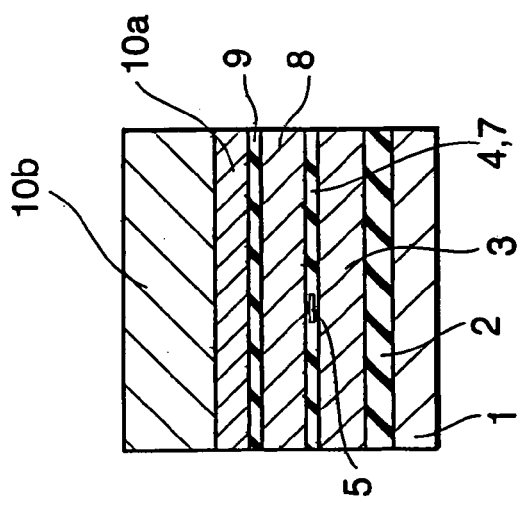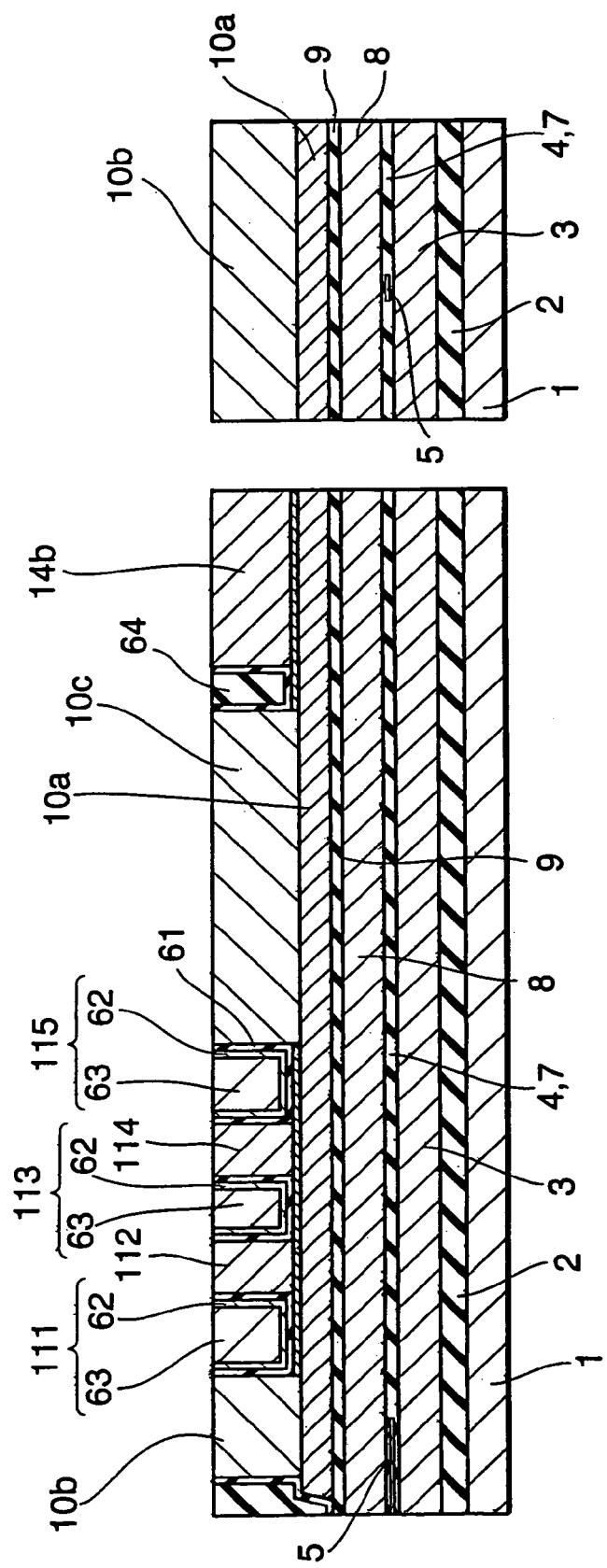

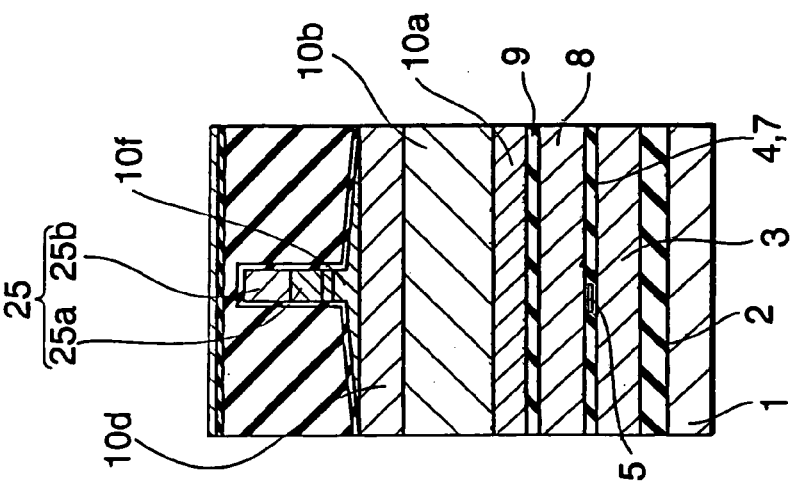
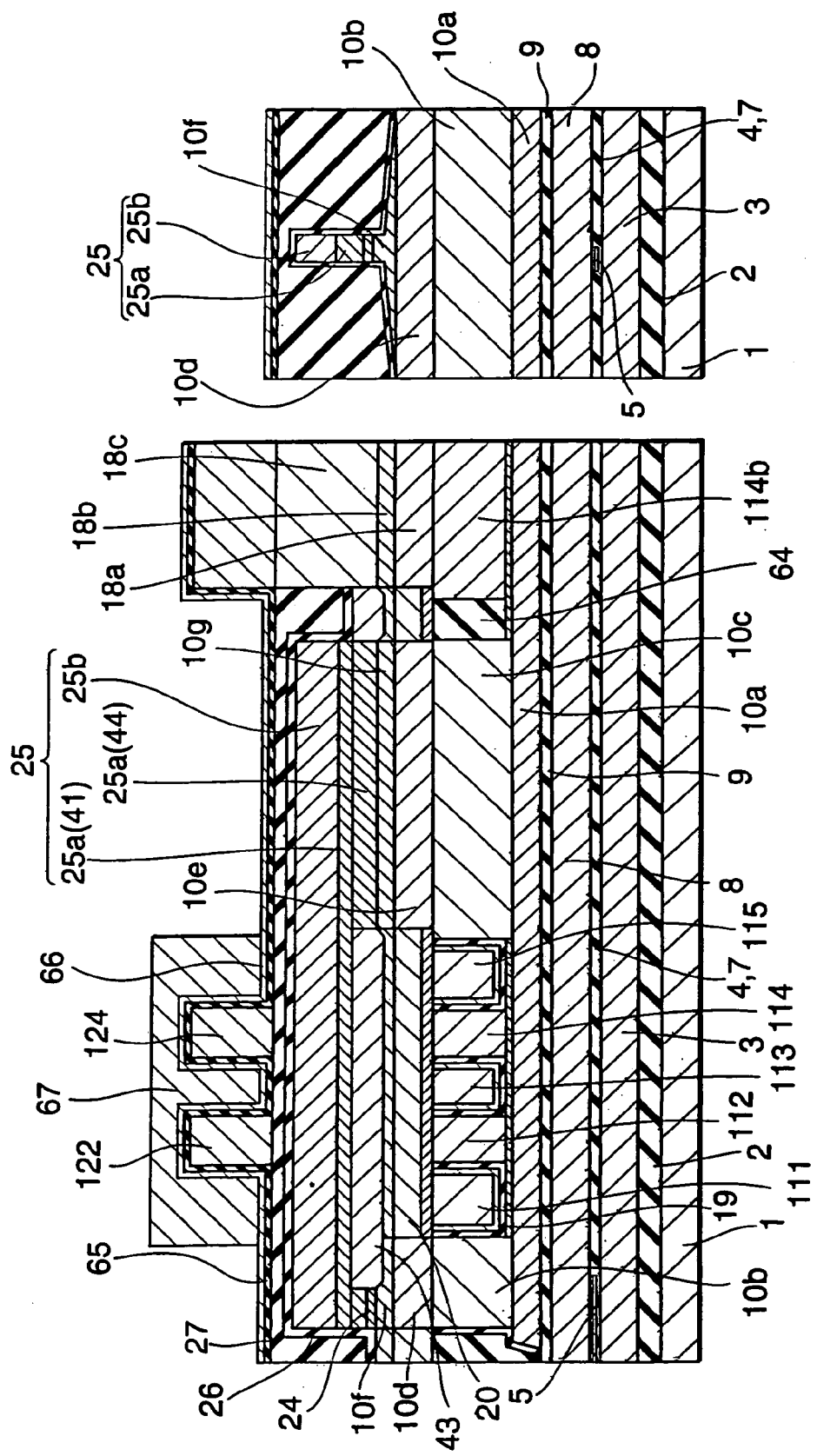

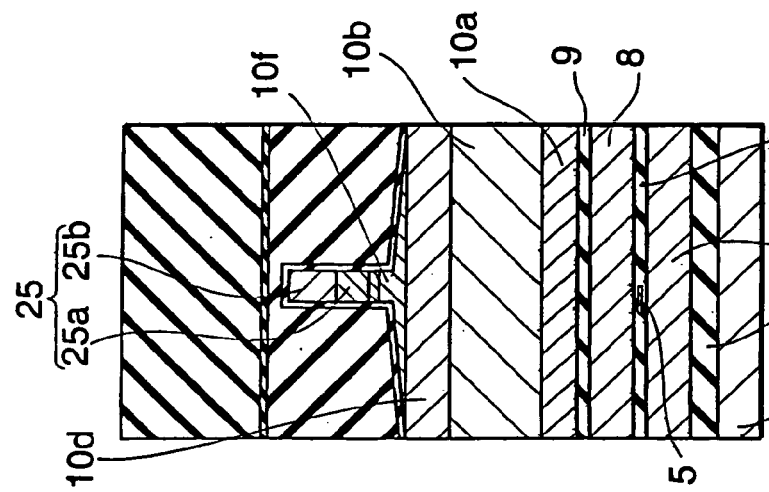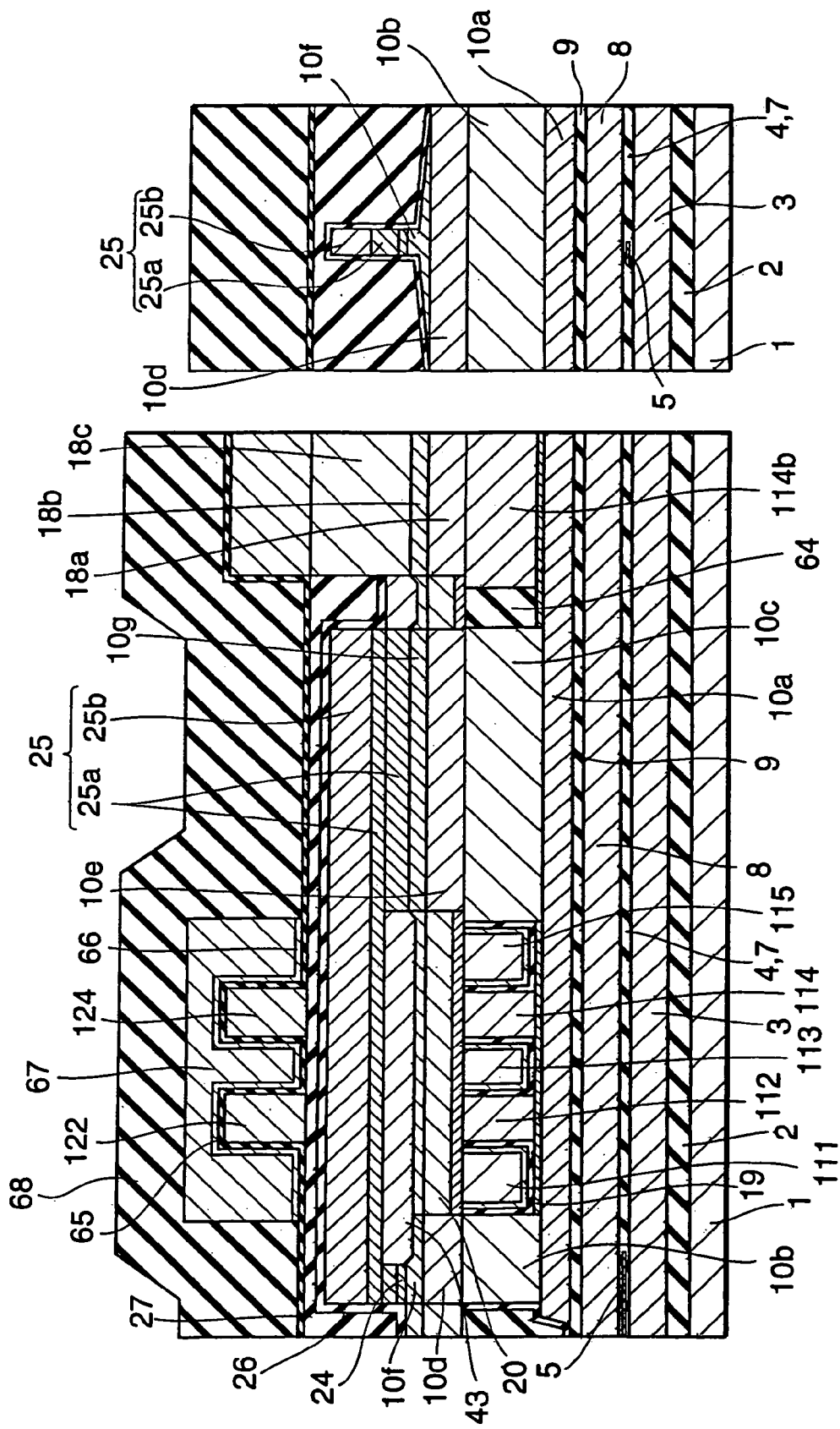

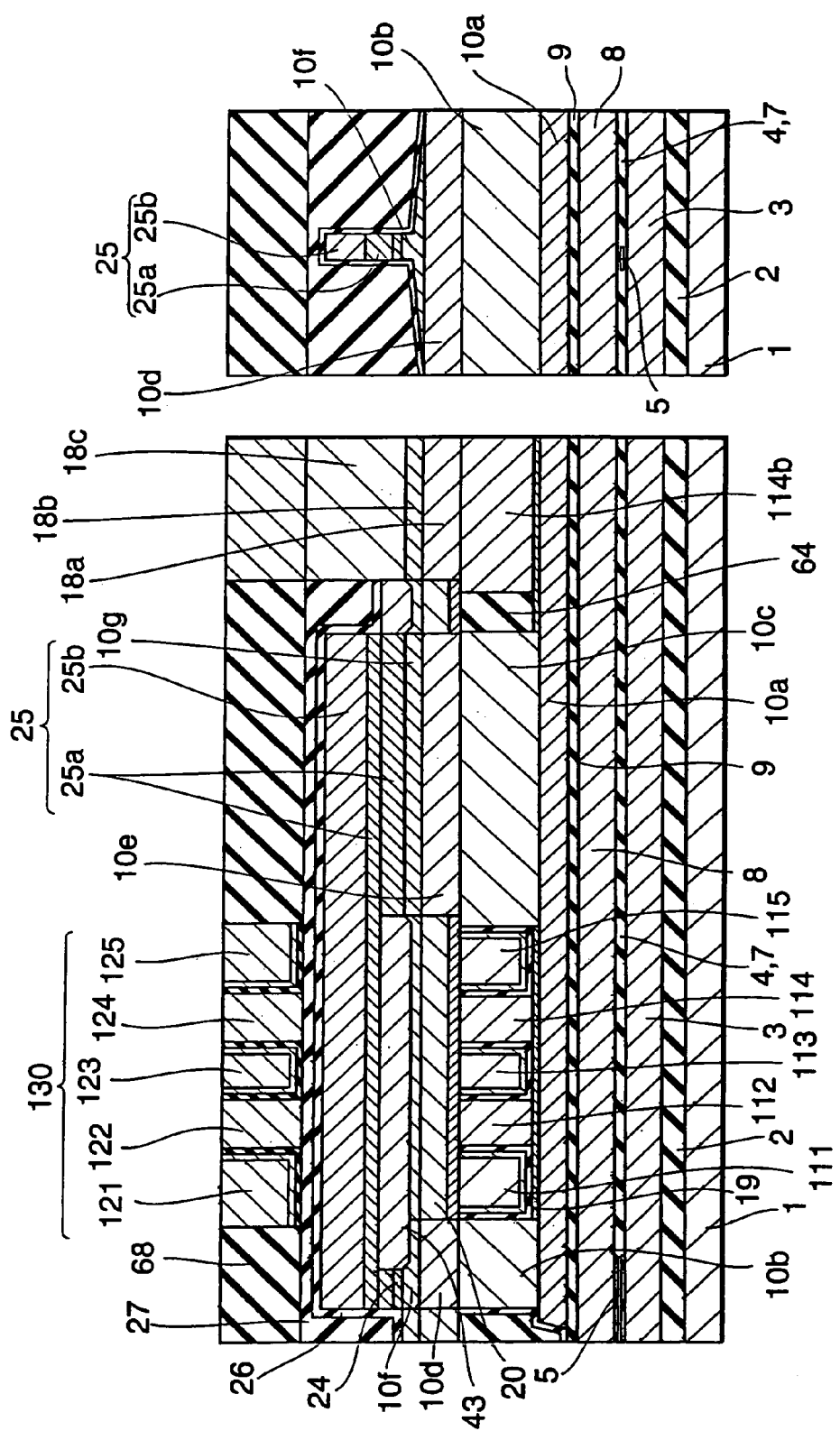

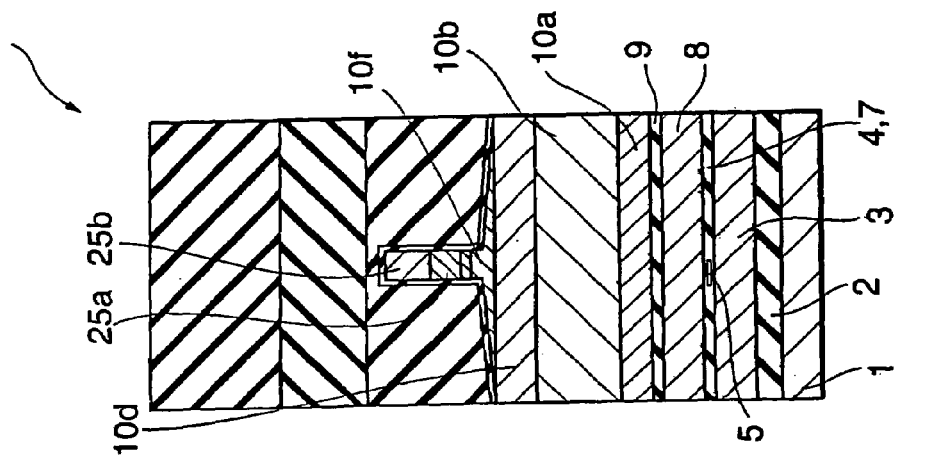
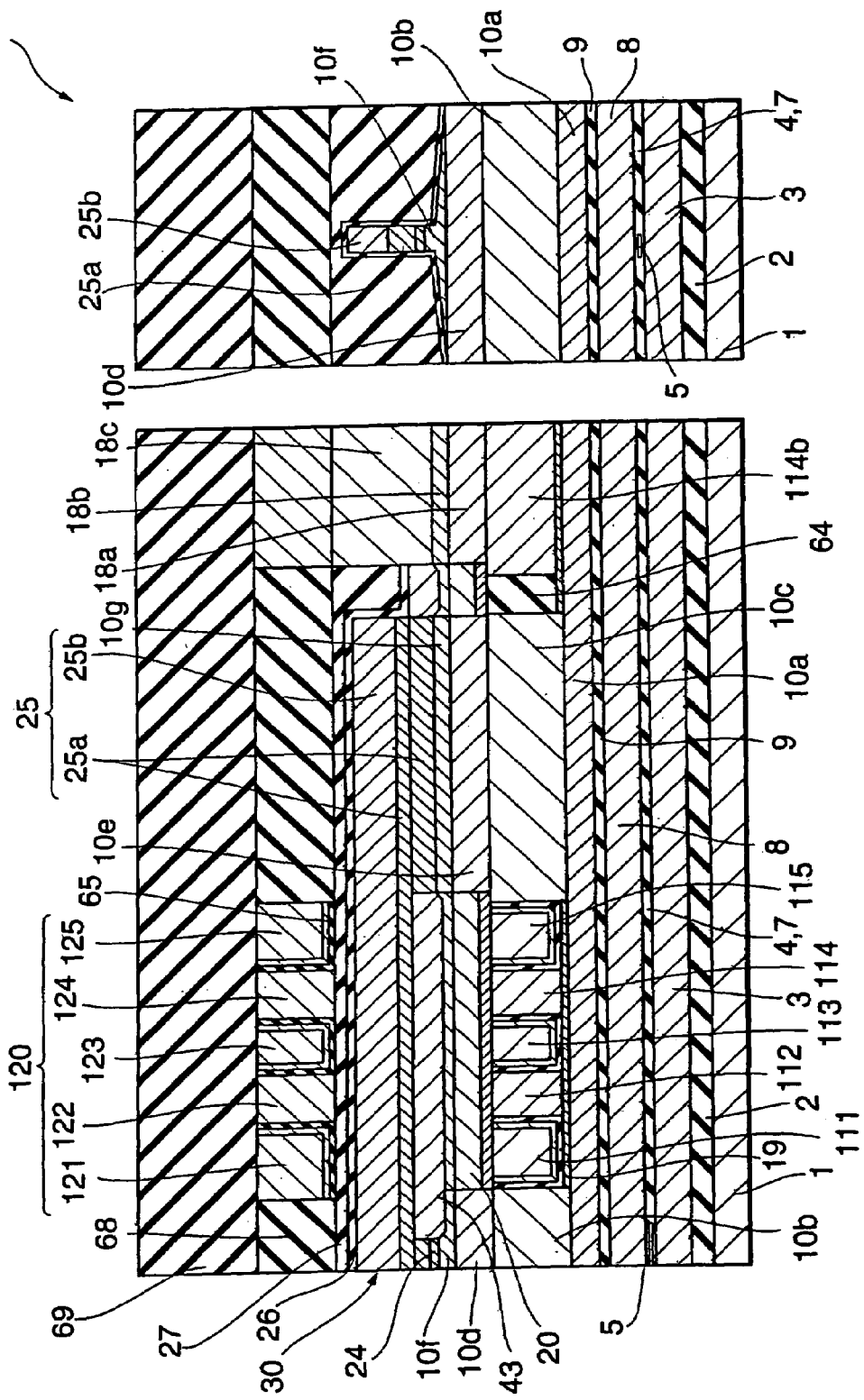

THIN-FILM MAGNETIC HEAD, A HEAD GIMBAL ASSEMBLY, AND A HARD DISK DRIVE

BACKGROUND OF THE INVENTION

1. Field of the Invention

The present invention relates to a thin-film magnetic head having at least an inductive electromagnetic transducer, a method of manufacturing the same, a head gimbal assembly, and a hard disk drive.

2. Related Background Art

In recent years, the areal density in hard disk drives has been increasing remarkably. Recently, the areal density in hard disk drives has reached 160 to 200 GB/platter in particular, and is about to increase further. Accordingly, thin-film magnetic heads have been required to improve their performances.

Widely used as a thin-film magnetic head is a combination thin-film magnetic head having a structure in which a recording head including an inductive electromagnetic transducer for writing and a reproducing head including a magnetoresistive device (which will also be referred to as MR device in the following) for reading are laminated.

In this kind of combination thin-film magnetic head, the recording head generally comprises a medium-opposing surface (air bearing surface, which will also be referred to as ABS), a lower magnetic pole layer, an upper magnetic pole layer, a recording gap layer, and a thin-film coil. The lower and upper magnetic pole layers have respective magnetic pole parts opposing each other (opposing magnetic pole parts) on the side of the medium-opposing surface, and are magnetically connected to each other by a connecting part disposed at a position separated from the opposing magnetic pole parts. The recording gap layer is formed between the opposing magnetic electrode parts. The thin-film coil is insulated from the lower and upper magnetic pole layers, while being at least partly disposed therebetween.

For improving performances of a recording head, its recording density in particular, a recording medium is required to improve its track density. This makes it necessary to realize a recording head having a narrow track structure in which the track width, i.e., the width between the two opposing magnetic pole parts in the medium-opposing surface, is reduced to a size of several microns to submicrons. Therefore, recording heads have been made by utilizing semiconductor processing technologies.

As the track width decreases, it becomes harder for a recording head to generate a magnetic flux having a high density between two opposing magnetic pole parts. Therefore, it has been desired to use a magnetic material having a high saturated magnetic flux density as a material for the magnetic pole parts.

When the frequency of a recording signal rises as the recording density improves, on the other hand, the recording head is required to improve the rate at which the magnetic flux changes, i.e., shorten the flux rise time. It is also desirable for the recording head to lower the deterioration in recording characteristics such as overwrite characteristic and non-linear transition shift in a high-frequency band.

For improving recording characteristics in a high frequency band, it is desired that the magnetic path length of the recording head be reduced so as to be able to follow rapid changes in recording signals which are likely to change fast while having a high frequency. The magnetic path length is mainly determined by the length (hereinafter referred to as "yoke length") from the medium-opposing surface in the lower or upper magnetic pole layer to the connecting part, whereby reducing the yoke length is effective at shortening the magnetic path length. When the thin-film coil is wound between the medium-opposing surface and the connecting part, reducing the pitch of windings disposed between the medium-opposing surface and the connecting part (hereinafter referred to as "winding pitch") in the windings of the thin-film coil is effective at shortening the yoke length.

Conventional thin-film magnetic heads are roughly divided into those having a planar spiral thin-film coil wound about a connecting part (see the following Patent Document 1), and those having a thin-film coil helically wound about at least one of the lower and upper magnetic pole layers (see the following Patent Documents 2, 3, 4).

The former thin-film magnetic heads generate a large part of magnetic fluxes near the connecting part, in which the magnetic fluxes guided to the opposing magnetic pole parts by the lower and upper magnetic pole parts are used for recording information. However, since most of magnetic fluxes are generated about the connecting part, only about a few percent of the generated magnetic fluxes are used for recording, whereby the recording with magnetic fluxes has not been effected efficiently in the former thin-film magnetic heads. Therefore, the number of turns of the thin-film coil has been made as large as possible in order to increase magnetic fluxes used for recording in the former thin-film magnetic heads. Conventionally known as an example of techniques therefor is one in which, between windings of a first coil, windings of a second coils are disposed, so as to reduce the winding pitch (see the following Patent Document 5).

In the latter thin-film magnetic heads, the thin-film coil is disposed near the medium-opposing surface, whereby generated magnetic fluxes are used for recording more efficiently than in the former. Therefore, as compared with the former thin-film magnetic heads having a planar spiral thin-film coil, the latter thin-film magnetic heads can decrease the number of turns of the thin-film coil, thereby being more advantageous in reducing the yoke length.

Reducing the yoke length is effective in improving recording characteristics in a high-frequency band in the latter thin-film magnetic heads as well, for which it will be advantageous if the winding pitch of the thin-film coil is made as small as possible. Raising the number of turns in the thin-film coil is also effective in increasing magnetic fluxes used for recording. For realizing all of them, it is necessary for the winding pitch to be made as small as possible, so as to reduce the yoke length and allow the number of turns in the thin-film coil to increase. To this aim, the width of each turn (turn width) of the thin-film coil is required to narrow.

Narrowing the turn width in the thin-film coil increases the ohmic value of the thin-film coil, thereby enhancing the heat generated from the thin-film coil. When the heat generated from the thin-film coil increases, the magnetic pole parts are more likely to project toward the recording medium, thereby colliding with the recording medium. Therefore, the conventional thin-film magnetic heads have not been able to reduce the turn width so much, and thus have failed to decrease the yoke length.

Conventionally, the thin-film coil has been formed by frame plating. Frames used in frame plating have wall parts to be disposed between turns. Each wall part must have a certain extent of width in order to maintain its form. This makes it difficult to reduce the space between adjacent turns (turn space) when forming the thin-film coil by frame plating. Though the technique disclosed in the following Patent Document 5 can reduce the space between adjacent turns, the resulting thin-film magnetic head comprises a planar spiral thin-film coil, and thus is disadvantageous in that generated magnetic fluxes cannot efficiently be used for recording.

Patent Document 1: U.S. Pat. No. 6,043,959
Patent Document 2: U.S. Pat. No. 5,995,342
Patent Document 3: Japanese Patent Application Laid-Open No. 2000-311311
Patent Document 4: U.S. Pat. No. 6,459,543B1
Patent Document 5: U.S. Pat. No. 6,191,916B1

SUMMARY OF THE INVENTION

In order to overcome the problems mentioned above, it is an object of the present invention to provide a thin-film magnetic head comprising a structure excellent in recording characteristics in a high-frequency band without raising the ohmic value, a method of manufacturing the same, a head gimbal assembly, and a hard disk drive.

For achieving the above-mentioned object, the present invention provides a thin-film magnetic head comprising first and second magnetic pole groups, magnetically connected to each other, having respective magnetic pole parts opposing each other on a side of a medium-opposing surface opposing a recording medium; a recording gap layer formed between the magnetic pole parts; a thin-film coil insulated from the first and second magnetic pole groups and helically wound about at least one of the first and second magnetic pole groups; and a substrate having the first and second magnetic pole groups, recording gap layer, and thin-film coil laminated thereon; the thin-film coil comprising a first conductor group having a plurality of inner conductor parts disposed between the first and second magnetic pole groups, a second conductor group having a plurality of outer conductor parts disposed outside the second magnetic pole group, and a connecting part group having a plurality of connecting parts for connecting the inner conductor parts to the outer conductor parts; the first conductor group including an insulating contact structure for making the inner conductor parts in contact with each other by way of an insulating film, the second conductor group including an insulating contact structure for making the outer conductor parts in contact with each other by way of an insulating film.

Since each of the first and second conductor groups has an insulating contact structure in this thin-film magnetic head, adjacent inner conductor parts and adjacent outer conductor parts have only insulating films therebetween, whereas the space between the adjacent conductor parts equals the thickness of their corresponding insulating film.

Preferably, in the thin-film magnetic head, any of the inner conductor parts is in contact with the first magnetic pole group by way of an insulating film. This configuration can further reduce the yoke length in the thin-film magnetic head.

Preferably, the first and second conductor groups have an arrangement density of the inner conductor parts and outer conductor parts in a direction intersecting the medium-opposing surface increasing from outside the second magnetic pole group toward the second magnetic pole group.

In this case, the thin-film magnetic head is configured such that the inner and outer conductor parts become denser toward the second magnetic pole group, thereby reducing the winding pitch.

Preferably, each connecting part is arranged along the medium-opposing surface on the outside of the second magnetic pole group.

This reduces the distance from the air bearing surface to each connecting part.

Preferably, the connecting parts are disposed at respective positions distanced from the medium-opposing surface differently from each other.

In this case, the connecting parts are shifted from each other in a direction along the air bearing surface.

Preferably, each of the inner and outer conductor parts has a variable width structure with a path width gradually expanding from a part corresponding to the second magnetic pole group to the outside thereof.

As a consequence, each of the inner and outer conductor parts is less likely to obstruct current flows, whereby currents flow smoothly.

Preferably, in this case, the first magnetic pole group has a projection protruding toward the medium-opposing surface.

This can make the inner and outer conductor parts change their path widths along the first magnetic pole group.

Preferably, each of the inner and outer conductor parts includes a narrowest part having the narrowest path width at a position corresponding to the projection.

As a consequence, the area in which the path width is narrowed is minimized in each of the inner and outer conductor parts.

Preferably, the projection has a curved surface protruding toward the medium-opposing surface.

In this case, the inner and outer conductor parts can change forms of their side parts along the projection.

Preferably, each of the inner and outer conductor parts is curved in conformity to a side face form of the projection.

In this case, the inner and outer conductor parts can gradually change their path widths.

Preferably, the insulating film disposed between the inner or outer conductor parts is formed by a laminate of a plurality of alumina films.

This insulating film becomes a dense film.

Preferably, the second magnetic pole group is formed by a laminate of two flat magnetic pole layers.

This can prevent magnetic fluxes from being saturated.

In another aspect, the present invention provides a method of manufacturing a thin-film magnetic head by laminating on a substrate first and second magnetic pole groups, magnetically connected to each other, having respective magnetic pole parts opposing each other on a side of a medium-opposing surface opposing a recording medium; a recording gap layer formed between the magnetic pole parts; and a thin-film coil insulated from the first and second magnetic pole groups and helically wound about at least one of the first and second magnetic pole groups; the method comprising the following steps (1) to (9):

(1) forming a plurality of first inner conductor parts and a lower connecting layer both in contact by way of an insulating film with a first magnetic pole layer disposed on the substrate, and a second magnetic pole layer disposed at a position defining a yoke length;

(2) forming an inner groove covered with a separation insulating film between the second magnetic pole layer and the first inner conductor parts adjacent each other;

(3) forming a second inner conductor part within each inner groove, and constructing a first conductor group by the first and second inner conductor parts;

(4) forming the first magnetic pole group by laminating a third magnetic pole layer on the second magnetic pole layer;

(5) forming the second magnetic pole group on the first magnetic pole group so as to provide the recording gap layer;

(6) forming a plurality of first outer conductor parts in contact with the second magnetic pole group by way of an insulating film, and an insulating part disposed at a position defining the yoke length;

(7) forming an outer groove covered with a separation insulating film between the insulating part and the first outer conductor parts adjacent each other;

(8) forming a second outer conductor part within each outer groove, and constructing a second conductor group by the first and second outer conductor parts; and (9) forming a connecting part group by placing an upper connecting layer onto the lower connecting layer, and constructing the thin-film coil by the connecting part group and the first and second conductor groups.

These steps yield the thin-film magnetic head in which each of the first and second conductor groups has an insulating contact structure.

Preferably, in the above-mentioned method, each of the first and second inner conductor parts and the first and second outer conductor parts is formed by plating.

Preferably, each of the second inner and outer conductor parts is constructed by forming an electrode film by sputtering and then disposing an electrically conductive layer by plating thereon.

The separation insulating film can be formed by laminating a plurality of alumina films.

In still another aspect, the present invention provides a method of manufacturing a thin-film magnetic head by laminating on a substrate first and second magnetic pole groups, magnetically connected to each other, having respective magnetic pole parts opposing each other on a side of a medium-opposing surface opposing a recording medium; a recording gap layer formed between the magnetic pole parts; and a thin-film coil insulated from the first and second magnetic pole groups and helically wound about at least one of the first and second magnetic pole groups; the method comprising the following steps (1) to (10):

(1) forming a plurality of first inner conductor parts and a lower connecting layer both in contact by way of an insulating film with a first magnetic pole layer disposed on the substrate, and a second magnetic pole layer disposed at a position defining a yoke length;

(2) forming an inner groove covered with a separation insulating film between the second magnetic pole layer and the first inner conductor parts adjacent each other;

(3) forming a second inner conductor part within each inner groove, and constructing a first conductor group by the first and second inner conductor parts;

(4) forming the first magnetic pole group by laminating a third magnetic pole layer on the second magnetic pole layer;

(5) forming the second magnetic pole group on the first magnetic pole group so as to provide the recording gap layer;

(6) forming a plurality of first outer conductor parts in contact with the second magnetic pole group by way of an insulating film;

(7) providing a surface of each first outer conductor part with a separation insulating film for each outer conductor part, and forming an outer groove covered with the separation insulating film between the first outer conductor parts adjacent each other;

(8) forming an electrically conductive layer in an area for arranging the thin-film coil so as to fill the outer groove;

(9) forming a second outer conductor part in contact by way of the separation insulating film with each first outer conductor part by the electrically conductive layer, and constructing a second conductor group by the first and second outer conductor parts; and

(10) forming a connecting part group by placing an upper connecting layer onto the lower connecting layer, and constructing the thin-film coil by the connecting part group and the first and second conductor groups.

These steps also yield the thin-film magnetic head in which each of the first and second conductor groups has an insulating contact structure.

Preferably, each of the second inner and outer conductor parts is constructed by forming an electrode film by sputtering and then disposing an electrically conductive layer by plating thereon.

The separation insulating film can be formed by laminating a plurality of alumina films.

In still another aspect, the present invention provides a head gimbal assembly comprising a support, a thin-film magnetic head formed on the support, and a gimbal for securing the support; the thin-film magnetic head comprising first and second magnetic pole groups, magnetically connected to each other, having respective magnetic pole parts opposing each other on a side of a medium-opposing surface opposing a recording medium; a recording gap layer formed between the magnetic pole parts; a thin-film coil insulated from the first and second magnetic pole groups and helically wound about at least one of the first and second magnetic pole groups; and a substrate having the first and second magnetic pole groups, recording gap layer, and thin-film coil laminated thereon; the thin-film coil comprising a first conductor group having a plurality of inner conductor parts disposed between the first and second magnetic pole groups, a second conductor group having a plurality of outer conductor parts disposed outside the second magnetic pole group, and a connecting part group having a plurality of connecting parts for connecting the inner conductor parts to the outer conductor parts; the first conductor group including an insulating contact structure for making the inner conductor parts in contact with each other by way of an insulating film, the second conductor group including an insulating contact structure for making the outer conductor parts in contact with each other by way of an insulating film.

In still another aspect, the present invention provides a hard disk drive comprising a head gimbal assembly including a thin-film magnetic head, and a recording medium opposing the thin-film magnetic head; the thin-film magnetic head comprising first and second magnetic pole groups, magnetically connected to each other, having respective magnetic pole parts opposing each other on a side of a medium-opposing surface opposing the recording medium; a recording gap layer formed between the magnetic pole parts; a thin-film coil insulated from the first and second magnetic pole groups and helically wound about at least one of the first and second magnetic pole groups; and a substrate having the first and second magnetic pole groups, recording gap layer, and thin-film coil laminated thereon; the thin-film coil comprising a first conductor group having a plurality of inner conductor parts disposed between the first and second magnetic pole groups, a second conductor group having a plurality of outer conductor parts disposed outside the second magnetic pole group, and a connecting part group having a plurality of connecting parts for connecting the inner conductor parts to the outer conductor parts; the first conductor group including an insulating contact structure for making the inner conductor parts in contact with each other by way of an insulating film, the second conductor group including an insulating contact structure for making the outer conductor parts in contact with each other by way of an insulating film.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 2 is a plan view showing a first conductor group and a connecting part group which constitute a thin-film coil;

FIG. 3 is a plan view showing a second conductor group constituting the thin-film coil;

FIG. 4A is a sectional view of the thin-film coil taken along the line IV—IV of FIG. 2, whereas FIG. 4B is a sectional view thereof taken along a plane parallel to an air bearing surface;

FIGS. 6A and 6B are sectional views showing a step subsequent to the step shown in FIGS. 5A and 5B;

FIGS. 7A and 7B are sectional views showing a step subsequent to the step shown in FIGS. 6A and 6B;

FIGS. 8A and 8B are sectional views showing a step subsequent to the step shown in FIGS. 7A and 7B;

FIGS. 9A and 9B are sectional views showing a step subsequent to the step shown in FIGS. 8A and 8B;

FIGS. 11A and 11B are sectional views showing a step subsequent to the step shown in FIGS. 10A and 10B;

FIGS. 12A and 12B are sectional views showing a step subsequent to the step shown in FIGS. 11A and 11B;

FIGS. 13A and 13B are sectional views showing a step subsequent to the step shown in FIGS. 12A and 12B;

FIGS. 14A and 14B are sectional views showing a step subsequent to the step shown in FIGS. 13A and 13B;

FIGS. 15A and 15B are sectional views showing a step subsequent to the step shown in FIGS. 14A and 14B;

FIGS. 16A and 16B are sectional views showing a step subsequent to the step shown in FIGS. 15A and 15B;

FIGS. 18A and 18B are sectional views showing a step subsequent to the step shown in FIGS. 17A and 17B;

FIGS. 20A and 20B are sectional views showing a step subsequent to the step shown in FIGS. 19A and 19B;

FIGS. 21A and 21B are sectional views showing a step subsequent to the step shown in FIGS. 20A and 20B;

FIGS. 22A and 22B are sectional views showing a step subsequent to the step shown in FIGS. 21A and 21B;

FIGS. 31A and 31B are sectional views showing a step of manufacturing a thin-film magnetic head in a second embodiment;

FIGS. 32A and 32B are sectional views showing a step subsequent to the step shown in FIGS. 31A and 31B;

FIGS. 33A and 33B are sectional views showing a step subsequent to the step shown in FIGS. 32A and 32B;

FIGS. 34A and 34B are sectional views showing a step subsequent to the step shown in FIGS. 33A and 33B;

FIGS. 35A and 35B are sectional views showing a step subsequent to the step shown in FIGS. 34A and 34B;

FIGS. 36A and 36B are sectional views showing a step subsequent to the step shown in FIGS. 35A and 35B;

FIGS. 37A and 37B are sectional views showing a step subsequent to the step shown in FIGS. 36A and 36B.

DETAILED DESCRIPTION OF THE PREFERRED EMBODIMENTS

In the following, embodiments of the present invention will be explained with reference to the drawings. Constituents identical to each other will be referred to with numerals identical to each other without repeating their overlapping descriptions.

First Embodiment

Structure of Thin-Film Magnetic Head

Figure 1:
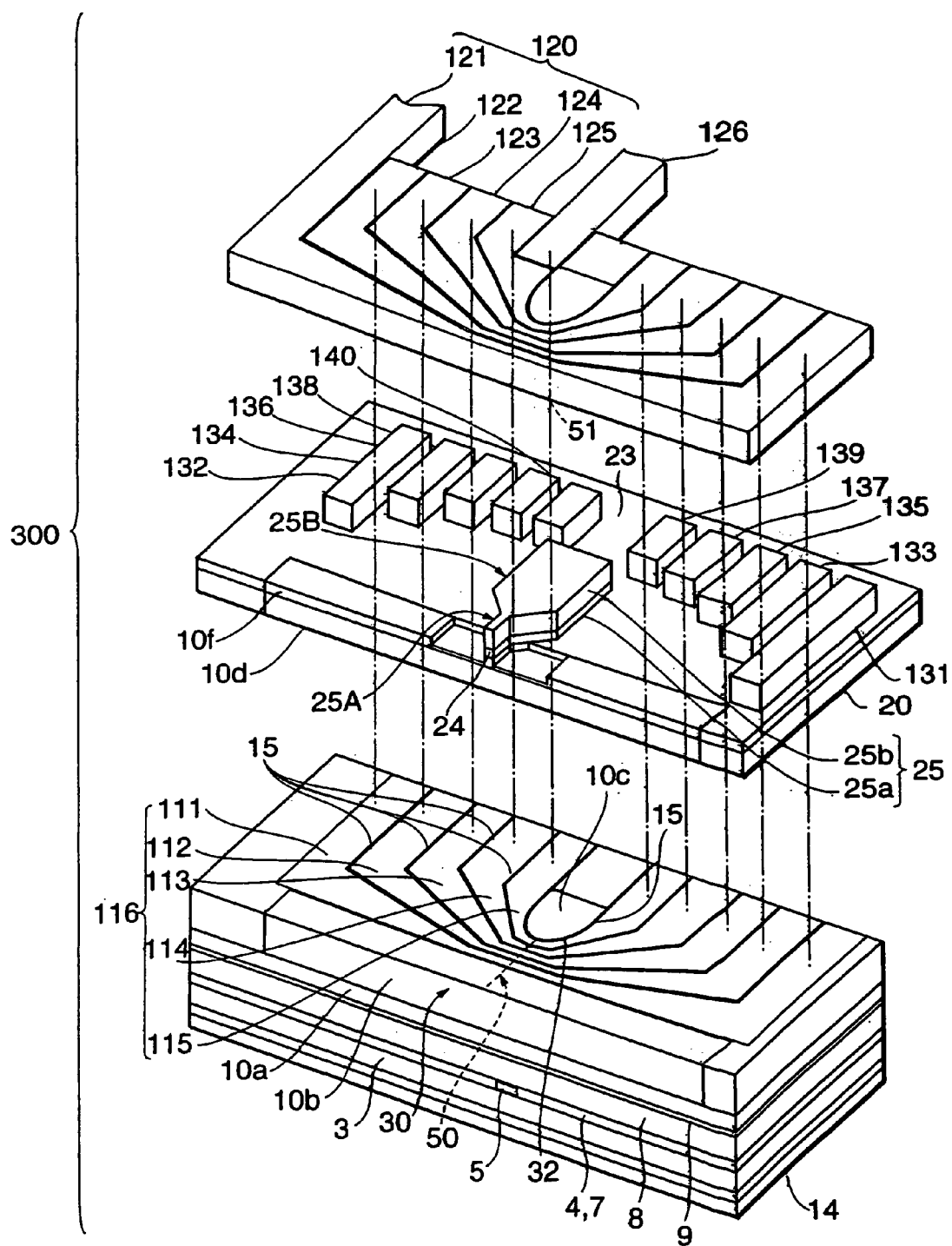
FIG. 1 is an exploded perspective view showing a major part of the thin-film magnetic head in accordance with a first embodiment of the present invention.

First, with reference to FIGS. 1 to 4, the structure of the thin-film magnetic head in accordance with a first embodiment of the present invention will be explained. FIG. 1 is an exploded perspective view showing a main part of the thin-film magnetic head 300 in accordance with the first embodiment of the present invention. FIG. 2 is a plan view showing a first conductor group 116 and a connecting part group 130 which constitute a thin-film coil 110, whereas FIG. 3 is a plan view showing a second conductor group 120 thereof. FIG. 4A is a sectional view taken along the line IV—IV of FIG. 2, whereas FIG. 4B is a sectional view taken along a plane parallel to an air bearing surface.

The thin-film magnetic head 300 in accordance with the first embodiment comprises a substrate 1, and a reproducing head and a recording head (inductive electromagnetic transducer) which are laminated on the substrate 1, while having an air bearing surface 30 acting as a medium-opposing surface opposing a recording medium. The structure of a main part of the thin-film magnetic head 300 will be explained in the following, whereas the structure of the other part of the thin-film magnetic head will be explained in a manufacturing process set forth later.

The reproducing head includes an MR device 5, disposed near the air bearing surface 30, for detecting a magnetic signal. The reproducing head comprises a lower shield layer 3 and an upper shield layer 8 which are disposed so as to oppose each other by way of the MR device 5 on the air bearing surface 30 side and shield the MR device 5, a lower shield gap film 4 disposed between the MR device 5 and the lower shield layer 3, and an upper shield gap film 7 disposed between the MR device 5 and the upper shield layer 8.

The recording head comprises a lower magnetic pole layer 10, an upper magnetic pole layer 25, a recording gap layer 24, and a thin-film coil 110 which are laminated on the substrate 1. The lower magnetic pole layer 10 and upper magnetic pole layer 25 have respective magnetic pole parts (opposing magnetic pole parts) opposing each other on the air bearing surface 30 side, and are magnetically connected to each other in a connecting part 31 which will be explained later. The recording gap layer 24 is formed between the respective opposing magnetic pole parts of the lower magnetic pole layer 10 and upper magnetic pole layer 25. While being insulated from the lower magnetic pole layer 10 and upper magnetic pole layer 25, the thin-film coil 110 is helically wound about the upper magnetic pole layer 25. The lower magnetic pole layer 10 and upper magnetic pole layer 25 in this embodiment correspond to the first and second magnetic pole groups in the present invention, respectively.

As shown in FIGS. 4A and 4B, the lower magnetic pole 10 comprises a first magnetic pole part 10a, a second magnetic pole part 10b, a third magnetic pole part 10c, a fourth magnetic pole part 10d, a fifth magnetic pole part 10e, a sixth magnetic pole part 10f, and a seventh magnetic pole part 10g.

The first magnetic pole part 10a is disposed at a position opposing the first conductor group 116 in the thin-film coil 110. In the vicinity of the air bearing surface 30, the second magnetic pole part 10b projects closer to the upper magnetic pole layer 25 than is the first magnetic pole part 10a, so as to connect with the first magnetic pole part 10a. At a position separated from the air bearing surface 30 by way of a part of the first conductor group 116 and second conductor group 120, which will be explained later, the third magnetic pole part 10c projects closer to the upper magnetic pole layer 25 than is the first magnetic pole part 10a, so as to connect with the first magnetic pole part 10a. As shown in FIG. 2, the third magnetic pole part 10c comprises a pillar 32a and a projection 32b protruding toward the air bearing surface 30 from the pillar 32a, whereas the projection 32b has a curved surface forming a part of a cylinder (cylindrically curved surface). The pillar 32a is formed like a rectangular column.

The third magnetic pole part 10c, fifth magnetic pole part 10e, and seventh magnetic pole part 10g construct a connecting part 31 for magnetically connecting the upper magnetic pole layer 25 and lower magnetic pole layer 10 to each other (see FIG. 4A). In the sixth magnetic pole part 10f, the part opposing a track width defining part 25A, which will be explained later, by way of the recording gap layer 24 is an opposing magnetic pole part in the present invention.

As shown in FIG. 4B, the lower magnetic pole layer 10 and upper magnetic pole layer 25 have a trim structure. This trim structure prevents an effective recording track width from increasing because of the spread of magnetic fluxes occurring when writing a narrow track.

As shown in FIG. 1, the upper magnetic pole layer comprises a first magnetic pole part 25a in contact with the recording gap layer 24, and a second magnetic pole part 25b disposed on the first magnetic pole part 25a. The upper magnetic pole layer 25 also comprises a track width defining part 25A and a yoke part 25B. The track width defining part 25A is an opposing magnetic pole part in the present invention, and defines a recording track width. The track width defining part 25A comprises an end part disposed on the air bearing surface 30, and an arm part extending from the end part so as to connect with the yoke part 25B. The yoke part 25B comprises a fixed width part having a constant width, and a taper part whose width gradually decreases from the fixed width part to the track width defining part 25A.

The thin-film coil 110 comprises the first conductor group 116, second conductor group 120, and connecting part group 130 which are connected to each other so as to form a series of 5-turn loops, and is helically wound about the upper magnetic pole layer 25.

As shown in FIGS. 2 and 4A, the first conductor group 116 comprises first inner conductor parts 112, 114 and second inner conductor parts 111, 113, 115 disposed between the lower magnetic pole layer 10 and upper magnetic pole layer 25. The first conductor group 116 has an insulating contact structure in which those adjacent each other in the inner conductor parts 111 to 115 are in contact with each other by way of a separation insulating film 15 which will be explained later, and is disposed in an area where the insulating film 11 is arranged in the first magnetic pole part 10a. The inner conductor part 111 is in contact with the second magnetic pole part 10b by way of the separation insulating film 15, whereas the inner conductor part 115 is in contact with the third magnetic pole part 10c by way of the separation insulating film 15 (see FIGS. 1 and 4A).

The inner conductor parts 111 to 115 comprise respective rectangular end parts 111a to 115a, rectangular end parts 111b to 115b, and joints 111c to 115c therebetween elongated in a direction (Y direction in FIG. 2) along the air bearing surface 30. The first conductor group 116 has a density changing structure in which the arrangement density varies in a direction intersecting the air bearing surface 30 (intersecting direction, i.e., X direction in FIGS. 2 and 3) in the joints 111c to 115c. Namely, in the inner conductor parts 111 to 115, the number of those arranged (arranged number) in an area having a width W equal to the length of the shortest line 50 from the air bearing surface 30 to the projection 32b successively increases from 1 to 5 from the outside of the upper magnetic pole layer 25 to the upper magnetic pole layer 25. As a consequence, the first conductor group 116 is arranged such that the inner conductor parts 111 to 115 gradually concentrate toward the upper magnetic pole layer 25, thereby reducing the winding pitch.

The inner conductor parts 111 to 115 have a variable width structure in which the width (path width) intersecting a current gradually expands from the part corresponding to the upper magnetic pole layer 25 to the outside thereof, and includes the narrowest part having the narrowest path width at a position corresponding to the projection 32b of the third magnetic pole part 10c.

The separation insulating film 15 is formed with a thickness not greater than the shortest distance between the bottom of the first conductor group 116 and the lower magnetic pole layer 10. Namely, as shown in FIG. 4A, the shortest distance between the first conductor group 116 and lower magnetic pole layer 10 equals the thickness of the insulating film 11 interposed between the bottom of the inner conductor parts 112, 114 and the lower magnetic pole layer 10, whereas the thickness of the separation insulating film 15 has a thickness not greater than that of the insulating film 11.

As shown in FIG. 3, the second conductor group 120 comprises first outer conductor parts 122, 124 and second outer conductor parts 121, 123, 125 which are disposed on a plane different from the first conductor group 116 on the outside of the upper magnetic pole layer 25. Also, the second conductor group 120 has an insulating contact structure in which those adjacent each other in outer conductor parts 121 to 125 are in contact with each other by way of a separation insulating film 34. The outer conductor part 121 is in contact with an insulating part 33, which will be explained later, by way of the separation insulating film 34, and the outer conductor part 125 is also in contact with the insulating part 33 by way of the separation insulating film 34 (see FIG. 4A).

The inner conductor parts 121 to 125 comprise rectangular end parts 122a to 125a, rectangular end parts 122b to 125b, and joints 121c to 125c therebetween elongated in a direction along the air bearing surface 30. As with the first conductor group 116, the second conductor group 120 has a density changing structure in which the arrangement density varies in a direction intersecting the air bearing surface 30 in the joints 121c to 125c in the outer conductor parts 121 to 125.

The outer conductor parts 121 to 125 have a variable width structure in which the path width expands from the part corresponding to the upper magnetic pole layer 25 to the outside thereof, and includes the narrowest part having the narrowest path width at a position corresponding to the projection 32b of the third magnetic pole part 10c.

The connecting part group 130 comprises a plurality of connecting parts 131 to 140. The connecting parts 131 to 140 are provided for connecting the inner conductor parts 111 to 115 to the outer conductor parts 121 to 125, respectively, and arranged along the air bearing surface 30 on the outside of the upper magnetic pole layer 25 in the following manner. Namely, the connecting parts 131, 133, 135, 137, 139 are disposed so as to connect the rectangular end parts 121b to 125b of the outer conductor parts 121 to 125 to the rectangular end parts 111a to 115a of the inner conductor parts 111 to 115. The connecting parts 132, 134, 136, 138 are disposed so as to connect the rectangular end parts 122a to 125a of the outer conductor parts 122 to 125 to the rectangular end parts 111b to 114b of the inner conductor parts 111 to 114. The connecting part 140 is disposed so as to connect a lead layer 126 to the rectangular end part 115b of the inner conductor part 115.

The thin-film coil 110 extends from the outer conductor part 121 to the inner conductor part 111 by way of the connecting part 131, and from the inner conductor part 111 to the outer conductor part 122 by way of the connecting part 132, thereby forming a 1-turn loop. Similarly, 4-turn loops are formed, whereby the thin-film coil 110 constructs a series of helical loops as a whole. Thereafter, the thin-film coil 110 is connected from the lead layer 126 to an external electrode pad which is not depicted (an undepicted electrode pad being connected to the outer conductor part 121 as well).

Since the thin-film coil 110 is helically wound about the upper magnetic pole layer 25 in the thin-film magnetic head 300, magnetic fluxes generated by the thin-film coil 110 can efficiently be used for recording. Therefore, as compared with a thin-film magnetic head having a planar spiral thin-film coil, the thin-film magnetic head 300 can decrease the number of turns of the thin-film coil, thereby reducing the yoke length. Also, as compared with the thin-film magnetic head having a planar spiral thin-film coil, the thin-film magnetic head 300 can reduce the area in which the thin-film coil 110 is arranged, and thus can attain a smaller size.

The thin-film coil 110 has insulating contact structures in which the inner conductor parts 111 to 115 constituting the first conductor group 116, and the outer conductor parts 121 to 125 constituting the second conductor group 120 are in contact with each other by way of respective insulating films (separation insulating films 15, 34). Therefore, only an insulating film is interposed between those adjacent each other in the inner conductor parts 111 to 115 and outer conductor parts 121 to 125, whereby the distance between the adjacent parts equals the thickness of their insulating film (separation insulating film 15, 34). As a consequence, the inner conductor parts 111 to 115 are arranged densely such that those adjacent each other hardly yield a gap therebetween, and the outer conductor parts 121 to 125 are arranged densely such that those adjacent each other hardly yield a gap therebetween. Hence, the yoke length can be reduced even when the path width in not narrowed so much in the inner and outer conductor parts. Also, since it is not necessary for the path width to be narrowed so much in the inner and outer conductor parts, current flows are less likely to be obstructed, whereby the ohmic value is restrained from rising.

Since the third magnetic pole part 10c constitutes a part of the connecting part 31 for magnetically connecting the upper magnetic pole layer 25 and lower magnetic pole layer 10 to each other, the length of the shortest distance between the third magnetic pole part 10c (the projection 32b thereof) and the air bearing surface 30, i.e., the shortest line 50, becomes the yoke length. Therefore, the yoke length is shorter in the thin-film magnetic head 300 since the first conductor group 116 and second conductor group 120 have the dense arrangements mentioned above.

The inner conductor parts 111, 115 positioned on both sides of the first conductor part group 116 are in contact with the third magnetic pole part 10c and second magnetic pole part 10b by way of the separation insulating film 15 alone, thus contributing to further reducing the yoke length.

In the thin-film coil 110, each of the first conductor group 116 and second conductor group 120 has a density changing structure. Therefore, even when the yoke length is reduced by narrowing the width W, the winding is secured on the shortest line 50, whereby the number of turns can be kept in the thin-film coil 110. As a consequence, the thin-film magnetic head 300 can reduce the yoke length while keeping the number of turns. This realizes a thin-film magnetic head having an excellent recording characteristic in a high frequency band. Also, since the parts having a density changing structure in the thin-film coil 110, i.e., joints 111c to 115c, 121c to 125c, are disposed in the close vicinity of the air bearing surface 30, magnetic fluxes generated from the thin-film coil 110 are efficiently used for recording.

The connecting parts for connecting the inner conductor parts 111 to 115 to the outer conductor parts 121 to 125 are disposed along the air bearing surface 30 on the outside of the upper magnetic pole layer 25. This reduces the distance from the air bearing surface 30 to each connecting part. Therefore, the thin-film magnetic head 300 decreases its size as a whole, and thus can be made smaller.

The inner conductor parts 111 to 115 and outer conductor parts 121 to 125 have variable width structures as mentioned above and thus are less likely to obstruct current flows, whereby the ohmic value can be restrained from rising. Therefore, the thin-film magnetic head 300 can effectively restrain heat from being generated by the thin-film coil 110. Since the third magnetic pole part 10c has the projection 32b, the inner conductor parts 111 to 115 and outer conductor parts 121 to 125 change their width in conformity to the projection 32b. Also, since each of the inner conductor parts 111 to 115 and outer conductor parts 121 to 125 has the narrowest part at a location corresponding to the projection 32b, the area in which the path width is narrowed is minimized. Therefore, currents can flow more easily, and the ohmic value can be restrained from increasing.

The separation insulating film 15 is constituted by a laminate of a plurality of thin alumina films formed by CVD, as will be explained later in detail, and thus is a dense film. Therefore, the second magnetic pole part 10b disposed on the shortest line 50 can reliably be insulated from each of the first conductor group 116 and third magnetic pole part 10c while being separated therefrom by a very small gap.

As will be explained later, materials having a high saturated magnetic flux density can be used as materials for the second magnetic pole part 10b, fourth magnetic pole part 10d, sixth magnetic pole part 10f, and upper magnetic pole layer 25, whereby magnetic fluxes can be prevented from being saturated in magnetic paths. As a result, magnetomotive forces generated in the thin-film coil 110 can efficiently be used for recording.

As disclosed in the above-mentioned Patent Document 1, for example, the following problems may occur in a thin-film magnetic head whose upper magnetic pole layer includes a magnetic pole part layer having a small width and a yoke part layer having a greater width connected to the upper face of the magnetic pole part layer in particular when the recording track width becomes smaller. First, in this kind of thin-film magnetic head, the cross-sectional area of the magnetic path drastically decreases in the connecting part between the magnetic pole part layer and yoke part layer, so that magnetic fluxes may be saturated in this part and fail to be transmitted sufficiently from the yoke part layer to the magnetic pole part layer. Therefore, overwrite characteristics may deteriorate in such a thin-film magnetic head.

Also, the thin-film magnetic head whose upper magnetic pole layer includes a magnetic pole part layer and a yoke part layer may generate so-called side writing in which a magnetic flux leaks from the yoke part layer to the recording medium, whereby the yoke part having a large width writes data into an area of the recording medium other than areas to record data, or so-called side erasing in which data is erased from an area from which no data should be erased. In either case, the effective track width becomes greater than a desirable track width. The positional relationship between the magnetic pole part layer and yoke part layer is determined by the alignment in photolithography, and thus may deviate from a desirable positional relationship. In this case, side writing and side erasing occur remarkably.

In the thin-film magnetic head 300, by contrast, the upper magnetic pole layer 25 defining the track width is a flat layer, whereby magnetic fluxes are not saturated in the connecting part between the magnetic pole part layer and the yoke part layer. Therefore, the above-mentioned side writing and side erasing do not occur in this embodiment.

Since the thin-film magnetic head 300 forms a flat upper magnetic pole layer 25 on a flat base, the track width defining part of the upper magnetic pole layer 25 can be formed finely with high precision. This can realize a track width of 0.2 μm or less, which has conventionally been considered difficult when mass-producing thin-film magnetic heads.

Method of Making Thin-Film Magnetic Head

Referring to FIGS. 5A, 5B to 22A, 22B together with FIGS. 1 to 4A, 4B mentioned above, a method of manufacturing a thin-film magnetic head having the structure mentioned above will now be explained.

FIGS. 5A to 22A (i.e., those suffixed with A) show sections, each taken along the line IV—IV of FIG. 2, corresponding to respective manufacturing steps. FIGS. 5B to 22B (i.e., those suffixed with B) show a cross section of opposing magnetic pole parts parallel to the air bearing surface 30.

Figure 5B:
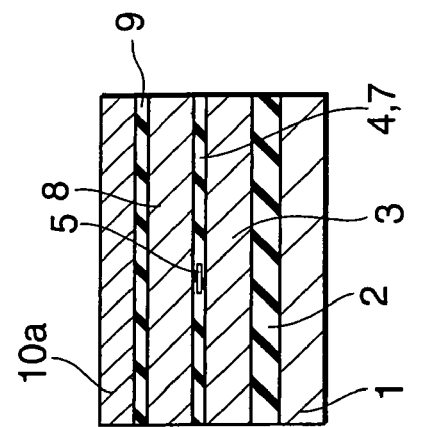
FIGS. 5A and 5B are sectional views showing a step in the process of manufacturing the thin-film magnetic head.
Figure 5A:
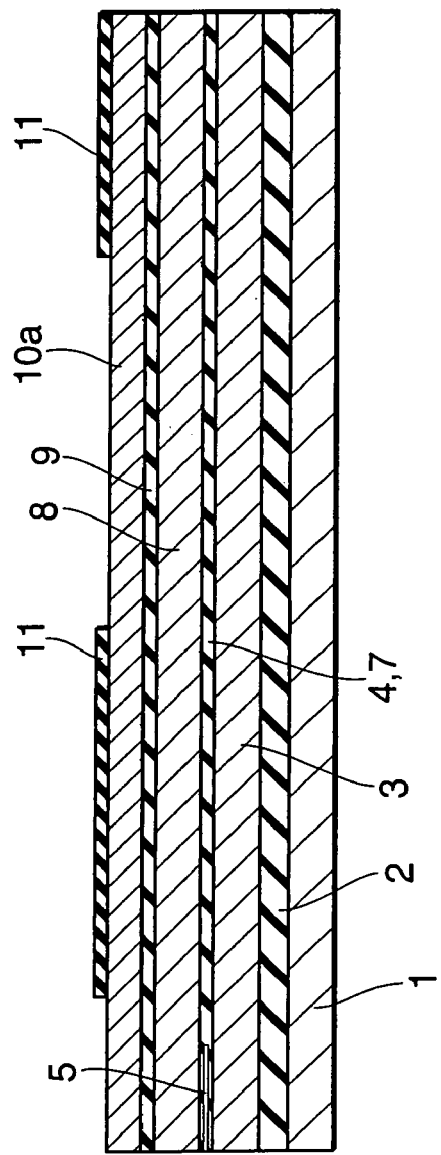

First, on a substrate 1 made of aluminum oxide titanium carbide ($Al_2O_3.TiC$), for example, an insulating layer 2 made of alumina ($Al_2O_3$), for example, is deposited by a thickness of about 2 to 5 μm in the method in accordance with this embodiment as shown in FIGS. 5A and 5B. Subsequently, on the insulating layer 2, a lower shield layer 3 for a reproducing head made of a magnetic material (e.g., permalloy) is deposited by a thickness of about 2 to 3 μm. For example, the lower shield layer 3 is selectively formed on the insulating layer 2 by plating while using a photoresist film as a mask. Then, though not depicted, an insulating layer made of alumina, for example, is formed on the whole surface by a thickness of about 3 to 4 μm, for example, and thus formed insulating layer is ground by chemical mechanical polishing (hereinafter referred to as "CMP"), for example, until the lower shield layer 3 is exposed, whereby the surface is flattened.

Subsequently, on the lower shield layer 3, a lower shield gap film 4 as an insulating film is formed by a thickness of about 20 to 40 nm. Then, on the lower shield gap film 4, an MR device 5 is formed by a thickness of several ten nanometers. For example, the MR device 5 is formed by selectively etching an MR film formed by sputtering. The MR device 5 is disposed near a position where an air bearing surface 30 is to be formed. For the MR device 5, devices using magnetosensitive films exhibiting magnetoresistive effects such as AMR, GMR, and TMR (tunneling magnetoresistive) devices can be employed. Next, though not depicted, a pair of electrode layers electrically connected to the MR device 5 are formed by a thickness of several ten nanometers on the lower shield gap film 4. Further, an upper shield gap film 7 as an insulating film is formed by a thickness of about 20 to 40 nm, for example, on the lower shield gap film 4 and MR device 5, so as to bury the MR device 5 between the lower shield gap film 4 and the upper shield gap film 7 (the boundary between the lower shield gap film 4 and the upper shield gap film 7 being undepicted for convenience of illustration). Examples of the insulating material used for the lower shield gap film 4 and upper shield gap film 7 include alumina, aluminum nitride, and diamond-like carbon (DLC). The lower shield gap film 4 and upper shield gap film 7 may be formed by either sputtering or chemical vapor deposition (hereinafter referred to as "CVD").

Subsequently, on the upper shield gap film 7, an upper shield layer 8 made of a magnetic material for a reproducing head is selectively formed by a thickness of about 1.0 to 1.5 μm. Then, on the whole upper face of the laminate obtained by the foregoing process, an insulating layer 9 made of alumina, for example, is formed by a thickness of about 0.3 μm, for example. Further, on the insulating layer 9, a first magnetic pole part 10a constituting a lower magnetic pole layer 10 is formed by a thickness of 0.6 μm, for example, as a first magnetic pole layer in the present invention.

In this case, the first magnetic pole part 10a is formed by sputtering while using a material having a high saturated magnetic flux density such as FeAlN, FeN, FeCo, CoFeN, and FeZrN. The first magnetic pole part 10a may also be made by plating while using NiFe composed of 80 wt % of Ni and 20 wt % of Fe, NiFe composed of 45 wt % of Ni and 55 wt % of Fe which is a material having a high saturated magnetic flux density, or the like. By way of example, a case where the first magnetic pole part 10a is formed by sputtering while using CoFeN having a saturated magnetic flux density of 2.4 T is assumed here.

Subsequently, on the first magnetic pole part 10a, an insulating film 11 made of alumina, for example, is formed by a thickness of 0.2 µm, for example. Then, the insulating film 11 is selectively etched, so as to form the insulating film 11 with an opening at a position where the second magnetic pole part 10b and third magnetic pole part 10c are to be formed.

Then, though not depicted, an electrode film made of an electrically conductive material is formed by a thickness of about 50 to 80 nm by sputtering so as to cover the first magnetic pole part 10a and insulating film 11. This electrode film functions as an electrode and seed layer at the time of plating.

Further, though not depicted, a frame is formed on the electrode film by photolithography. This frame is formed in order for first inner conductor parts 112, 114 constituting the thin-film coil 110 to be provided by frame plating.

Subsequently, as shown in FIGS. 6A and 6B, electroplating is carried out by using the electrode film, so as to form a plated layer made of Cu (copper), for example. Thus plated layer and the undepicted electrode film thereunder construct the first inner conductor parts 112, 114. The thickness of each of the first inner conductor parts 112, 114 is 3.0 to 3.5 µm, for example. Each rectangular end part (a rectangular end part 114b being depicted) is formed together with the plated layer. After the frame is removed, the electrode film is etched away by ion beam etching, for example, except for its part under the first inner conductor parts 112, 114 (including their rectangular end parts).

Then, though not depicted, a frame is formed on the first magnetic pole part 10a and insulating film 11 by photolithography. This frame is formed in order to provide the second magnetic pole part 10b and third magnetic pole part 10c by frame plating.

Subsequently, as shown in FIGS. 7A and 7B, electroplating is effected so as to form the second magnetic pole part 10b as well as the third magnetic pole part 10c disposed at a position defining the yoke length each by a thickness of 3.3 to 3.8 µm, for example, as the second magnetic pole layer of the present invention by using a magnetic material. An example of the material used for the second magnetic pole part 10b and third magnetic pole part 10c is one having a high saturated magnetic flux density. For example, CoNiFe having a saturated magnetic flux density of 2.1 T and $FeCo_x$ having a saturated magnetic flux density of 2.3 T can be used. In this embodiment, when forming the second magnetic pole part 10b and third magnetic pole part 10c by electroplating, the unpatterned first magnetic pole part 10a is used as the electrode and seed layer for plating without providing specific electrode films.

Further, as shown in FIGS. 8A and 8B, a photoresist 12 is formed so as to cover the first inner conductor parts 112, 114, second magnetic pole part 10b, and third magnetic pole part 10c. Subsequently, while using the photoresist 12 as a mask, the first magnetic pole part 10a is selectively etched, for example, by ion beam etching, so as to pattern the first magnetic pole part 10a.

As shown in FIGS. 9A and 9B, after removing the photoresist 12, a protective photoresist 13 for the first inner conductor parts 112, 114 is disposed at a position where second inner conductor parts 111, 113, 115 are to be provided. The protective photoresist 13 is formed so as to fill at least the space between the second magnetic pole part 10b and the inner conductor part 112, the space between the inner conductor parts 112 and 114, and the space between the inner conductor part 114 and the third magnetic pole part 10c. Further, an insulating layer 14 made of alumina, for example, is formed by a thickness of 4 to 6 µm so as to cover the whole upper face of thus obtained laminate. Then, the insulating layer 14 is ground by CMP, for example, until the protective photoresist 13 is exposed.

Figures 10A, 10B:
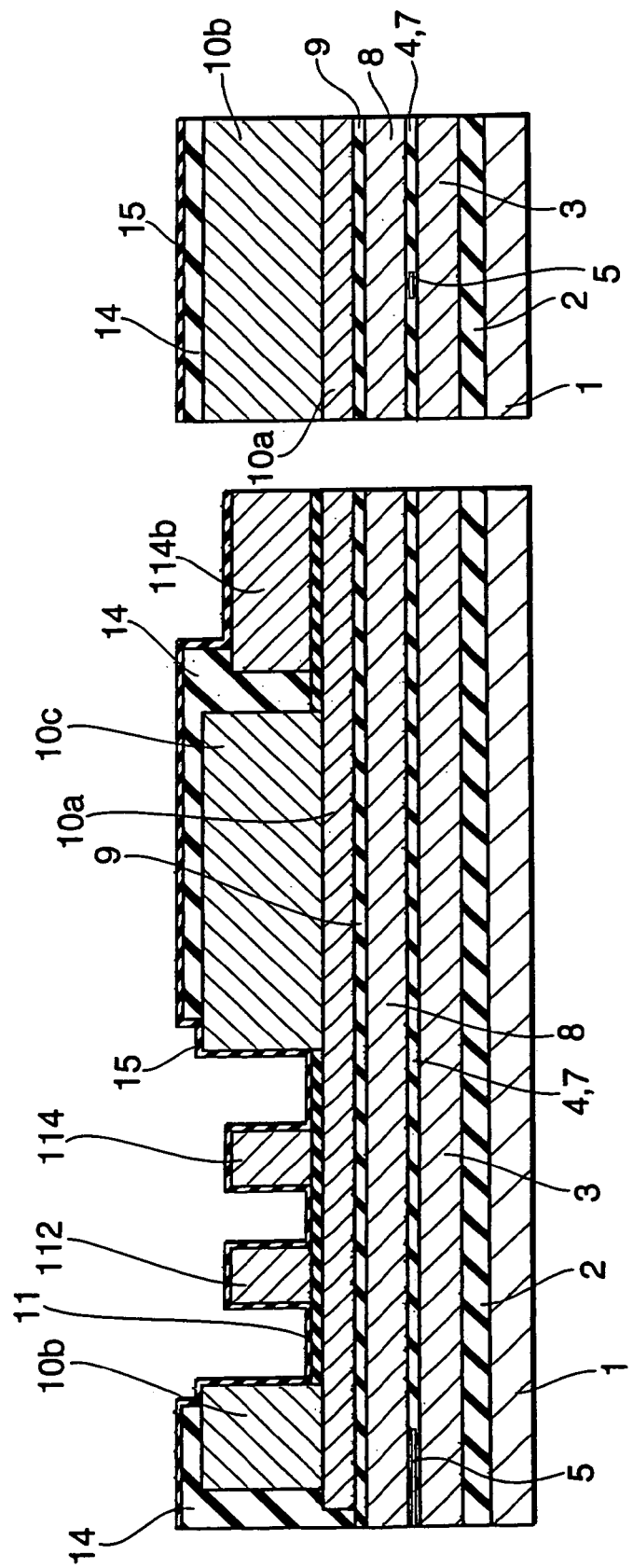
FIGS. 10A and 10B are sectional views showing a step subsequent to the step shown in FIGS. 9A and 9B.

Subsequently, as shown in FIGS. 10A and 10B, the photoresist 13 is removed. Then, a separation insulating film 15 made of alumina, for example, for separating the inner conductor parts from each other is formed by CVD, for example, so as to cover the whole upper face of the laminate. This forms a plurality of inner grooves each covered with the separation insulating film 15 between the second magnetic pole part 10b and the inner conductor part 112, between the inner conductor parts 112 and 114, and between the inner conductor part 114 and the third magnetic pole part 10c, respectively. The thickness of the separation insulating film 15 is not greater than that of the insulating film 11. Therefore, the thickness of the separation insulating film 15 is preferably 0.2 µm or less, within the range of 0.08 to 0.15 µm in particular. The separation insulating film 15 may be a film formed by CVD in which $H_2O$, $N_2$, $N_2O$, or $H_2O_2$ as a material used for forming a thin film and $Al(CH_3)_3$ or $AlCl_3$ as a material used for forming a thin film are intermittently emitted in an alternating fashion under the decreased pressure and at a temperature of 100° C., for example. This forming process laminates a plurality of thin alumina films, thus yielding the separation insulating film 15 with a desirable thickness, which can reliably insulate the inner conductor parts from each other while narrowing the gaps therebetween.

The order of forming the protective photoresist 13, insulating layer 14, and separation insulating film 15 may be changed as in the following. Namely, after patterning the first magnetic pole part 10a and removing the photoresist 12, the separation insulating film 15 is formed so as to cover the whole upper face of the laminate. Subsequently, the protective photoresist 13 and the insulating layer 14 are successively formed, the insulating layer 14 is ground until the protective photoresist 13 is exposed, and then the protective photoresist 13 is removed. In this case, the separation insulating film 15 is formed before grinding the insulating layer 14, whereby the insulating layer 14 is ground while in a state where the first inner conductor parts 112, 114 are reinforced with the separation insulating film 15. This can prevent the first inner conductor parts 112, 114 from being damaged and destroyed when grinding the insulating layer 14.

Next, as shown in FIGS. 11A and 11B, the second inner conductor parts 111, 113, 115 are formed in the following manner in the respective inner grooves covered with the separation insulating film 15.

Initially, a first electrically conductive film made of Cu constituting the electrode film 16 is formed by a thickness of 30 to 50 nm, for example, by sputtering so as to cover the whole upper face of the laminate. Subsequently, on the first electrically conductive film, a second electrically conductive film made of Cu similarly constituting the electrode film 16 is formed by a thickness of 50 to 80 nm, for example, by CVD. The forming of the second electrically conductive film does not intend to bury each inner groove, i.e., each of the inner grooves between the second magnetic pole part 10b and the inner conductor part 112, between the inner conductor parts 112 and 114, and between the inner conductor part 114 and the third magnetic pole part 10c, as a whole, but to cover the inner grooves while taking advantage of favorable step coverage in CVD. The first and second electrically conductive films constitute the electrode film 16. The electrode film 16 functions as an electrode and seed layer in plating which will be carried out later.

Subsequently, on the electrode film 16, an electrically conductive layer 17 made of Cu, for example, is formed by a thickness of 4 to 5 μm by plating. The electrode film 16 and electrically conductive layer 17 are formed so as to provide the second inner conductor parts 111, 113, 115. Thus, in this embodiment, the second electrically conductive film made of Cu is formed by CVD, and the electrically conductive layer 17 made of Cu is formed on the second electrically conductive film by plating. As a consequence, the electrically conductive layer 17 is reliably buried in the inner grooves, i.e., between the second magnetic pole part 10b and the first inner conductor part 112, between the first inner conductor parts 112 and 114, and between the first inner conductor part 114 and the third magnetic pole part 10c.

Then, as shown in FIGS. 12A and 12B, the electrically conductive layer 17 is ground by CMP, for example, until the second magnetic pole part 10b, third magnetic pole part 10c, and first inner conductor parts 112, 114 are exposed. This grinding forms the second inner conductor parts 111, 113, 115 by the electrically conductive layer 17 and electrode film 16 remaining in the inner grooves, i.e., between the second magnetic pole part 10b and the first inner conductor part 112, between the first inner conductor parts 112 and 114, and between the first inner conductor part 114 and the third magnetic pole part 10c. Thus obtained second inner conductor parts 111, 113, 115 and the above-mentioned first inner conductor parts 112, 114 form the first conductor group 116. The resulting second inner conductor parts 111, 113, 115 are formed so as to be buried in the respective inner grooves, and thus are disposed adjacent the first inner conductor parts 112, 114. Only the separation insulating film 15 exists between the second inner conductor parts 111, 113, 115 and their adjacent first inner conductor parts 112, 114. Therefore, the first inner conductor parts 112, 114 and the second inner conductor parts 111, 113, 115 form respective insulating contact structures.

Subsequently, as shown in FIGS. 13A and 13B, an insulating film 19 made of alumina, for example, is formed by a thickness of 0.2 μm, for example, so as to cover the whole upper face of the laminate. Then, in the insulating film 19, the parts corresponding to the second magnetic pole part 10b, third magnetic pole part 10c, and rectangular end parts of the inner conductor parts 111 to 115 are selectively etched.

Next, on the second magnetic pole part 10b and third magnetic pole part 10c exposed by etching, a fourth magnetic pole part 10d and a fifth magnetic pole part 11e, which constitute the second magnetic pole layer in the present invention, are formed by frame plating, for example. On the rectangular end parts of the inner conductor parts 111 to 115, respective first connecting part layers constituting a lower connecting layer in the present invention are formed. Among the first connecting part layers, the connecting part layer 18a formed on the rectangular end part 114b of the inner conductor part 114 is shown in FIG. 13A. Usable as a material for the fourth magnetic pole part 10d, fifth magnetic pole part 10e, and first connecting part layer is one having a high saturated magnetic flux density, e.g., CoNiFe having a saturated magnetic flux density of 2.1 T and $FeCo_x$ having a saturated magnetic flux density of 2.3 T.

Next, for example, an insulating layer 20 made of alumina is formed by a thickness of 2 to 3 μm so as to cover the whole upper face of the laminate. Subsequently, the insulating layer 20 is ground by CMP, for example, until the fourth magnetic pole part 10d, fifth magnetic pole 10e, and first connecting part layer are exposed.

Further, as shown in FIGS. 14A and 14B, a magnetic layer 21 is formed by a thickness of 0.7 to 1.0 μm by sputtering so as to cover the whole upper face of the laminate. As a material for the magnetic layer 21, one having a high saturated magnetic flux density is used, for example. For instance, CoFeN having a saturated magnetic flux density of 2.4 T can be used.

Then, on the magnetic layer 21, etching masks 22a, 22b are formed at respective locations corresponding to the fourth magnetic pole part 10d and fifth magnetic pole part 10e, and a plurality of etching masks are also formed at respective locations corresponding to a plurality of first connecting part layers. Among a plurality of etching masks corresponding to the first connecting part layers, the etching mask 22c corresponding to the connecting part layer 18a is shown in FIG. 14A. As a material for the etching mask, a metal material can be used, for example. The etching masks may be formed by plating, frame plating in particular. A magnetic material different from that constituting the magnetic layer 21 may be used for the etching masks. As this magnetic material, NiFe or CoNiFe can be used. The thickness of each etching mask is about 1 to 2 μm, for example.

Subsequently, as shown in FIGS. 15A and 15B, ion beam etching or reactive ion etching (hereinafter referred to as "RIE") using a halogen type gas such as $Cl_2$ is carried out while using the etching masks, so as to etch the magnetic layer 21. Then, the parts of magnetic layer 21 left under the etching masks form a sixth magnetic pole part 10f and a seventh magnetic pole part 10g which constitute a third magnetic pole layer in the present invention, and a plurality of second connecting part layers. Thus obtained sixth magnetic pole part 10f and seventh magnetic pole part 10g and the above-mentioned first magnetic pole part 10a, second magnetic pole part 10b, third magnetic pole part 10c, fourth magnetic pole part 10d, and fifth magnetic pole part 10e form a first magnetic pole group in the present invention.

Second connecting part layers, which constitute a lower connecting layer in the present invention, are disposed on the first connecting part layers. Among the second connecting part layers, the second connecting part layer 18b arranged on the first connecting part layer 18a is shown in FIG. 15A.

Further, an insulating layer 23 made of alumina, for example, is formed by a thickness of 2 to 3 μm so as to cover the whole upper face of the laminate, and then is ground by CMP, for example. This grinding removes the etching masks 22a, 22b, 22c (including a plurality of etching masks corresponding to the other first connecting part layers), and flattens the surfaces of the sixth magnetic pole part 10f, seventh magnetic pole part 10g, second connecting part layer, and insulating layer 23, whereby the insulating layer 23 is disposed at a position free of the sixth magnetic pole part 10f, seventh magnetic pole part 10g, and second connecting part layer. The grinding is effected until the sixth magnetic pole part 10f attains a thickness of 0.5 to 0.7 μm.

Here, an inner end part of the sixth magnetic pole part 10f separated from the air bearing surface 30 provides a throat height of the recording head. The throat height refers to the distance (height) h from an end part on the air bearing surface 30 side to the opposite (inner side) end part in parts where two magnetic pole layers oppose each other by way of a recording gap layer, i.e., in opposing magnetic pole parts.

Subsequently, a coating for forming a recording gap layer 24 is formed so as to cover the whole upper face of the laminate. Usable as a material for the coating is an insulating material such as alumina, or nonmagnetic metal material such as Ru, NiCu, Ta, W, Cr, $Al_2O_3$, and $Si_2O_3$. Assumed here is a case using Ru. In the coating, the parts disposed on the seventh magnetic pole part 10g and a plurality of second connecting part layers are selectively etched, so as to provide the recording gap layer 24.

Further, a magnetic layer 41 made of a magnetic material for forming a first magnetic pole part 25a is formed by sputtering, for example, so as to cover the whole upper face of the laminate. Usable as a material for the magnetic layer 41 is one having a high saturated magnetic flux density material, for example. For instance, CoFeN having a saturated magnetic flux density of 2.4 T can be used for the magnetic layer 41.

Subsequently, the whole upper face of the laminate is coated with a photoresist 42, and then patterning is carried out so as to leave the photoresist 42 at only a predetermined area. Using thus left photoresist 42 as a mask, the magnetic layer 41, recording gap layer 24, sixth magnetic pole part 10f, and insulating layer 23 are etched in the part not covered with the photoresist 42. The part of magnetic layer 41 left after etching will later form the first magnetic pole part 25a.

Further, as shown in FIGS. 16A and 16B, an insulating film 43 made of alumina is formed so as to cover the whole upper face of the laminate.

Figure 17A:
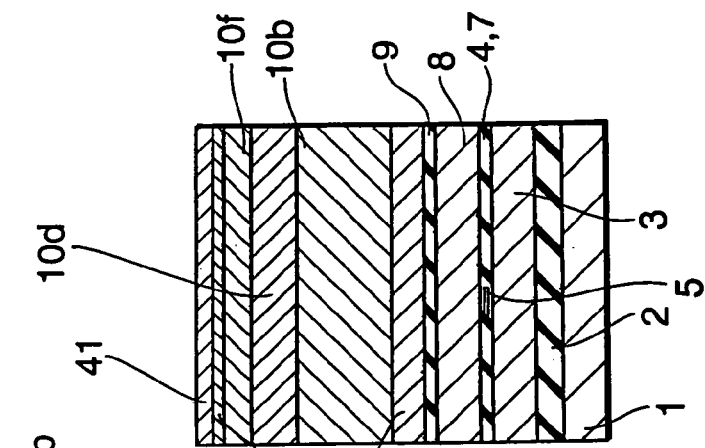
FIGS. 17A and 17B are sectional views showing a step subsequent to the step shown in FIGS. 16A and 16B.
Figure 17B:
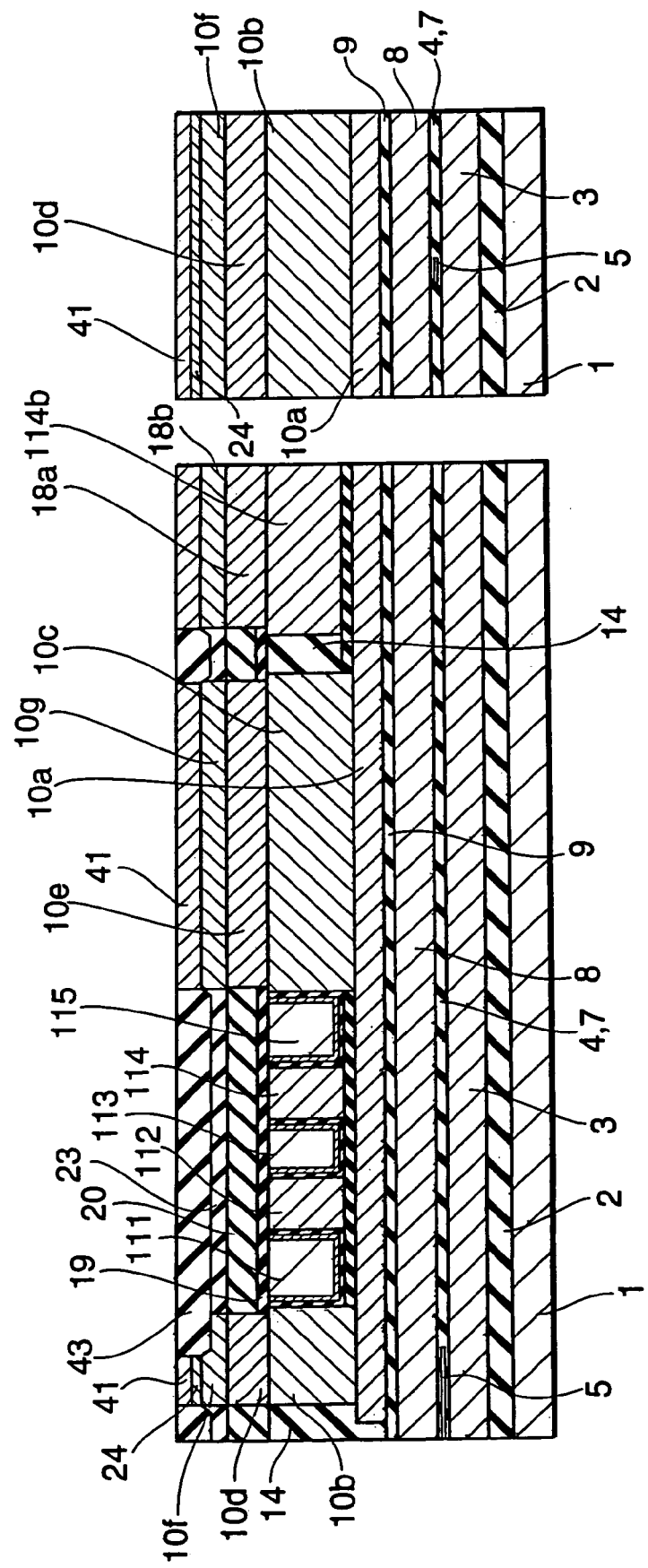

Then, as shown in FIGS. 17A and 17B, liftoff is carried out so as to remove the photoresist 42 together with the insulating film 43. Subsequently, the surface is ground by CMP as appropriate.

Further, as shown in FIGS. 18A and 18B, a magnetic layer 44 made of a magnetic material for forming the first magnetic pole part 25a is formed by sputtering, for example, so as to cover the whole upper face of the laminate. Preferably, the magnetic layer 44 is formed from a material having a high saturated magnetic flux density, e.g., CoFeN having a saturated magnetic flux density of 2.4 T. Subsequently, on the magnetic layer 44, a second magnetic pole part 25b is formed by frame plating, for example Preferably, the second magnetic pole part 25b is also formed from a material having a high saturated magnetic flux density, e.g., CoNiFe having a saturated magnetic flux density of 2.3 T. The second magnetic pole part 25b is disposed so as to extend from a position corresponding to the sixth magnetic pole part 10f to a position corresponding to the seventh magnetic pole part 10g.

Next, while using the second magnetic pole part 25b as an etching mask, the magnetic layer 44 is etched by ion beam etching or RIE employing a halogen type gas such as $Cl_2$ at a temperature of 200° C. to 250° C. As a consequence, the part of magnetic layer 44 covered with the second magnetic pole part 25b and left after etching forms the first magnetic pole part 25a. As such, the second magnetic pole part 25b and first magnetic pole part 25a form the upper magnetic pole layer 25 on the lower magnetic pole layer 10.

Subsequently, though not depicted, a photoresist mask which opens about the track width defining part 25A (see FIG. 1) is formed. Then, while using this photoresist mask and the upper magnetic pole layer 25 as a mask, a part of the recording gap layer 24 and sixth magnetic pole part 10f surrounding the track width defining part 25A is etched by ion beam etching or RIE, for example. This step yields a trim structure as shown in FIG. 18B.

Next, an insulating film 26 made of alumina is formed by a thickness of 0.2 to 0.5 μm, for example, so as to cover the whole upper face of the laminate. Subsequently, in the insulating film 26, parts existing on a plurality of second connecting part layers are selectively etched. Further, on each second connecting part layer, a third connecting part layer is formed by a thickness of 1 to 2.5 μm, for example, as an upper connecting layer in the present invention by frame plating. Placing the third connecting part layers on the second connecting part layers forms a connecting part group 130. As a material for the third connecting part layers, Cu can be used, for example. Among a plurality of third connecting part layers, the third connecting part layer 18c disposed on the second connecting part layer 18b is shown in FIG. 18A.

Figures 19A, 19B:
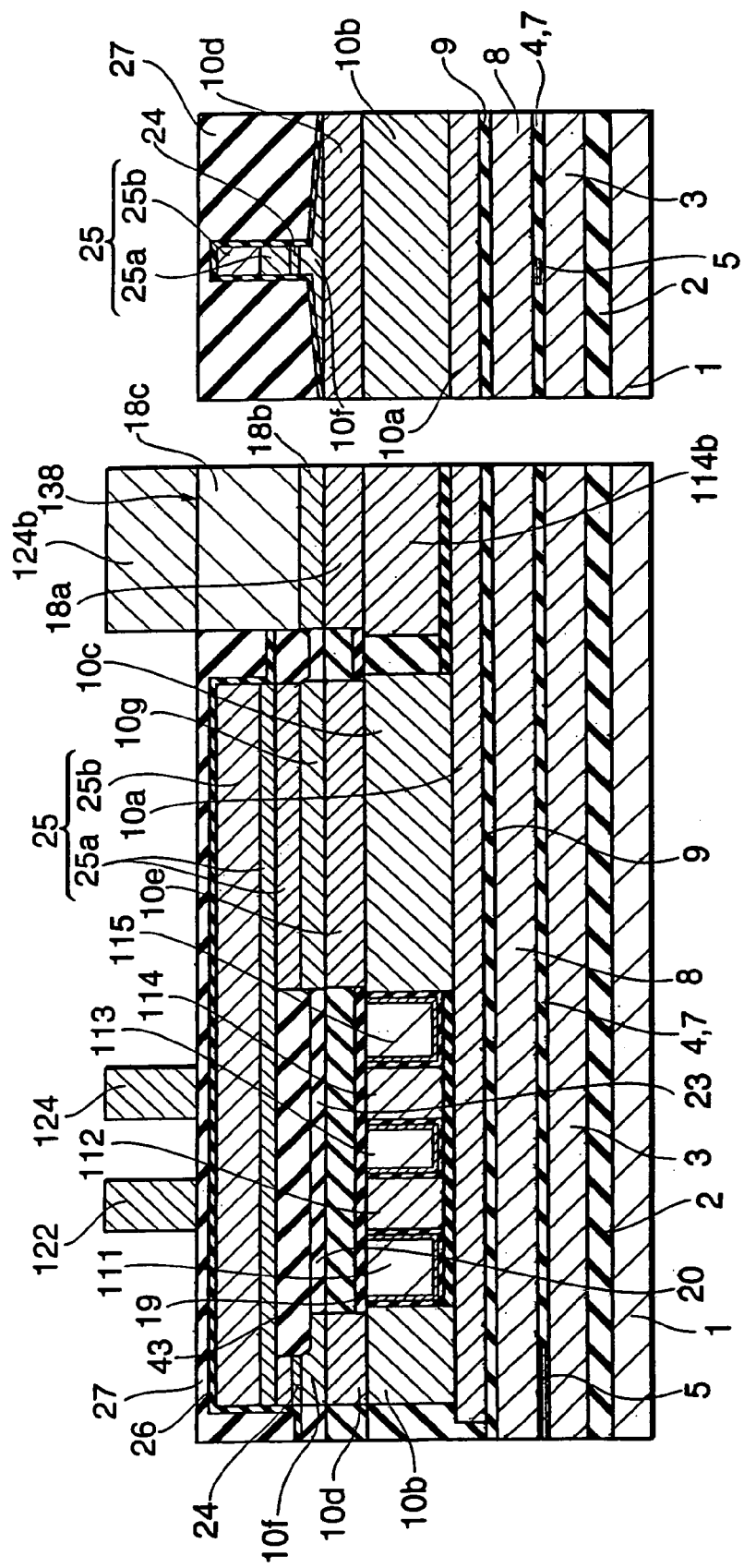
FIGS. 19A and 19B are sectional views showing a step subsequent to the step shown in FIGS. 18A and 18B.

Then, as shown in FIGS. 19A and 19B, an insulating film 27 made of alumina, for example, is formed by a thickness of 2 to 3 μm so as to cover the whole upper face of the laminate. Subsequently, the insulating film 27 is ground by CMP, for example, so as to expose a plurality of third connecting part layers (the third connecting part layer 18c in FIG. 19). The first to third connecting part layers 18a, 18b, 18c constitute connecting parts for connecting inner and outer conductor parts to each other. FIG. 19A illustrates a connecting part 138 for connecting the inner conductor part 114 and an outer conductor part 125 which will be formed later.

Subsequently, in order to form the first outer conductor parts 122, 124 on the second magnetic pole group by way of the insulating films 26, 27, a frame is formed by lithography. Then, while using an electrode film, electroplating is carried out, so as to form a plated layer made of Cu, for example. Thus plated layer and an undepicted electrode film thereunder constitute the first outer conductor parts 122, 124. The plated layer is formed together with rectangular end parts (among which the rectangular end part 124b is depicted). After the frame is eliminated, the electrode film is removed by ion beam etching, for example, except for its parts under the first outer conductor parts 122, 124 (including their rectangular end parts).

Next, as shown in FIGS. 20A and 20B, a photoresist 32 is formed so as to cover the first outer conductor parts 122, 124. Then, while using this photoresist 32 as a mask, an insulating part 33 made of alumina, for example, to be placed at a position determining the yoke length is formed so as to cover the whole upper face of the laminate. Subsequently, the insulating part 33 is ground by CMP, for example. Though covered with the insulating part 33 in FIG. 20A, the rectangular end part 124b may be exposed when grinding the insulating part 33.

Thereafter, as shown in FIGS. 21A and 21B, the photoresist 32 is removed, and then a separation insulating film 34 made of alumina, for example, for separating the outer conductor parts from each other is formed so as to cover the whole upper face of the laminate. This forms a plurality of outer grooves covered with the separation insulating film 34 between the insulating part 33 and outer conductor part 122, between the outer conductor parts 122 and 124, and between the outer conductor part 124 and the insulating part 33.

Subsequently, in the following manner, second outer conductor parts 121, 123, 125 are formed in the outer grooves covered with the separation insulating film 34.

First, a third electrically conductive film made of Cu constituting an electrode film 36 is formed by sputtering so as to cover the whole upper face of the laminate. Subsequently, a fourth electrically conductive film made of Cu similarly constituting the electrode film 36 is formed on the third electrically conductive film by CVD. The forming of the fourth electrically conductive film does not intend to bury each outer groove, i.e., each of the outer grooves between the insulating part 33 and the outer conductor part 122, between the outer conductor parts 122 and 124, and between the outer conductor part 124 and the insulating part 33, as a whole, but to cover the outer grooves while taking advantage of favorable step coverage in CVD. The third and fourth electrically conductive films constitute the electrode film 36. The electrode film 36 functions as an electrode and seed layer in plating.

Next, on the electrode film 36, an electrically conductive layer 37 made of Cu, for example, is formed by plating. The electrode film 36 and electrically conductive layer 37 are formed for providing second outer conductor parts 121, 123, 125. As such, in this embodiment, a fourth electrically conductive film made of Cu is formed by CVD not only for the inner conductor parts but also for the outer conductor parts, and the electrically conductive layer 37 made of Cu is formed on the fourth electrically conductive film by plating. Hence, the electrically conductive layer 37 is reliably buried in each of the outer grooves, i.e., between the insulating part 33 and the outer conductor part 122, between the outer conductor parts 122 and 124, and between the outer conductor part 124 and the insulating part 33. When burying the electrically conductive layer 37, a lead layer 126 is also formed from the same material as that of the second outer conductor parts 121 to 125 by the same procedure.

Subsequently, as shown in FIGS. 22A and 22B, the electrically conductive layer 37 is ground by CMP, for example, until the separation insulating film 34 and the outer conductor parts 122, 124 are exposed. As a result of the grinding, the electrically conductive layer 37 and electrode film 36 left between the insulating part 33 and outer conductor part 122, between the outer conductor parts 122 and 124, and between the outer conductor part 124 and the insulating part 33 form second outer conductor parts 121, 123, 125. Thus obtained second outer conductor parts 121, 123, 125 and the above-mentioned first outer conductor parts 122, 124 form a second conductor group 120. The resulting second outer conductor parts 121, 123, 125 are buried in the respective outer grooves and thus neighbor the first outer conductor parts 122, 124. Only the separation insulating film 34 is interposed between the second outer conductor parts 121, 123, 125 and their neighboring first outer conductor parts 122, 124. Hence, the first outer conductor parts 122, 124 and the second outer conductor parts 121, 123, 125 form respective insulating contact structures.

Then, as shown in FIGS. 4A and 4B, an overcoat layer 29 made of alumina, for example, is formed by a thickness of 20 to 40 μm so as to cover the whole upper face of the laminate. Subsequently, an undepicted electrode pad is formed. Finally, the slider including the layers mentioned above is ground, so as to form an air bearing surface 30. As a consequence of the foregoing process, the first conductor group 116, second conductor group 120, and connecting part layer group 130 form the thin-film coil 110, thereby yielding the thin-film magnetic head 300.

Thus obtained thin-film magnetic head 300 has the configuration mentioned above, thereby yielding favorable recording characteristics in a high frequency band without raising the ohmic value. In the above-mentioned manufacturing process, a plurality of grooves covered with a separation insulating film are provided between the first inner and outer conductor parts, and the second inner and outer conductor parts are disposed in the respective grooves, so as to yield the thin-film coil 110. Since the first inner and outer conductor parts formed earlier function as a frame for the second inner and outer conductor parts to be formed later, gaps between the conductor parts are not influenced by the frame provided in the process of making. Therefore, even when the conductor parts to be formed earlier are made by frame plating, gaps between the conductor parts can be minimized by an insulating contact structure.

In the following, first to fourth modified examples in the above-mentioned structure of the thin-film magnetic head 300 will be explained.

FIRST MODIFIED EXAMPLE

Figure 23:
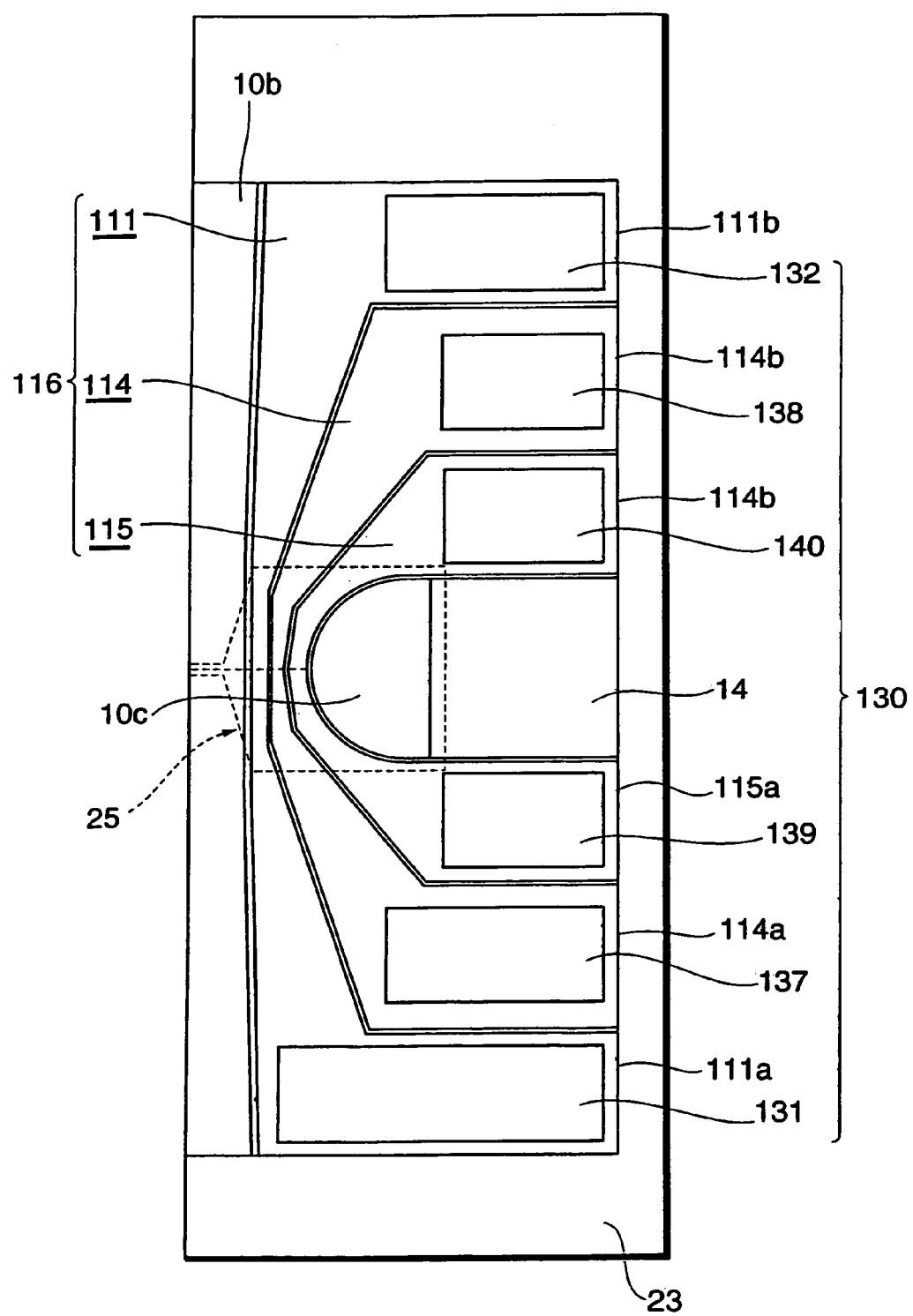
FIG. 23 is a plan view showing the first conductor group and connecting part group constituting the thin-film magnetic head in a first modified example.

The thin-film magnetic head 300 in accordance with the first modified example is the same as that of the first embodiment except for the configuration of the thin-film coil, which will be explained in the following while omitting or simplifying explanations for their common points. FIG. 23 is a plan view showing a first conductor group 116 and connecting parts in the thin-film coil in the first modified example, whereas FIG. 24 is a plan view showing a second conductor group 120 thereof.

Figure 24:
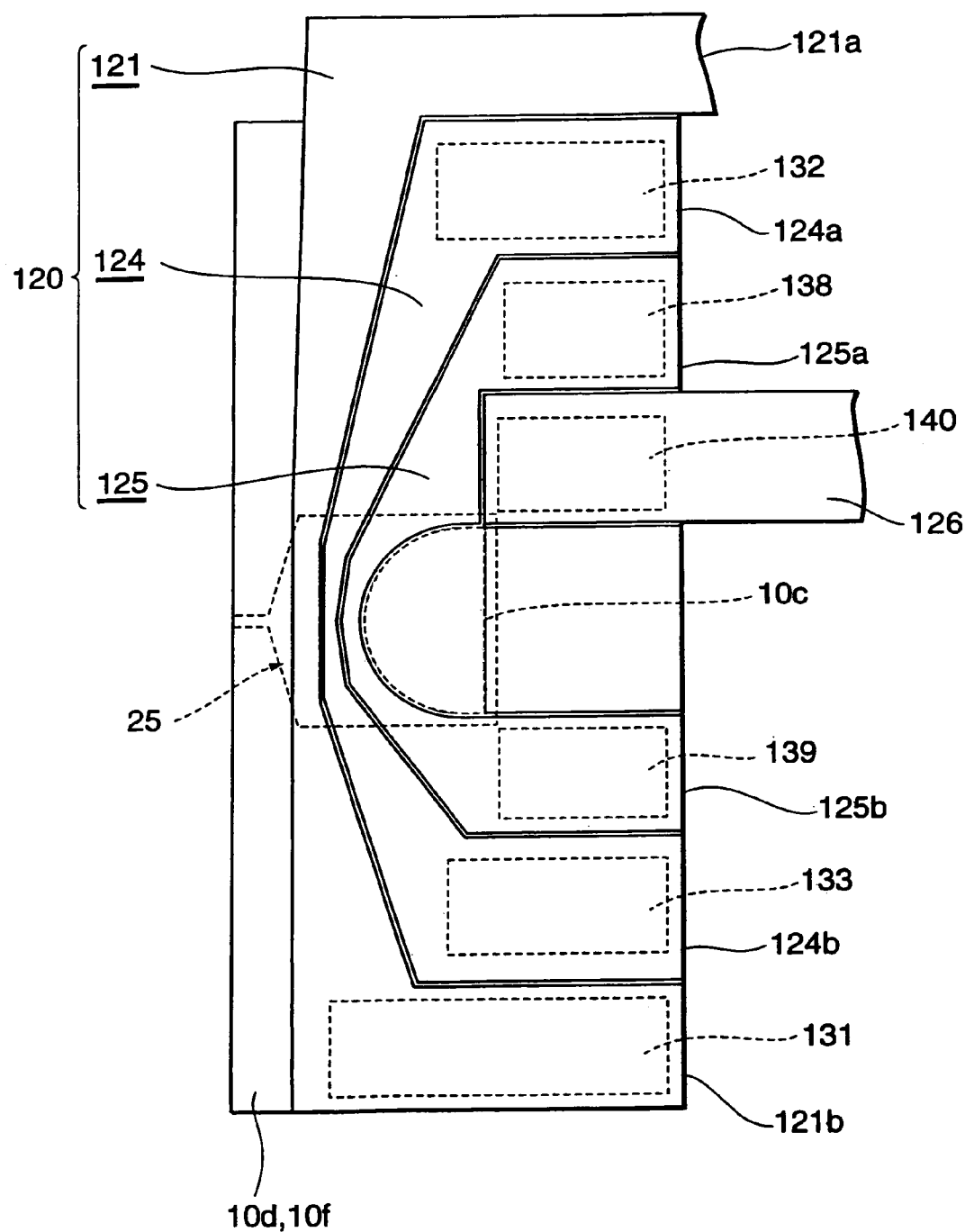
FIG. 24 is a plan view showing the second conductor group in the first modified example.

As shown in FIGS. 23 and 24, the thin-film coil in the first modified example comprises the first conductor group 116, second conductor group 120, and connecting part group 130, while forming a series of 3-turn loops unlike the thin-film coil 110 mentioned above. Namely, the first conductor group 116 comprises a plurality of inner conductor parts 111, 114, 115; the second conductor group 120 comprises a plurality of outer conductor parts 121, 124, 125; and the connecting part group 130 comprises a plurality of connecting parts 131, 137, 139, 132, 138, 140; whereby the thin-film coil forms 3-turn helical loops in total. The other points are the same as those of the above-mentioned thin-film coil 110, and thus will not be explained in detail. Each of the first conductor group 116 and second conductor group 120 has an insulating contact structure in this thin-film coil as in the above-mentioned thin-film coil 110, whereby the conductor parts are arranged close to each other with a high density. Therefore, the thin-film magnetic head 300 comprising the thin-film coil in accordance with the first modified example can also make the yoke length shorter.

SECOND MODIFIED EXAMPLE

Figure 25:
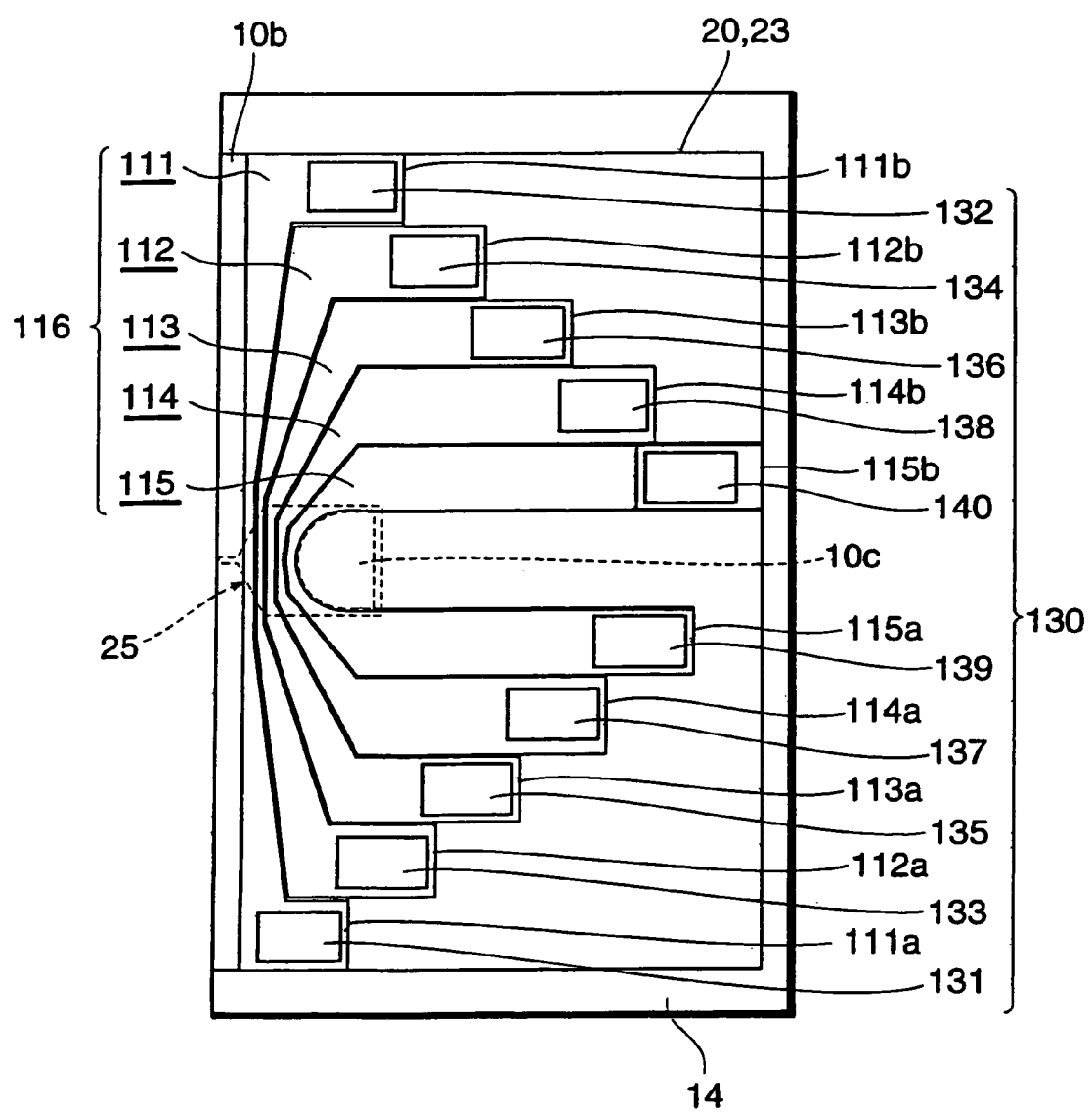
FIG. 25 is a plan view showing the first conductor group and connecting part group constituting the thin-film magnetic head in a second modified example.

The thin-film magnetic head 300 in accordance with the second modified example is also the same as that of the first embodiment except for the configuration of the thin-film coil, which will be explained in the following while omitting or simplifying explanations for their common points. FIG. 25 is a plan view showing a first conductor group 116 and connecting parts in the thin-film coil in the second modified example, whereas FIG. 26 is a plan view showing a second conductor group 120 thereof.

Figure 26:
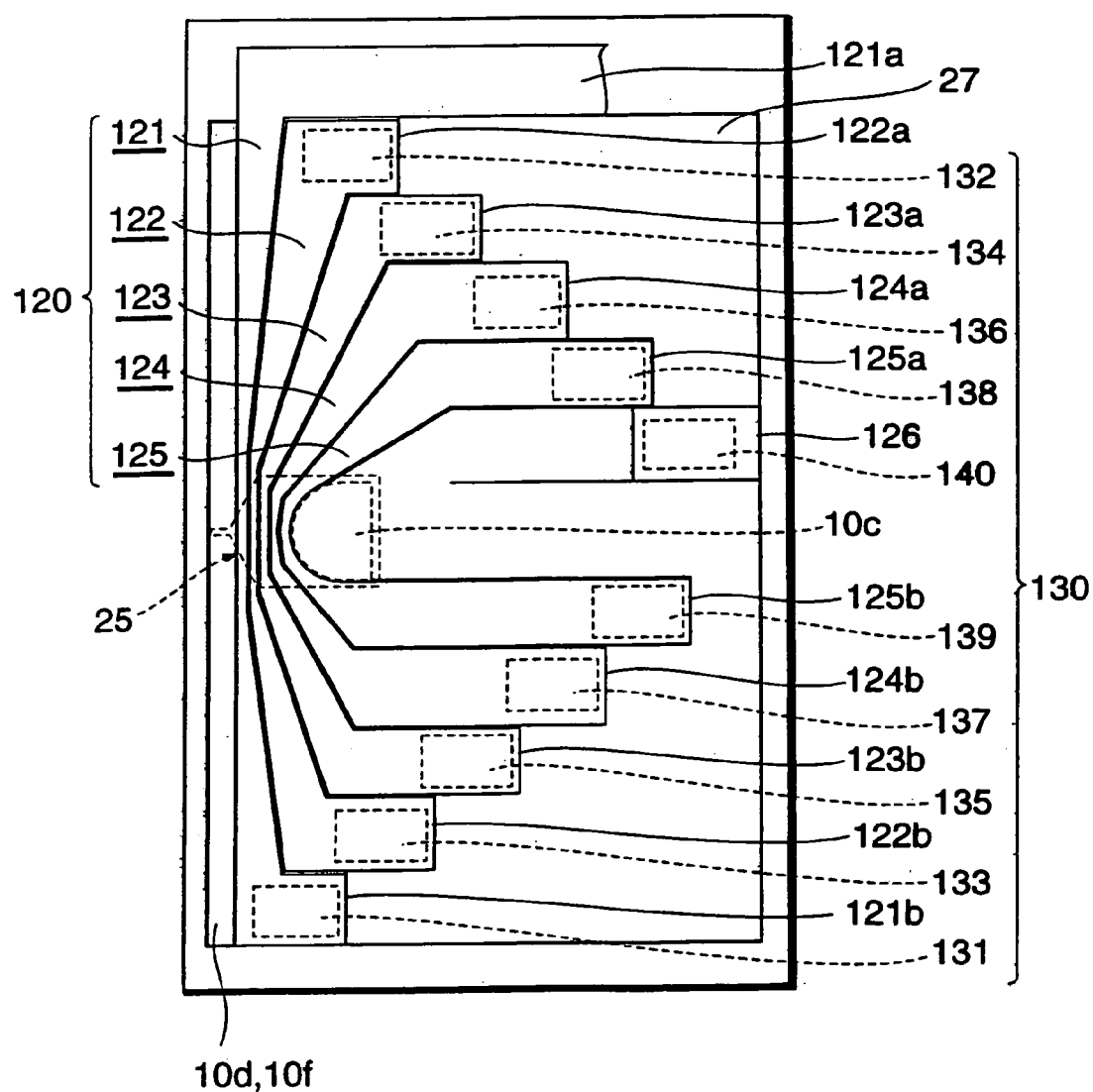
FIG. 26 is a plan view showing the second conductor group in the second modified example.

As shown in FIGS. 25 and 26, the thin-film coil in the second modified example comprises the first conductor group 116, second conductor group 120, and connecting part group 130, whereas the configuration of the connecting part group 130 differs from that in the first embodiment. The connecting part group 130 in the second modified example comprises a plurality of connecting parts 131 to 140, adjacent ones of which are disposed at respective positions distanced differently from the air bearing surface 30. Namely, the connecting parts 131, 133, 135, 137, and 139 successively increase the distance from the air bearing surface 30 in this order; so do the connecting parts 132, 134, 136, 138, and 140. Their gaps in the intersecting direction are narrower than those in the thin-film coil 110 mentioned above.

When arranged at such positions, the connecting parts 131 to 140 are shifted from each other in both of the direction along the air bearing surface 30 and the intersecting direction. In such a manner, the thin-film coil in the second modified example can secure a wide area for arranging insulating films 20, 23, 27 about each of the connecting parts. The other configurations are the same as those of the above-mentioned thin-film coil 110, and thus will not be explained in detail.

In the above-mentioned thin-film coil 110, the connecting parts 131 to 140 are disposed at respective positions distanced equally from the air bearing surface 30, and thus may interfere with each other, which makes it harder to secure a large area for arranging the insulating films 20, 23, 27. Therefore, insulating layers 20, 23, 27 may be harder to be fully inserted between adjacent connecting parts, whereby a void may occur. In this case, a plating solution used for forming the second conductor group 120 and the like may enter this void and deteriorate the insulation of the outer conductor parts, thereby lowering the reliability of the thin-film magnetic head. In the thin-film coil in the second modified example, by contrast, a wide area for placing the insulating films 20, 23, 27 is secured about each connecting part, so that the insulating films 20, 23, 27 are fully inserted between adjacent connecting parts, thus excluding the fear of generating a void.

THIRD MODIFIED EXAMPLE

Figure 27:
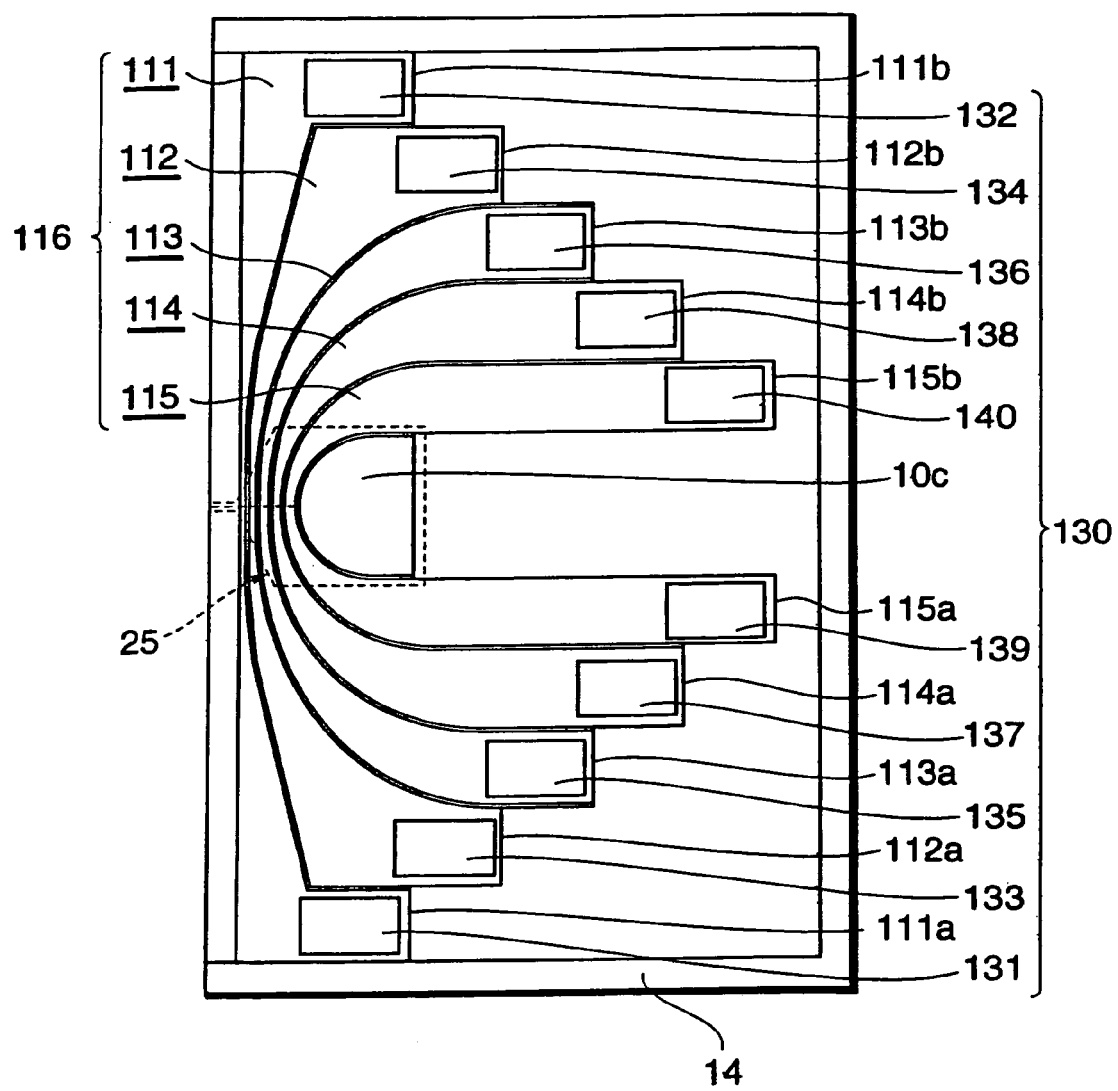
FIG. 27 is a plan view showing the first conductor group and connecting part group constituting the thin-film magnetic head in a third modified example.

The thin-film magnetic head 300 in accordance with the third modified example is also the same as that of the first embodiment except for the configuration of the thin-film coil, which will be explained in the following. FIG. 27 is a plan view showing a first conductor group 116 and connecting parts in the thin-film coil in the third modified example, whereas FIG. 28 is a plan view showing a second conductor group 120 thereof.

Figure 28:
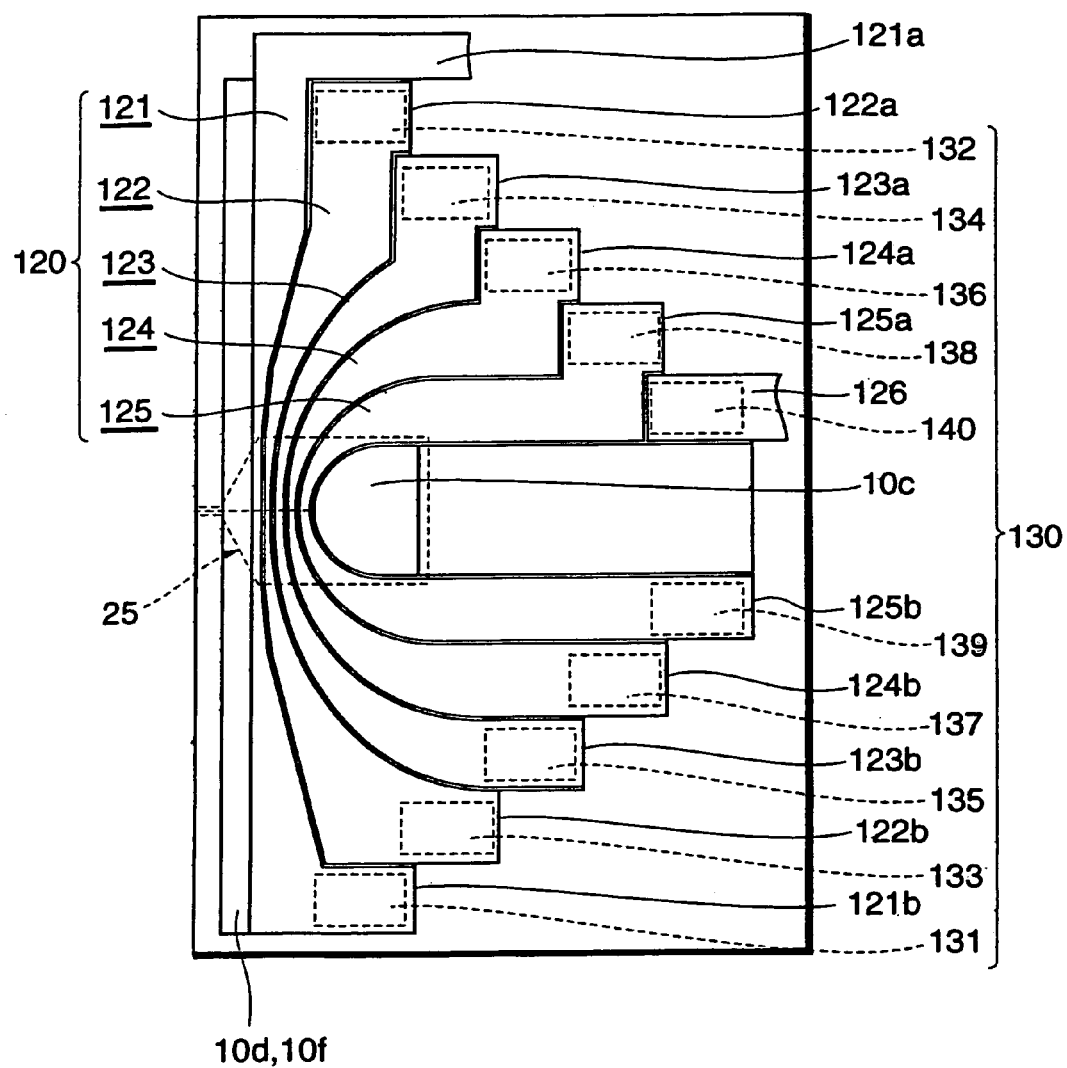
FIG. 28 is a plan view showing the second conductor group in the third modified example.

As shown in FIGS. 27 and 28, the thin-film coil in the third modified example is the same as that of the thin-film coil in the second modified example except for the configurations of inner conductor parts 112 to 115 and outer conductor parts 121 to 125.

Side parts of the inner conductor parts 112 to 115 are curved except for the side part of the inner conductor part 112 on the air bearing surface 30 side. Each side part is curved so as to conform to the side face form of the projection 32b in the third magnetic pole part 10c, i.e., has a curved surface form along a cylindrical side face form (arc-shaped curve in FIGS. 27 and 28).

The outer conductor part 121 in the third modified example differs from that in the second modified example in the form of side parts, such that side parts of the outer conductor parts 122 to 125 are curved like the inner conductor parts 112 to 115 except for the side part of the outer conductor part 122 on the air bearing surface 30 side. When side parts of the inner conductor parts 112 to 115 and outer conductor parts 122 to 125 are curved so as to conform to the side face form of the projection 32b as such, the path widths of the inner conductor parts 112 to 115 and outer conductor parts 122 to 125 change gradually. Therefore, currents flow smoothly in the inner conductor parts 112 to 115 and outer conductor parts 122 to 125, whereby the ohmic value can be restrained from rising. Also, photolithography for forming the inner conductor parts 112 to 115 and outer conductor parts 122 to 125 becomes easier than that in the second modified example, whereby these parts can attain finer forms.

FOURTH MODIFIED EXAMPLE

Figure 29:
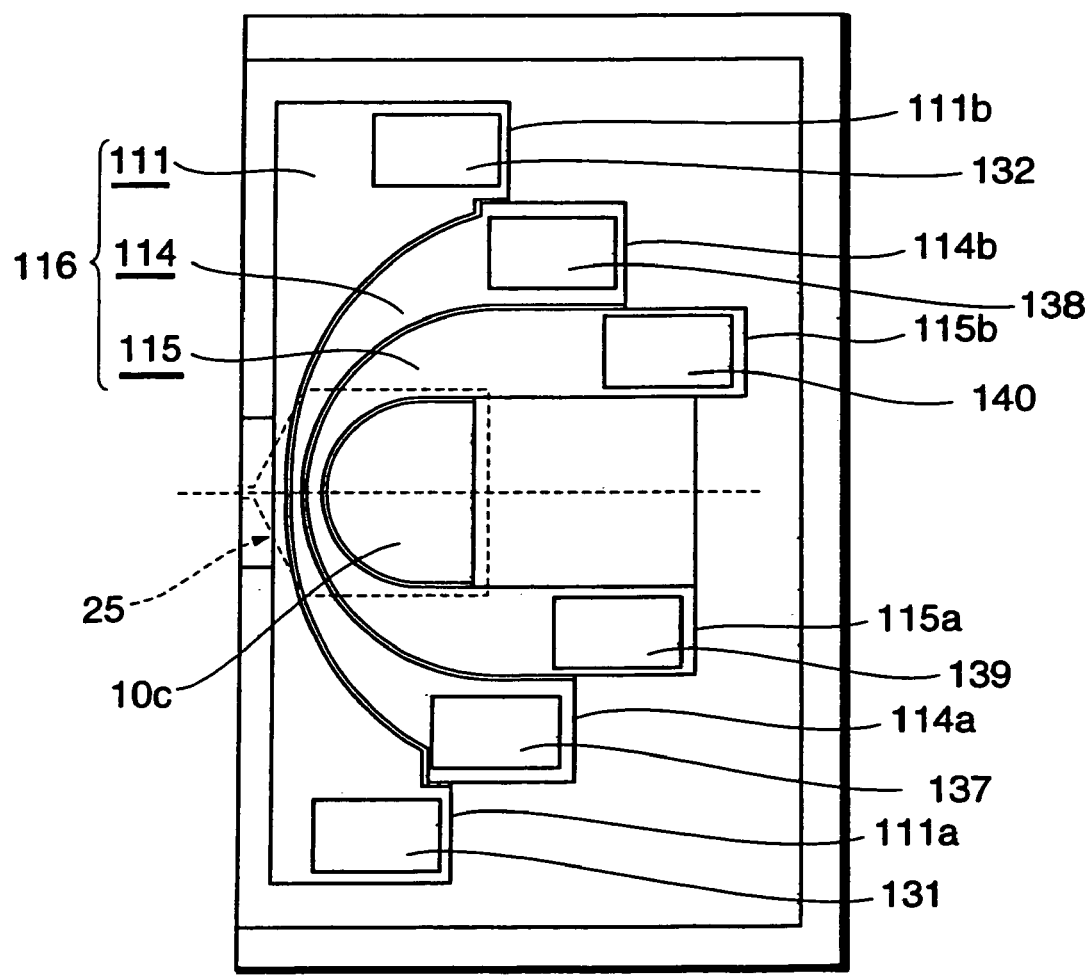
FIG. 29 is a plan view showing the first conductor group and connecting part group constituting the thin-film magnetic head in a fourth modified example.

The thin-film magnetic head 300 in accordance with the fourth modified example is also the same as that of the first embodiment except for the configuration of the thin-film coil, which will be explained in the following. FIG. 29 is a plan view showing a first conductor group 116 and connecting parts in the thin-film coil in the fourth modified example, whereas FIG. 30 is a plan view showing a second conductor group 120 thereof.

Figure 30:
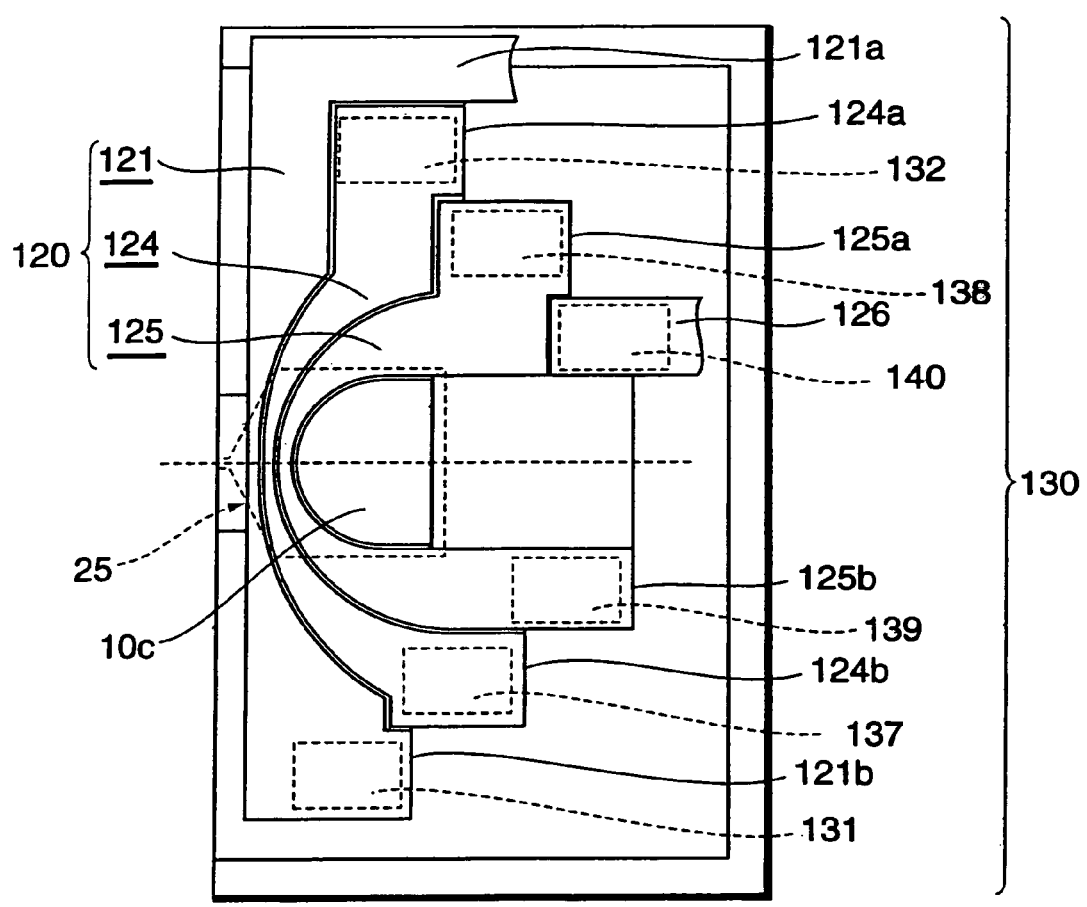
FIG. 30 is a plan view showing the second conductor group in the fourth modified example.

As shown in FIGS. 29 and 30, the thin-film coil in the fourth modified example comprises the first conductor group 116, second conductor group 120, and connecting part group 130, while forming a series of 3-turn loops unlike the thin-film coil in the third modified example. Namely, the first conductor group 116 comprises a plurality of inner conductor parts 111, 114, 115; the second conductor group 120 comprises a plurality of outer conductor parts 121, 124, 125; and the connecting part group 130 comprises a plurality of connecting parts 131, 137, 139, 132, 138, 140; whereby the thin-film coil forms 3-turn helical loops in total. The other points are the same as those of the thin-film coil 110 in the third modified example, and thus will not be explained in detail. Each of the first conductor group 116 and second conductor group 120 has an insulating contact structure in this thin-film coil as in each of the above-mentioned thin-film coils, whereby the conductor parts are arranged close to each other with a high density. Therefore, the thin-film magnetic head 300 comprising this thin-film coil can also make the yoke length shorter.

Second Embodiment

The thin-film magnetic head in accordance with a second embodiment of the present invention will now be explained with reference to FIGS. 31A, 31B to 37A, 37B.

Structure of Thin-Film Magnetic Head

The thin-film magnetic head in accordance with the second embodiment has the same configuration as that of the thin-film magnetic head 300 in accordance with the first embodiment except for the structure of the second conductor group 120. As shown in FIG. 37A, the second conductor group 120 in this embodiment is the same as that in the first embodiment except that a separation insulating film 65 interposed between the first outer conductor parts 121, 123, 125 and the second outer conductor parts 122, 124 is not disposed between the first outer conductor parts 121, 125 and the insulating part 68. Therefore, the thin-film magnetic head in accordance with this embodiment is operative and effective as with the thin-film magnetic head 300 in accordance with the first embodiment.

Method of Manufacturing Thin-Film Magnetic Head

The manufacturing method in accordance with the second embodiment is the same as the above-mentioned method in accordance with the first embodiment up to the step of patterning the first magnetic pole part 10a while using the photoresist 12 as a mask as shown in FIGS. 8A and 8B. Steps subsequent thereto in the second embodiment differ from those in the first embodiment. The following explanation will be focused on differences from the above-mentioned method in accordance with the first embodiment, while explanations for their common points will be omitted or simplified.

Subsequent to the step shown in FIGS. 8A and 8B, a separation insulating film 61 made of alumina, for example, is formed so as to cover the whole upper face of the laminate by CVD, for example, as shown in FIGS. 31A and 31B. This forms a plurality of inner grooves covered with the separation insulating film 61 between the second magnetic pole part 10*b* and the inner conductor part 112, between the inner conductor parts 112 and 114, and between the inner conductor part 114 and the third magnetic pole part 10*c*. The thickness of the separation insulating film 61 is not greater than that of the insulating film 11. Therefore, the thickness of the separation insulating film 61 is preferably 0.2 μm or less, within the range of 0.08 to 0.15 μm in particular. The separation insulating film 61 is formed by the same method as that for the above-mentioned separation insulating film 15.

Subsequently, in the following procedure, an electrode film 62 is formed by sputtering so as to cover the whole upper face of the laminate. Initially, a first electrically conductive film made of Cu is formed by a thickness of 30 to 50 nm, for example, by sputtering. Subsequently, on the first electrically conductive film, a second electrically conductive film made of Cu is formed by a thickness of 50 to 80 nm, for example, by CVD. The forming of the second electrically conductive film does not intend to bury each inner groove, i.e., each of the inner grooves between the second magnetic pole part 10*b* and the inner conductor part 112, between the inner conductor parts 112 and 114, and between the inner conductor part 114 and the third magnetic pole part 10*c*, as a whole, but to cover the inner grooves while taking advantage of favorable step coverage in CVD. The first and second electrically conductive films constitute the electrode film 62. The electrode film 62 functions as an electrode and seed layer in plating which will be carried out later.

Subsequently, on the electrode film 62, an electrically conductive layer 63 made of Cu, for example, is formed by a thickness of 4 to 5 μm by plating. The electrode film 63 is used for providing the second inner conductor parts 111, 113, 115, and is formed in areas to arrange the second inner conductor parts 111, 113, 115.

Next, as shown in FIGS. 32A and 32B, the electrically conductive layer 63 is used as a mask, so as to remove the electrode film 62 except for the part under the electrically conductive layer 63. The electrode film 62 may be removed by ion beam etching in which the advancing direction of an ion beam forms an angle within the range of 45° to 75° with respect to a direction perpendicular to the upper face of the first magnetic pole part 10*a*, for example. Alternatively, in order to completely remove the electrode film 62 formed on a surface having irregularities, wet etching using diluted hydrochloric acid, diluted sulfuric acid, or diluted nitric acid, or electrolytic etching using a copper sulfate solution may be employed for removing the electrode film 62.

Then, an insulating film 64 made of alumina, for example, is formed by a thickness of 4 to 6 μm, for example, so as to cover the whole upper face of the laminate. Further, as shown in FIGS. 33A and 33B, the insulating film 64 is ground by CMP, for example, until the second magnetic pole 10*b*, the third magnetic pole part 10*c*, and the first inner conductor parts 112, 114 are exposed. This grinding forms second inner conductor parts 111, 113, 115 such that the electrically conductive layer 63 and electrode film 62 are buried between the second magnetic pole part 10*b* and the first inner conductor part 112, between the first inner conductor parts 112 and 114, and between the first inner conductor part 114 and the third magnetic pole part 10*c*. Thus obtained second inner conductor parts 111, 113, 115 and the already formed first inner conductor parts 112, 114 form a first conductor group 116. The resulting second inner conductor parts 111, 113, 115 are formed so as to be buried in the respective inner grooves, and thus are disposed adjacent the first inner conductor parts 112, 114. Only the separation insulating film 61 exists between the second inner conductor parts 111, 113, 115 and their adjacent first inner conductor parts 112, 114, whereby the first inner conductor parts 112, 114 and the second inner conductor parts 111, 113, 115 form respective insulating contact structures. The foregoing process yields a state (see FIGS. 12A and 12B) similar to that in the above-mentioned manufacturing method. Subsequent steps are the same as those of the above-mentioned manufacturing method in accordance with the first embodiment up to the step of forming first outer conductor parts 122, 124 as shown in FIGS. 19A and 19B.

Subsequently, as shown in FIGS. 34A and 34B, a separation insulating film 65 made of alumina, for example, is formed by CVD, for example, so as to cover the whole upper face of the laminate. This forms an outer groove covered with the separation insulating film 65 between the outer conductor parts 122 and 124.

Next, in the following procedure, an electrode film 66 is formed so as to cover the whole upper face of the laminate. First, a third electrically conductive film made of Cu is formed by a thickness of 30 to 50 nm, for example, by sputtering. Further, a fourth electrically conductive film made of Cu is formed by a thickness of 50 to 80 nm, for example, on the third electrically conductive film by CVD. The third and fourth electrically conductive films form an electrode film 66. The electrode film 66 functions as an electrode and seed layer in plating which will be carried out later.

Then, on the electrode film 66, an electrically conductive layer 67 made of Cu, for example, is formed by a thickness of 4 to 5 μm, for example. The electrically conductive layer 67 is used for providing second outer conductor parts 121, 123, 125, and is formed in areas to arrange the second outer conductor parts 121, 123, 125.

Next, as shown in FIGS. 35A and 35B, the electrically conductive layer 67 is used as a mask, so as to remove the electrode film 66 except for the part under the electrically conductive layer 67. The electrode film 66 may be removed by the same method as that used for removing the electrode film 62.

Further, an insulating part 68 made of alumina, for example, is formed so as to cover the whole upper face of the laminate. Subsequently, as shown in FIGS. 36A and 36B, the insulating part 68 is ground by CMP, for example, until the outer conductor parts 122, 124 are exposed. As a result of this grinding, the electrode film 66 left between the electrically conductive layer 67 and the outer conductor part 122 or 124 forms second outer conductor parts 121, 123, 125. Thus obtained second outer conductor parts 121, 123, 125 and the already formed first outer conductor parts 122, 124 form a second conductor group 120. The resulting second inner conductor parts 121, 123, 125 are disposed adjacent the first inner conductor parts 122, 124. Only the separation insulating film 65 exists between the second inner conductor parts 121, 123, 125 and their adjacent first inner conductor parts 122, 124, whereby the first inner conductor parts 122, 124 and the second inner conductor parts 121, 123, 125 form respective insulating contact structures.

Then, as shown in FIGS. 37A and 37B, an overcoat layer 69 made of alumina, for example, is formed so as to cover the whole upper face of the laminate, and thus formed surface is flattened. Subsequently, an undepicted electrode pad is formed. Finally, the slider including the layers mentioned above is ground, so as to form an air bearing surface 30. As a consequence of the foregoing process, the first conductor group 116, second conductor group 120, and connecting part layer group 130 form the thin-film coil 110, thereby yielding the thin-film magnetic head 300.

OTHER MODIFIED EXAMPLES

Without being restricted to the above-mentioned embodiments, the present invention can be modified as appropriate. For example, though the thin-film coil 110 is set to 3- or 5-turns, other numbers of turns in the thin-film coil can be selected as appropriate.

Also, a thin-film coil having a desirable number of turns can be made by using a semifinished product (basic structure for a thin-film magnetic head) having manufactured at least up to the first conductor group. In this case, the number of turns of the thin-film coil may be selected by changing both the form of each connecting part and the number of outer conductor parts.

The present invention is also applicable to a record-only head having an inductive electromagnetic transducer alone, and a thin-film magnetic head using an inductive electromagnetic transducer for recording and reproducing.

Though each of the above-mentioned embodiments explains a thin-film magnetic head as a longitudinal recording head comprising upper and lower magnetic pole layers by way of example, the present invention is not limited to the longitudinal recording head. The present invention is also applicable to a perpendicular recording head comprising a main magnetic pole layer and an auxiliary magnetic pole layer.

Embodiment of Head Gimbal Assembly and Hard Disk Drive Drive

An embodiment of a head gimbal assembly and hard disk drive will now be explained.

Figure 38:
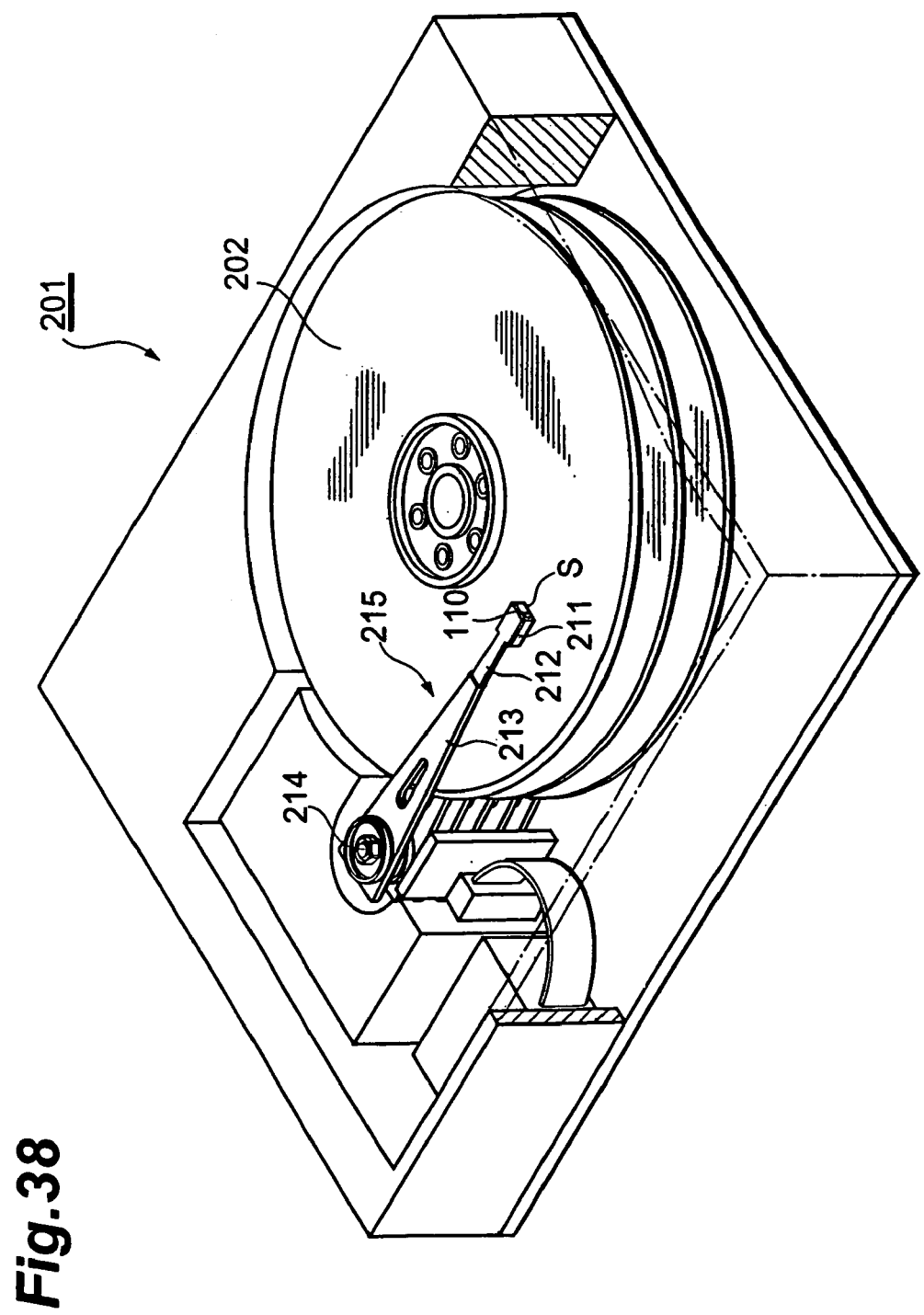
FIG. 38 is a perspective view showing a hard disk drive comprising the thin-film magnetic head in accordance with the first embodiment of the present invention.

FIG. 38 is a perspective view showing a hard disk drive 201 comprising the thin-film magnetic head 110 mentioned above. The hard disk drive 201 comprises a hard disk (recording medium) 202 rotating at a high speed, and a head gimbal assembly (HGA) 215. The hard disk drive 201 is an apparatus for actuating the HGA 215, so that magnetic information is recorded onto and reproduced from recording surfaces of the hard disk 202. The hard disk 202 comprises a plurality of (3 in the drawings) disks. Each disk has a recording surface opposing the thin-film magnetic head 110. The HGA 215 comprises a gimbal 212 mounted with a head slider 211 having a support formed with the thin-film magnetic head 110, and a suspension arm 213 for supporting the gimbal 212 which are disposed on the recording surface of each disk, and is rotatable about a shaft 214 by a voice coil motor which is not depicted, for example. As the HGA 215 is rotated, the head slider 211 moves radially of the hard disk 202, i.e., in directions traversing track lines.

Each of such HGA 215 and hard disk drive 201 comprises the thin-film magnetic head 110, thereby exhibiting excellent recording characteristics in a high frequency band. Here, the HGA 215 and hard disk drive 201 exhibit similar excellent recording characteristics in a high frequency band also when they comprise the thin-film magnetic head in accordance with any of the modified examples in the first embodiment and the thin-film magnetic head in accordance with the second embodiment.

It is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A thin-film magnetic head, comprising:
first and second magnetic pole groups, magnetically connected to each other, having respective magnetic pole parts opposing each other on a side of a medium-opposing surface opposing a recording medium; a recording gap layer formed between the magnetic pole parts; a thin-film coil insulated from the first and second magnetic pole groups and helically wound about at least one of the first and second magnetic pole groups; and a substrate having the first and second magnetic pole groups, recording gap layer, and thin-film coil laminated thereon;
the thin-film coil comprising a first conductor group having a plurality of inner conductor parts disposed between the first and second magnetic pole groups, a second conductor group having a plurality of outer conductor parts disposed outside the second magnetic pole group, and a connecting part group having a plurality of connecting parts for connecting the inner conductor parts to the outer conductor parts;
the first conductor group including an insulating contact structure for making the inner conductor parts in contact with each other by way of an insulating film, the second conductor group including an insulating contact structure for making the outer conductor parts in contact with each other by way of an insulating film;
each of the inner and outer conductor parts has a variable width structure with a path width gradually expanding from a part corresponding to the second magnetic pole group to the outside thereof; and
the first magnetic pole group has a projection protruding toward the medium-opposing surface.

2. A thin-film magnetic head according to claim 1, wherein each of the inner and outer conductor parts includes a narrowest part having the narrowest path width at a position corresponding to the projection.

3. A thin-film magnetic head according to claim 1, wherein the projection has a curved surface protruding toward the medium-opposing surface.

4. A thin-film magnetic head according to claim 3, wherein each of the inner and outer conductor parts is curved in conformity to a side face form of the projection.

5. A head gimbal assembly, comprising:
a support;
a thin-film magnetic head formed on the support;
a gimbal for securing the support;
the thin-film magnetic head comprising first and second magnetic pole groups, magnetically connected to each other, having respective magnetic pole parts opposing each other on a side of a medium-opposing surface opposing a recording medium; a recording gap layer formed between the magnetic pole parts; a thin-film coil insulated from the first and second magnetic pole groups and helically wound about at least one of the first and second magnetic pole groups; and a substrate having the first and second magnetic pole groups, recording gap layer, and thin-film coil laminated thereon;
the thin-film coil comprising a first conductor group having a plurality of inner conductor parts disposed between the first and second magnetic pole groups, a second conductor group having a plurality of outer conductor parts disposed outside the second magnetic pole group, and a connecting part group having a plurality of connecting parts for connecting the inner conductor parts to the outer conductor parts;

the first conductor group including an insulating contact structure for making the inner conductor parts in contact with each other by way of an insulating film, the second conductor group including an insulating contact structure for making the outer conductor parts in contact with each other by way of an insulating film;

each of the inner and outer conductor parts has a variable width structure with a path width gradually expanding from a part corresponding to the second magnetic pole group to the outside thereof; and the first magnetic pole group has a projection protruding toward the medium-opposing surface.

6. A hard disk drive, comprising:

a head gimbal assembly including a thin-film magnetic head, and a recording medium opposing the thin-film magnetic head;

the thin-film magnetic head comprising first and second magnetic pole groups, magnetically connected to each other, having respective magnetic pole parts opposing each other on a side of a medium-opposing surface opposing the recording medium; a recording gap layer formed between the magnetic pole parts; a thin-film coil insulated from the first and second magnetic pole groups and helically wound about at least one of the first and second magnetic pole groups; and a substrate having the first and second magnetic pole groups, recording gap layer, and thin-film coil laminated thereon;

the thin-film coil comprising a first conductor group having a plurality of inner conductor parts disposed between the first and second magnetic pole groups, a second conductor group having a plurality of outer conductor parts disposed outside the second magnetic pole group, and a connecting part group having a plurality of connecting parts for connecting the inner conductor parts to the outer conductor parts;

the first conductor group including an insulating contact structure for making the inner conductor parts in contact with each other by way of an insulating film; the second conductor group including an insulating contact structure for making the outer conductor parts in contact with each other by way of an insulating film;

each of the inner and outer conductor parts has a variable width structure with a path width gradually expanding from a part corresponding to the second magnetic pole group to the outside thereof; and the first magnetic pole group has a projection protruding toward the medium-opposing surface.

* * * * *